United States Patent
Kang et al.

(10) Patent No.: US 12,543,428 B2
(45) Date of Patent: Feb. 3, 2026

(54) LIGHT EMITTING ELEMENT

(71) Applicant: Samsung Display Co., Ltd., Yongin-si (KR)

(72) Inventors: Namsu Kang, Seoul (KR); Huiju Park, Seoul (KR); Songeun Lee, Hwaseong-si (KR); Hyunshik Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 829 days.

(21) Appl. No.: 17/834,533

(22) Filed: Jun. 7, 2022

(65) Prior Publication Data

US 2023/0117065 A1 Apr. 20, 2023

(30) Foreign Application Priority Data

Oct. 15, 2021 (KR) .................. 10-2021-0137915

(51) Int. Cl.
| | |
|---|---|
| *H10K 50/13* | (2023.01) |
| *C07C 15/38* | (2006.01) |
| *C07C 43/235* | (2006.01) |
| *C07C 211/54* | (2006.01) |
| *C07C 321/30* | (2006.01) |
| *C07D 209/82* | (2006.01) |
| *C07D 231/56* | (2006.01) |
| *C07D 241/42* | (2006.01) |
| *C07D 307/91* | (2006.01) |
| *C07D 333/76* | (2006.01) |
| *C07D 401/14* | (2006.01) |
| *C07D 403/04* | (2006.01) |
| *C07D 403/10* | (2006.01) |
| *C07D 413/14* | (2006.01) |
| *C07D 471/04* | (2006.01) |
| *C07D 491/147* | (2006.01) |
| *C07D 519/00* | (2006.01) |
| *C07F 9/53* | (2006.01) |
| *H10K 50/12* | (2023.01) |
| *H10K 85/60* | (2023.01) |
| *H10K 50/11* | (2023.01) |
| *H10K 50/15* | (2023.01) |
| *H10K 50/16* | (2023.01) |
| *H10K 101/40* | (2023.01) |

(52) U.S. Cl.
CPC ............ *H10K 50/12* (2023.02); *C07C 15/38* (2013.01); *C07C 43/235* (2013.01); *C07C 211/54* (2013.01); *C07C 321/30* (2013.01); *C07D 209/82* (2013.01); *C07D 231/56* (2013.01); *C07D 241/42* (2013.01); *C07D 307/91* (2013.01); *C07D 333/76* (2013.01); *C07D 401/14* (2013.01); *C07D 403/04* (2013.01); *C07D 403/10* (2013.01); *C07D 413/14* (2013.01); *C07D 471/04* (2013.01); *C07D 491/147* (2013.01); *C07D 519/00* (2013.01); *C07F 9/5304* (2013.01); *C07F 9/5308* (2013.01); *H10K 85/622* (2023.02); *H10K 85/624* (2023.02); *H10K 85/631* (2023.02); *H10K 85/649* (2023.02); *H10K 85/654* (2023.02); *H10K 85/657* (2023.02); *H10K 85/6572* (2023.02); *H10K 85/6574* (2023.02); *H10K 85/6576* (2023.02); *C07B 2200/05* (2013.01); *H10K 50/11* (2023.02); *H10K 50/15* (2023.02); *H10K 50/16* (2023.02); *H10K 2101/40* (2023.02)

(58) Field of Classification Search
None
See application file for complete search history.

(56) References Cited

U.S. PATENT DOCUMENTS

| | | | |
|---|---|---|---|
| 8,384,070 | B2 | 2/2013 | Kishino |
| 8,610,109 | B2 | 12/2013 | Yamazaki et al. |
| 8,853,715 | B2 | 10/2014 | Matsuda |
| 8,860,013 | B2 | 10/2014 | Okamoto |
| 9,093,596 | B2 | 7/2015 | Huo et al. |
| 9,425,422 | B2 | 8/2016 | Kim et al. |
| 9,793,495 | B2 | 10/2017 | Kim et al. |

(Continued)

FOREIGN PATENT DOCUMENTS

| | | |
|---|---|---|
| KR | 10-2017-0061522 | 6/2017 |
| KR | 1020170143292 A | 12/2017 |

(Continued)

*Primary Examiner* — Robert S Loewe
(74) *Attorney, Agent, or Firm* — CANTOR COLBURN LLP

(57) ABSTRACT

A light emitting element includes a first electrode, a second electrode disposed on the first electrode, and an emission part disposed between the first electrode and the second electrode and including a first emission layer and a second emission layer disposed on the first emission layer, the first emission layer may include a first host, and a first dopant, and the second emission layer may include a hole transport host different from the first host, an electron transport host, and a second dopant. A first hole mobility of the first host may be in a range of about $5.0 \times 10^{-6}$ cm²/Vs to about $1.0 \times 10^{-3}$ cm²/Vs, a second hole mobility of a host mixture including the hole transport host and the electron transport host may be in a range of about $1.0 \times 10^{-6}$ cm²/Vs to about $1.0 \times 10^{-4}$ cm²/Vs, and the first hole mobility may be larger than the second hole mobility.

22 Claims, 17 Drawing Sheets

(56) References Cited

U.S. PATENT DOCUMENTS

| | | | |
|---|---|---|---|
| 9,859,517 B2* | 1/2018 | Lai | H10K 50/11 |
| 10,056,571 B2 | 8/2018 | Han et al. | |
| 10,529,939 B2 | 1/2020 | Kim | |
| 10,910,443 B2 | 2/2021 | Oh et al. | |
| 11,158,831 B2 | 10/2021 | Lee et al. | |
| 11,594,685 B2 | 2/2023 | Huh et al. | |
| 2007/0052346 A1 | 3/2007 | Iwakuma et al. | |
| 2009/0091244 A1 | 4/2009 | Negishi et al. | |
| 2017/0047380 A1* | 2/2017 | Tsukamoto | H10K 50/171 |
| 2017/0162816 A1* | 6/2017 | Kim | H10K 50/155 |
| 2018/0033994 A1* | 2/2018 | Jang | H10K 50/19 |
| 2018/0114938 A1* | 4/2018 | Yasukawa | H10K 85/622 |
| 2018/0190193 A1* | 7/2018 | Kim | H10K 50/131 |
| 2020/0106026 A1* | 4/2020 | Kang | H10K 85/636 |
| 2020/0373492 A1 | 11/2020 | Syn et al. | |
| 2021/0050546 A1* | 2/2021 | Li | H10K 85/322 |
| 2021/0135142 A1* | 5/2021 | Li | H10K 85/658 |
| 2021/0175457 A1* | 6/2021 | Park | H10K 50/11 |
| 2021/0313536 A1* | 10/2021 | Choi | H10K 50/156 |
| 2022/0109114 A1* | 4/2022 | Kim | H10K 85/626 |
| 2023/0127217 A1* | 4/2023 | Tasaki | H05B 33/12 257/40 |
| 2023/0217669 A1* | 7/2023 | Cho | H10K 85/654 257/40 |
| 2023/0263001 A1* | 8/2023 | Toyoshima | H10K 85/631 257/40 |

FOREIGN PATENT DOCUMENTS

| | | |
|---|---|---|
| KR | 10-2018-0009440 | 1/2018 |
| KR | 1020180080970 A | 7/2018 |
| KR | 1020180111558 A | 10/2018 |
| KR | 10-2066090 | 1/2020 |
| KR | 10-2020-0103235 | 9/2020 |
| KR | 1020200134383 A | 12/2020 |

* cited by examiner

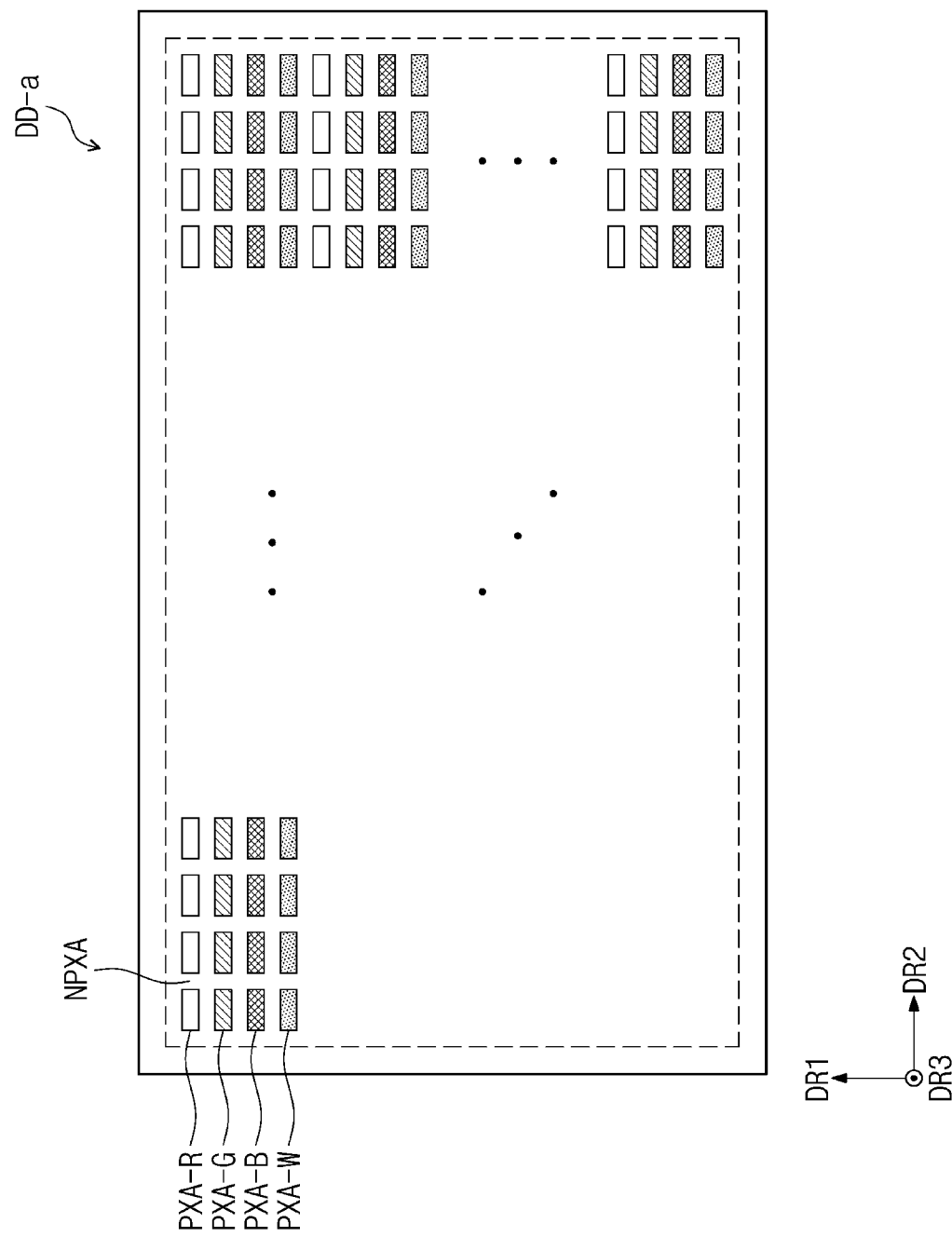

LIGHT EMITTING ELEMENT

CROSS-REFERENCE TO RELATED APPLICATION(S)

This U.S. non-provisional patent application claims priority to and benefits of Korean Patent Application No. 10-2021-0137915 under 35 U.S.C. § 119, filed in the Korean Intellectual Property Office on Oct. 15, 2021, the entire contents of which are incorporated herein by reference.

BACKGROUND

The disclosure herein relates to a light emitting element including at least two emission layers.

Recently, the development of an organic electroluminescence display device as an image display device is being actively conducted. The organic electroluminescence display device includes so-called a self-luminescent light emitting element in which holes and electrons injected from a first electrode and a second electrode combine in an emission layer, and thus a luminescent material of the emission layer emits light to implement display.

In the application of a light emitting element to a display device, there is a demand for a light emitting element having high luminous efficiency and a long service life, and development on a light emitting element capable of stably attaining such characteristics is being continuously required.

SUMMARY

The disclosure provides a light emitting element exhibiting or having desired luminous efficiency and long service life characteristics.

An embodiment of the disclosure provides a light emitting element including a first electrode; a second electrode disposed on the first electrode; an emission part which is disposed between the first electrode and the second electrode and includes a first emission layer and a second emission layer disposed on the first emission layer, wherein the first emission layer includes a first host and a first dopant, the second emission layer includes a hole transport host different from the first host, an electron transport host, and a second dopant, a first hole mobility of the first host is in a range of about $5.0 \times 10^{-6}$ cm$^2$/Vs to about $1.0 \times 10^{-3}$ cm$^2$/Vs, a second hole mobility of a host mixture including the hole transport host and the electron transport host is in a range of about $1.0 \times 10^{-6}$ cm$^2$/Vs to about $1.0 \times 10^{-4}$ cm$^2$/Vs, and the first hole mobility is larger than the second hole mobility.

In an embodiment, the first hole mobility may be about five fold or more of the second hole mobility.

In an embodiment, an electron mobility of the first host may be larger than an electron mobility of the electron transport host.

In an embodiment, the electron mobility of the first host may be about 10 fold or more of the electron mobility of the electron transport host.

In an embodiment, the electron mobility of the first host may be in a range of about $1.0 \times 10^{-5}$ cm$^2$/Vs to about $1.0 \times 10^{-2}$ cm$^2$/Vs.

In an embodiment, the electron mobility of the host mixture may be in a range of about $1.0 \times 10^{-7}$ cm$^2$/Vs to about $5.0 \times 10^{-3}$ cm$^2$/Vs.

In an embodiment, a weight ratio of the hole transport host to the electron transport host may be in a range of about 2:8 to about 8:2.

In an embodiment, an absolute value of a lowest unoccupied molecular orbital (LUMO) energy level of the first host may be in a range of about 2.0 eV to about 3.5 eV.

In an embodiment, a LUMO energy level of the electron transport host may be different from the LUMO energy level of the first host, and a difference between the LUMO energy level of the electron transport host and the LUMO energy level of the first host may be in a range of about 0.2 eV to about 0.4 eV.

In an embodiment, an absolute value of a highest occupied molecular orbital (HOMO) energy level of the first host may be about 4.0 eV to about 6.0 eV.

In an embodiment, a HOMO energy level of the electron transport host may be different from the HOMO energy level of the first host, and a difference between the HOMO energy level of the electron transport host and the HOMO energy level of the first host may be in a range of about 0.1 eV to about 0.5 eV.

The first host may include any at least one among of compounds in Compound Group 1 discussed herein.

The hole transport host may include any at least one among of hole transport compounds in Compound Group 2 discussed herein, and the electron transport host may include any at least one among of electron transport compounds in Compound Group 3 below.

In an embodiment, the light emitting element may further include a hole transport region disposed between the first electrode and the emission part, and an electron transport region disposed between the emission part and the second electrode.

In an embodiment, the hole transport region may include an electron blocking layer disposed between the first electrode and the emission part.

In an embodiment, the hole transport region may include a hole transport layer disposed between the first electrode and the emission part, and an absolute value of a HOMO energy level of the hole transport layer may be in a range of about 5.25 eV to about 5.5 eV.

In an embodiment, each of the first dopant and the second dopant may have a luminescence center wavelength in a range of about 440 nm to about 480 nm.

In an embodiment, an overlapping ratio of a luminescence wavelength region of the first dopant and a luminescence wavelength region of the second dopant may be about 80% or more.

In an embodiment of the disclosure, a light emitting element includes a first electrode; a second electrode disposed on the first electrode; a first emission part, a second emission part, and a third emission part which are disposed between the first electrode and the second electrode and sequentially stacked, wherein at least one of the first emission part, the second emission part, and the third emission part includes a first emission layer and a second emission layer disposed on the first emission layer, the first emission layer includes a first host and a first dopant, the second emission layer includes a hole transport host different from the first host, an electron transport host, and a second dopant, a first hole mobility of the first host is in a range of about $5.0 \times 10^{-6}$ cm$^2$/Vs to about $1.0 \times 10^{-3}$ cm$^2$/Vs, a second hole mobility of a host mixture including the hole transport host and the electron transport host is in a range of about $1.0 \times 10^{-6}$ cm$^2$/Vs to about $1.0 \times 10^{-4}$ cm$^2$/Vs, and the first hole mobility is larger than the second hole mobility.

In an embodiment, one of the first emission part, the second emission part, and the third emission part may include the first emission layer and the second emission layer disposed on the first emission layer, and other two of the first emission part, the second emission part, and the third emission part may each independently include an emission layer containing one host and one dopant.

In an embodiment, the light emitting element may further include a fourth emission part disposed on the third emission part, and each of the first emission part, the second emission part, and the third emission part may emit light having a luminescence center wavelength in a range of about 440 nm to about 480 nm, and the fourth emission part may emit light having a luminescence center wavelength in a range of about 500 nm to about 650 nm.

In an embodiment, the first hole mobility may be about five fold or more of the second hole mobility.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings:

FIG. 9 is a schematic plan view illustrating a display device according to an embodiment of the disclosure.

DETAILED DESCRIPTION OF THE EMBODIMENTS

Figure 1:
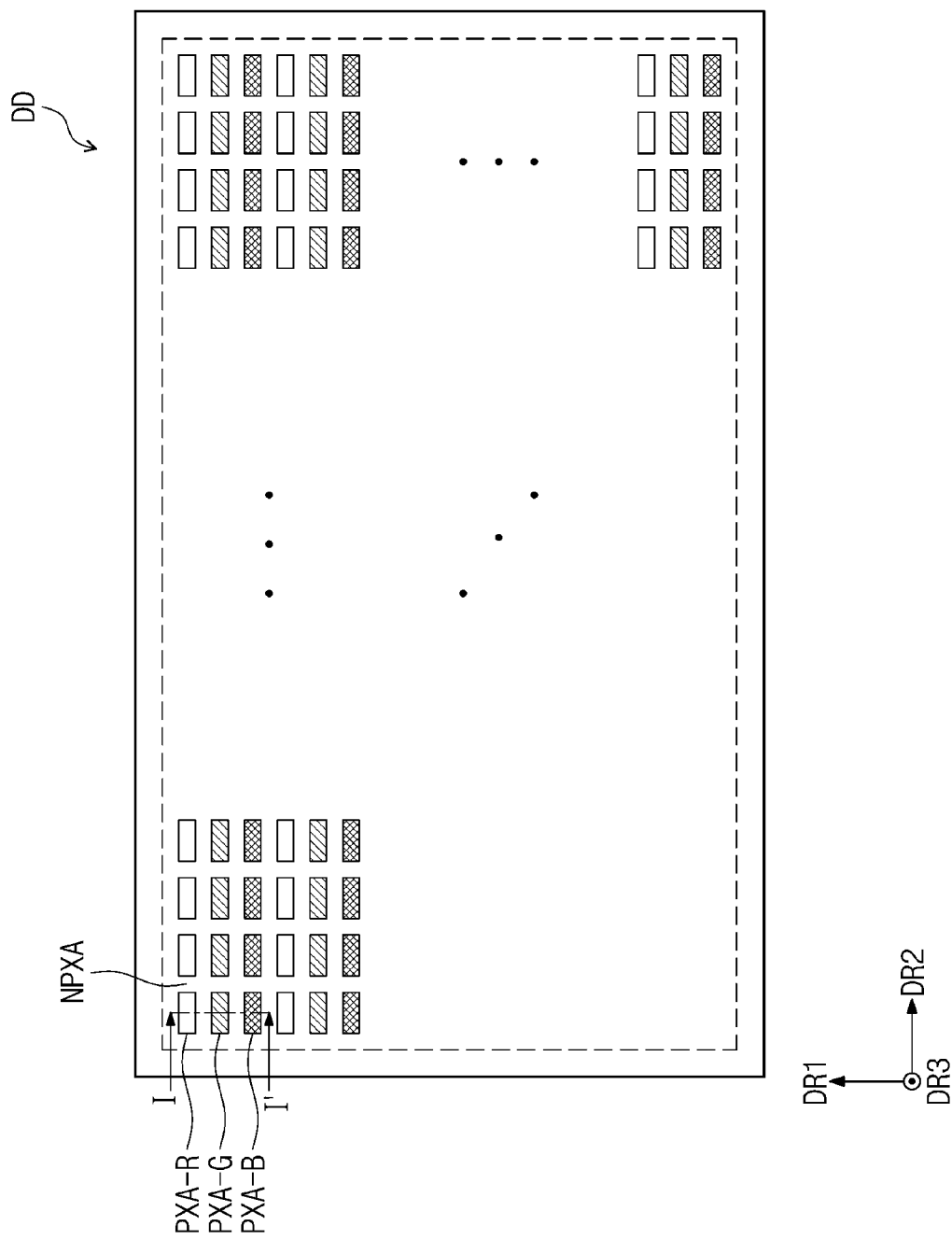
FIG. 1 is a schematic plan view illustrating a display device according to an embodiment of the disclosure.

The disclosure may be modified in many alternate forms, and thus specific embodiments will be illustrated in the drawings and described in detail. It should be understood, however, that it is not intended to limit the disclosure to the particular forms disclosed, but rather, is intended to cover all modifications, equivalents, and alternatives falling within the spirit and scope of the disclosure.

In the specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals refer to like components throughout. Also, in the drawings, the thickness, the ratio, and the dimensions of components may be exaggerated for an effective description of technical contents. The term "and/or" includes all combinations of one or more of which associated configurations may define.

It will be understood that, although the terms "first," "second," and the like may be used herein to describe various components, these components should not be limited by these terms. These terms are only used to distinguish one component from another. For example, a first component may be referred to as a second component, and, similarly, the second component may be referred to as the first component, without departing from the scope of the disclosure. As used herein, the singular forms, "a," "an," and "the" are intended to include the plural forms (or meanings) as well, unless the context clearly indicates otherwise.

In addition, terms such as "below," "under," "on," and "above" may be used to describe the relationship between components illustrated in the figures. The terms are used as a relative concept and are described with reference to the direction indicated in the drawings.

It should be understood that the terms "comprise" or "have" are intended to specify the presence of stated features, integers, steps, operations, components, parts, or combinations thereof in the disclosure, but do not preclude the presence or addition of one or more other features, integers, steps, operations, components, parts, or combinations thereof.

It will be understood that the terms "contact," "connected to," and "coupled to" may include a physical and/or electrical contact, connection, or coupling.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
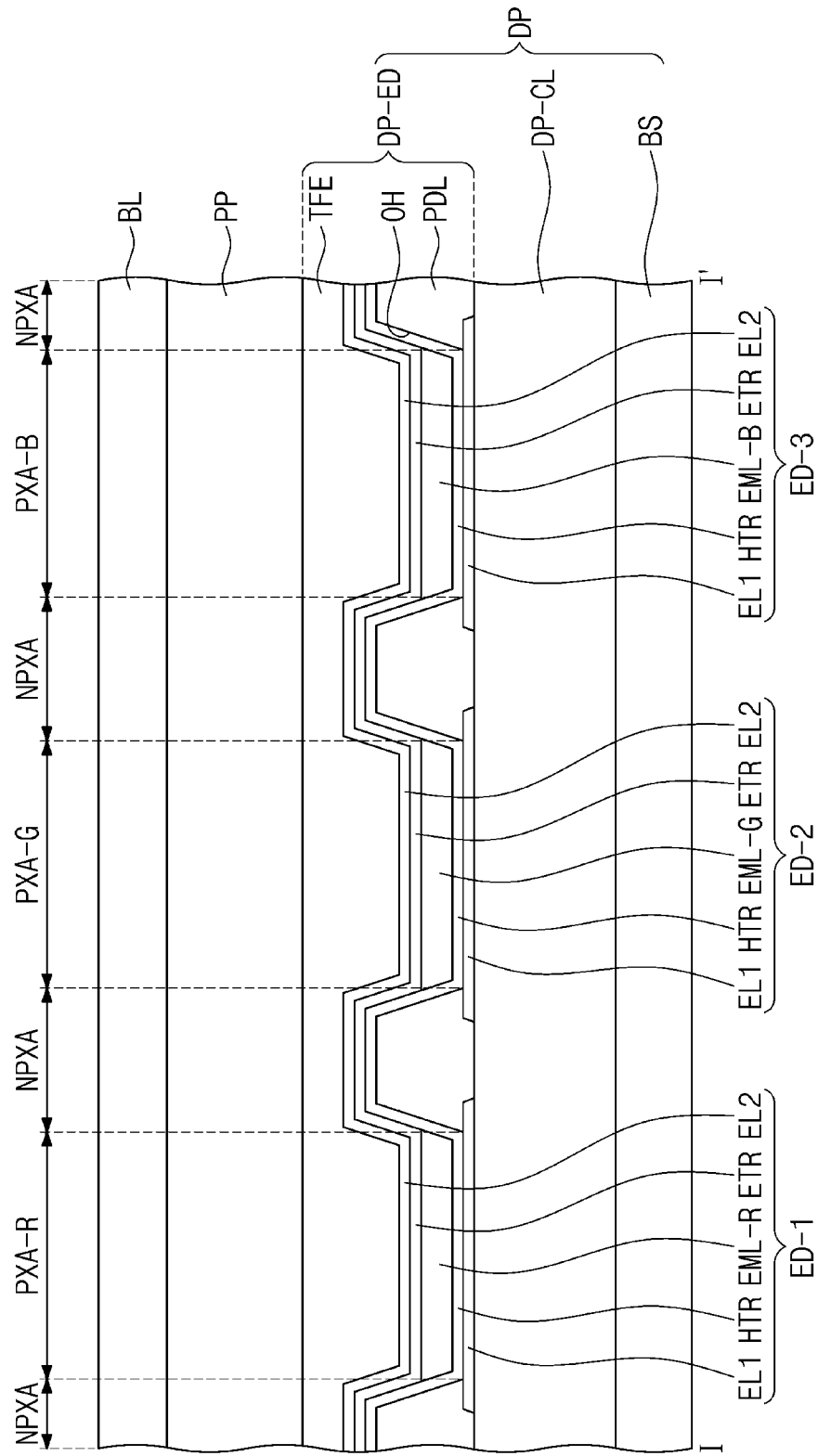
FIG. 2 is a schematic cross-sectional view illustrating a part taken along line I-I' of FIG. 1.

Hereinafter, embodiments of the disclosure will be described with reference to the accompanying drawings. FIG. 1 is a schematic plan view illustrating a display device according to an embodiment of the disclosure. FIG. 2 is a schematic cross-sectional view illustrating a part taken along line I-I' of FIG. 1. FIG. 2 is a schematic cross-sectional view of the display device DD of the embodiment.

The display device DD may include a display panel DP and an optical layer PP disposed on the display panel DP. The display panel DP may include light emitting elements ED-1, ED-2, and ED-3. The display device DD may include light emitting elements ED-1, ED-2, and ED-3. The optical layer PP may be disposed on the display panel DP and control reflected light in the display panel DP due to external light. The optical layer PP may include, for example, a polarization layer or a color filter layer. Unlike the configuration illustrated in the drawing, the optical layer PP may be omitted from the display device DD of an embodiment.

A base substrate BL may be disposed on the optical layer PP. The base substrate BL may be a member which provides a base surface on which the optical layer PP disposed. The base substrate BL may be a glass substrate, a metal substrate, a plastic substrate, etc. However, the embodiment of the disclosure is not limited thereto, and the base substrate BL may be an inorganic layer, an organic layer, or a composite layer (or composite material layer). In addition, unlike the configuration illustrated, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic layer (or organic material layer). The filling layer (not shown) may include at least one of an acrylic-based resin, a silicone-based resin, or an epoxy-based resin.

The display panel DP may include a base layer BS, a circuit layer DP-CL provided on the base layer BS, and the display element layer DP-ED. The display element layer DP-ED may include a pixel defining film PDL, the light emitting elements ED-1, ED-2, and ED-3 disposed between portions of the pixel defining film PDL, and an encapsulation layer TFE disposed on the light emitting elements ED-1, ED-2, and ED-3.

The base layer BS may be a member which provides a base surface on which the display element layer DP-ED is disposed. The base layer BS may be a glass substrate, a metal substrate, a plastic substrate, etc. However, the embodiment of the disclosure is not limited thereto, and the base layer BS may be an inorganic layer, an organic layer, or a composite layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor in order to drive the light emitting elements ED-1, ED-2, and ED-3 of the display element layer DP-ED.

Each of the light emitting elements ED-1, ED-2, and ED-3 may have a structure of a light emitting element ED of an embodiment according to FIGS. 3A to 3D, which will be described later. Each of the light emitting elements ED-1, ED-2, and ED-3 may include a first electrode EL1, a hole transport region HTR, emission layers EML-R, EML-G and EML-B, an electron transport region ETR, and a second electrode EL2. At least one among the emission layers EML-R, EML-G, and EML-B of each of the light emitting elements ED-1, ED-2, and ED-3 may correspond to an emission part EMA which will be described later. At least one among the emission layers EML-R, EML-G, and EML-B of each of the light emitting elements ED-1, ED-2, and ED-3 may be composed of two layers.

FIG. 2 illustrates an embodiment in which the emission layers EML-R, EML-G, and EML-B of the light emitting elements ED-1, ED-2, and ED-3 are disposed in openings OH defined in the pixel defining film PDL, and the hole transport region HTR, the electron transport region ETR, and the second electrode EL2 are provided as a common layer in the entire light emitting elements ED-1, ED-2, and ED-3. However, the embodiment of the disclosure is not limited thereto, and unlike the configuration illustrated in FIG. 2, the hole transport region HTR and the electron transport region ETR in an embodiment may be provided by being patterned inside the openings OH defined in the pixel defining film PDL. For example, the hole transport region HTR, the emission layers EML-R, EML-G, and EML-B, and the electron transport region ETR of the light emitting elements ED-1, ED-2, and ED-3 in an embodiment may be provided by being patterned by an inkjet printing method.

The encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be formed by laminating one layer or layers. The encapsulation layer TFE may include at least one insulation layer. The encapsulation layer TFE according to an embodiment may include at least one inorganic film (hereinafter, an inorganic encapsulation film). The encapsulation layer TFE according to an embodiment may also include at least one organic film (hereinafter, an organic encapsulation film) and at least one inorganic encapsulation film.

The inorganic encapsulation film may protect the display element layer DP-ED from moisture or oxygen, and the organic encapsulation film may protect the display element layer DP-ED from foreign substances such as dust particles. The inorganic encapsulation film may include silicon nitride, silicon oxynitride, silicon oxide, titanium oxide, aluminum oxide, or the like, but the embodiment of the disclosure is not particularly limited thereto. The organic encapsulation film may include an acrylic-based compound, an epoxy-based compound, or the like. The organic encapsulation film may include a photopolymerizable organic material, but the embodiment of the disclosure is not particularly limited thereto.

The encapsulation layer TFE may be disposed on the second electrode EL2 and may be disposed filling the opening OH.

Referring to FIGS. 1 and 2, the display device DD may include a non-light emitting region NPXA and light emitting regions PXA-R, PXA-G, and PXA-B. The light emitting regions PXA-R, PXA-G, and PXA-B may be regions in which light generated by the respective light emitting elements ED-1, ED-2 and ED-3 is emitted. The light emitting regions PXA-R, PXA-G, and PXA-B may be spaced apart from each other in a plan view.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In the specification, the light emitting regions PXA-R, PXA-G, and PXA-B may respectively correspond to pixels. The pixel defining film PDL may divide the light emitting elements ED-1, ED-2, and ED-3. The emission layers EML-R, EML-G, and EML-B of the light emitting elements ED-1, ED-2, and ED-3 may be disposed in openings OH defined in the pixel defining film PDL and separated from each other.

The light emitting regions PXA-R, PXA-G and PXA-B may be divided into groups according to the color of light generated from the light emitting elements ED-1, ED-2, and ED-3. In the display device DD of an embodiment shown in FIGS. 1 and 2, three light emitting regions PXA-R, PXA-G, and PXA-B which emit red light, green light, and blue light, respectively are exemplarily illustrated. For example, the display device DD of an embodiment may include the red light emitting region PXA-R, the green light emitting region PXA-G, and the blue light emitting region PXA-B that are separated from each other.

In the display device DD according to an embodiment, the light emitting elements ED-1, ED-2, and ED-3 may emit light beams having wavelengths different from each other. For example, in an embodiment, the display device DD may include a first light emitting element ED-1 that emits red light, a second light emitting element ED-2 that emits green light, and a third light emitting element ED-3 that emits blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, the embodiment of the disclosure is not limited thereto, and the first to third light emitting elements ED-1, ED-2, and ED-3 may emit light beams in a same wavelength range or at least one light emitting element thereof may emit a light beam in a wavelength range different from the others. For example, the first to third light emitting elements ED-1, ED-2, and ED-3 may all emit blue light.

The light emitting regions PXA-R, PXA-G, and PXA-B in the display device DD according to an embodiment may be arranged in a stripe form. Referring to FIG. 1, the red light emitting regions PXA-R, the green light emitting regions PXA-G, and the blue light emitting regions PXA-B each may be arranged in a second direction DR2. In addition, the red light emitting region PXA-R, the green light emitting region PXA-G, and the blue light emitting region PXA-B may be alternately arranged in this order in a first direction DR1.

FIGS. 1 and 2 illustrate that all the light emitting regions PXA-R, PXA-G, and PXA-B have a similar area, but the embodiment of the disclosure is not limited thereto. Thus, the light emitting regions PXA-R, PXA-G, and PXA-B may have different areas according to the wavelength range of the emitted light. In this case, the areas of the light emitting regions PXA-R, PXA-G, and PXA-B may mean areas when viewed in a plane defined by the first direction DR1 and the second direction DR2.

An arrangement of the light emitting regions PXA-R, PXA-G, and PXA-B is not limited to that illustrated in FIG. 1, and the order in which the red light emitting region PXA-R, the green light emitting region PXA-G, and the blue light emitting region PXA-B are arranged may be provided in various combinations according to the characteristics of display quality required in the display device DD. For example, the arrangement of the light emitting regions PXA-R, PXA-G, and PXA-B may be a PENTILE® arrangement or a diamond arrangement.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but the embodiment of the disclosure is not limited thereto.

Hereinafter, FIGS. 3A to 3D are cross-sectional views schematically illustrating light emitting elements according to embodiments. Light emitting elements ED according to embodiments each may include a first electrode EL1, a second electrode EL2 disposed on the first electrode EL1, and an emission part EMA disposed between the first electrode EL1 and the second electrode EL2. In addition, the light emitting element ED may include a hole transport region HTR disposed between the first electrode EL1 and the emission part EMA, and an electron transport region ETR disposed between the emission part EMA and the second electrode EL2.

Figure 3A:
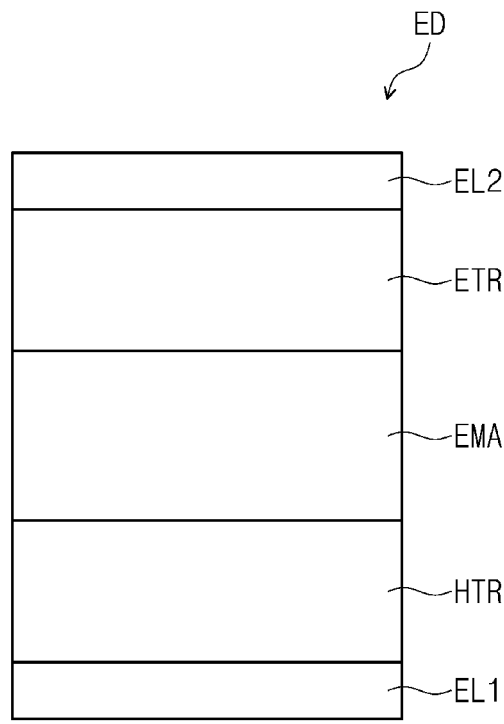
FIG. 3A is a schematic cross-sectional view schematically illustrating a light emitting element of an embodiment of the disclosure.
Figure 3B:
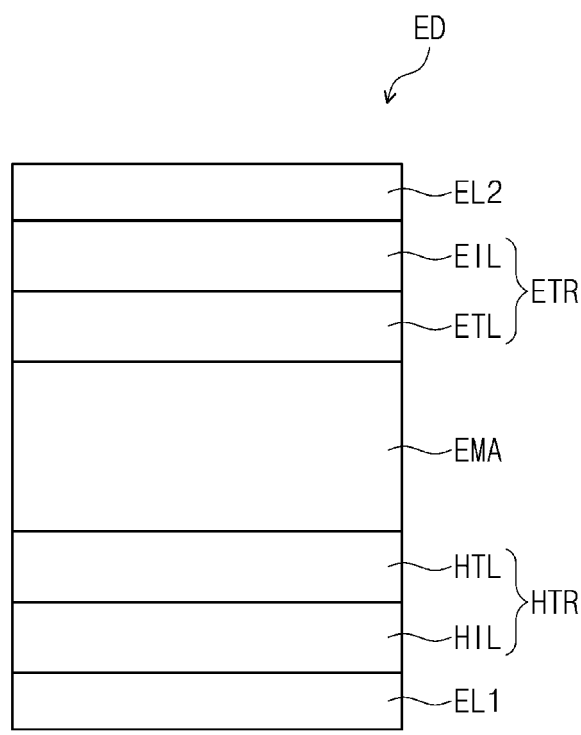
FIG. 3B is a schematic cross-sectional view schematically illustrating a light emitting element of an embodiment of the disclosure.
Figure 3C:
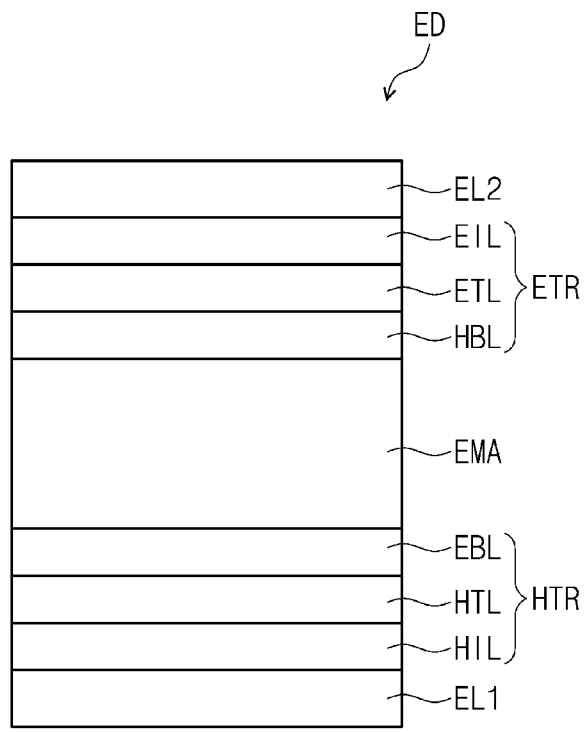
FIG. 3C is a schematic cross-sectional view schematically illustrating a light emitting element of an embodiment of the disclosure.
Figure 3D:
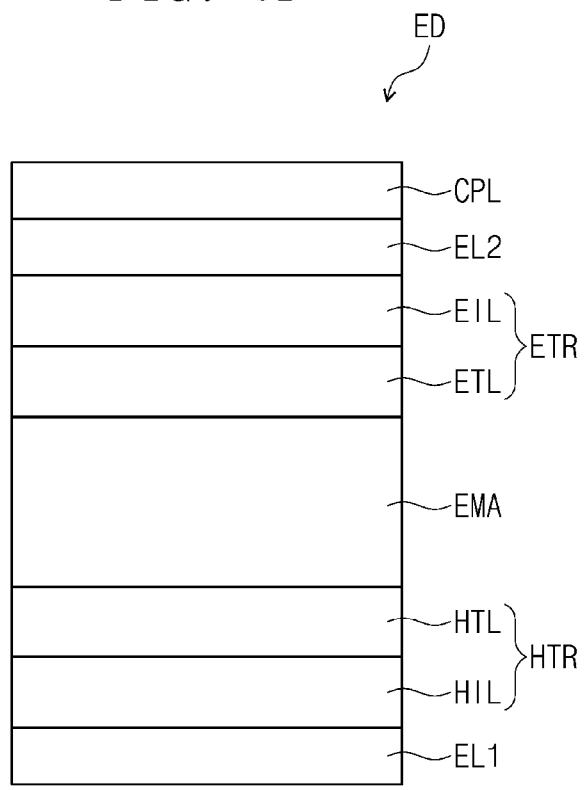
FIG. 3D is a schematic cross-sectional view schematically illustrating a light emitting element of an embodiment of the disclosure.

Compared to FIG. 3A, FIG. 3B illustrates a cross-sectional view of a light emitting element ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3A, FIG. 3C illustrates a cross-sectional view of a light emitting element ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 3B, FIG. 3D illustrates a cross-sectional view of a light emitting element ED of an embodiment including a capping layer CPL disposed on a second electrode EL2.

Figure 4:
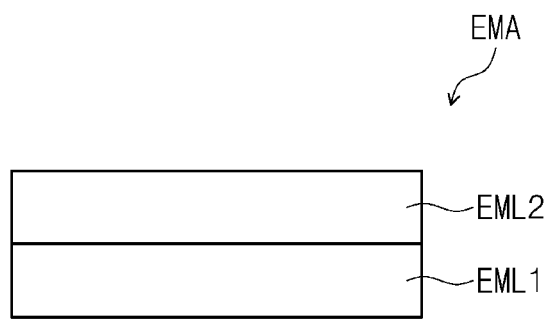
FIG. 4 is a schematic cross-sectional view showing a portion of a light emitting element according to an embodiment of the disclosure.

FIG. 4 is a schematic cross-sectional view illustrating a cross section of an emission part EMA of an embodiment. The emission part EMA may include a first emission layer EML1 and a second emission layer EML2 disposed on the first emission layer EML1. The first emission layer EML1 may be disposed to be adjacent to the hole transport region HTR, and the second emission layer EML2 may be disposed to be adjacent to the electron transport region ETR.

The first emission layer EML1 may contain one host and one dopant, and the second emission layer EML2 may contain two hosts and one dopant. The first emission layer EML1 may contain a first host and a first dopant. The second emission layer EML2 may contain a hole transport host, an electron transport host, and a second dopant. For example, the first dopant of the first emission layer EML1 and the second dopant of the second emission layer EML2 may be different. Unlike this, the first dopant of the first emission layer EML1 and the second dopant of the second emission layer EML2 may be the same.

Each of the first dopant and the second dopant may have a luminescence center wavelength in a wavelength region of about 440 nm to about 480 nm. The overlapping ratio of the luminescence wavelength region of the first dopant and the luminescence wavelength region of the second dopant may be about 80% or more. The first emission layer EML1 containing the first dopant and the second emission layer EML2 containing the second dopant may emit blue light.

In an embodiment, a first hole mobility of the first host in the first emission layer EML1 may be about $5.0 \times 10^{-6}$ $cm^2/Vs$ to about $1.0 \times 10^{-3}$ $cm^2/Vs$, a second hole mobility of a host mixture including the hole transport host and the electron transport host in the second emission layer EML2 may be about $1.0 \times 10^{-6}$ $cm^2/Vs$ to about $1.0 \times 10^{-4}$ $cm^2/Vs$, and the first hole mobility may be larger than the second hole mobility. The host mixture may be a state in which the hole transport host and the electron transport host are mixed. The light emitting element ED of an embodiment, in which the first hole mobility satisfies a range of about $5.0 \times 10^{-6}$ $cm^2/Vs$ to about $1.0 \times 10^{-3}$ $cm^2/Vs$, the second hole mobility satisfies a range of about $1.0 \times 10^{-6}$ $cm^2/Vs$ to about $1.0 \times 10^{-4}$ $cm^2/Vs$, and the first hole mobility has a larger value than the second hole mobility, may exhibit improved efficiency and service life characteristics.

The difference between the first hole mobility and the second hole mobility may be about $1.0 \times 10^{-2}$ $cm^2/Vs$ or less. The first hole mobility may be about five fold or more of the second hole mobility. The light emitting element, in which the first hole mobility is about five fold or more of the second hole mobility, may exhibit characteristics of uniform distribution of holes in the emission part EMA. The holes may be uniformly distributed to the first emission layer EML1 and the second emission layer EML2 rather than being lopsidedly distributed to any of the first emission layer EML1 and the second emission layer EML2.

The first host, the hole transport host, and the electron transport host may be different from one another. The hole mobility of the first host and the hole mobility of the hole transport host may be different. The electron mobility of the first host and the electron mobility of the electron transport host may be different. The first host is a host capable of both hole transporting and electron transporting. The hole transport host is a host having hole transport characteristics stronger than electron transport characteristics. The electron transport host is a host having electron transport characteristics stronger than hole transport characteristics.

The electron mobility of the first host of the first emission layer EML1 may be larger than the electron mobility of the electron transport host of the second emission layer EML2. The difference between the electron mobility of the first host and the electron mobility of the electron transport host may be about $1.0 \times 10^{-3}$ $cm^2/Vs$ to about $1.0 \times 10^{-1}$ $cm^2/Vs$. The electron mobility of the first host may be about 10 fold or more of that of the electron transport host. The light emitting element ED, in which the electron mobility of the first host is about 10 fold or more of that of the electron transport host, may exhibit improved efficiency and service life characteristics.

For example, the electron mobility of the first host in the first emission layer EML1 may be about $1.0 \times 10^{-5}$ $cm^2/Vs$ to about $1.0 \times 10^{-2}$ $cm^2/Vs$. In the second emission layer EML2, the electron mobility of the host mixture including the hole transport host and the electron transport host may be about $1.0 \times 10^{-7}$ $cm^2/Vs$ to about $5.0 \times 10^{-3}$ $cm^2/Vs$. The electron mobility of the first emission layer EML1 containing one host has a value larger than the electron mobility of the second emission layer EML2 containing two hosts, and thus the light emitting element ED including the first emission layer EML1 and the second emission layer EML2 may exhibit improved efficiency and service life characteristics.

In the second emission layer EML2, the weight ratio of the hole transport host to the electron transport host may be about 2:8 to about 8:2. For example, in the second emission layer EML2, the weight of the hole transport host and the weight of the electron transport host may be the same. Unlike this, in the second emission layer EML2, the weight of the hole transport host and the weight of the electron transport host may be the different. In the second emission layer EML2, the weight ratio of the hole transport host to the electron transport host may be about 2:8, about 4:6, about 5:5, about 6:4, or about 8:2. However, these are exemplary, and in the second emission layer EML2, the weight ratio of the hole transport host to the electron transport host is not limited thereto.

Figure 5A:
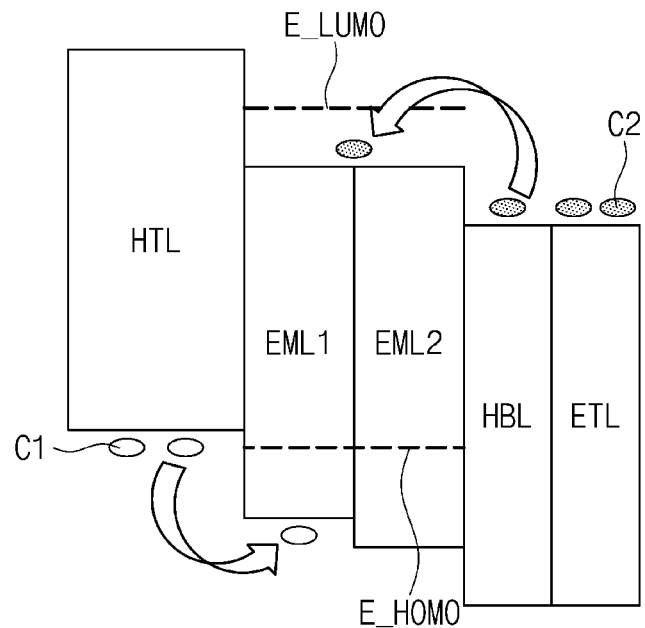
FIG. 5A schematically illustrates a portion of a light emitting element according to an embodiment of the disclosure.
Figure 5B:
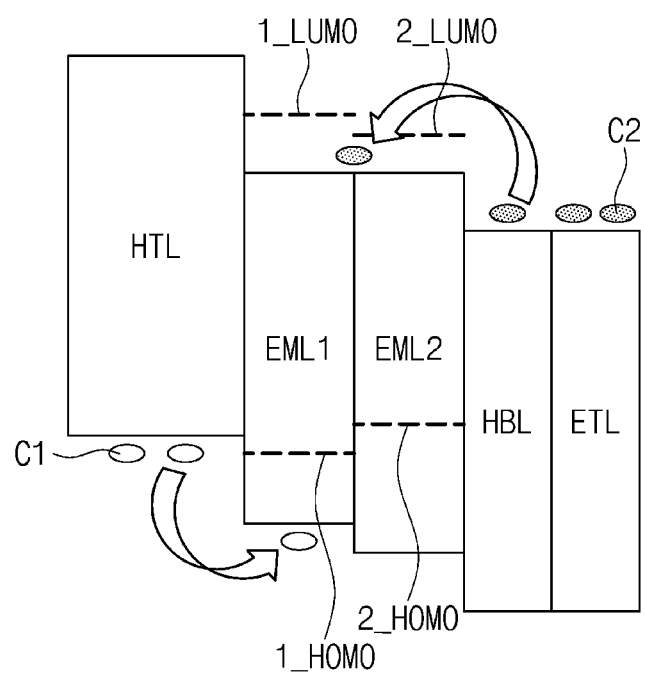
FIG. 5B schematically illustrates a portion of a light emitting element according to an embodiment of the disclosure.

FIGS. 5A and 5B illustrate the energy level of the dopant contained in the first emission layer EML1 and the second emission layer EML2. FIG. 5A illustrates the energy level in case that the first dopant of the first emission layer EML1 and the second dopant of the second emission layer EML2 are the same. FIG. 5B illustrates the energy level in case that the first dopant of the first emission layer EML1 and the second dopant of the second emission layer EML2 are different. FIGS. 5A and 5B illustrate that the hole transport layer HTL is disposed to be adjacent to the first emission layer EML1 and the hole blocking layer HBL and the electron transport layer ETL are disposed to be adjacent to the second emission layer EML2, but these are exemplary, and the embodiment of the disclosure is not limited thereto. The hole transport layer HTL, the hole blocking layer HBL, and the electron transport layer ETL will be described in more detail below.

FIG. 5A illustrates that the LUMO energy level E_LUMO of the dopant in the first emission layer EML1 is the same as that in the second emission layer EML2 because the first dopant of the first emission layer EML1 and the second dopant of the second emission layer EML2 are the same. In addition, it is illustrated that the HOMO energy level E_HOMO of the dopant in the first emission layer EML1 is the same as that in the second emission layer EML2. In the specification, the LUMO energy level is the energy level of the lowest unoccupied molecular orbital, and the HOMO energy level is the energy level of the highest occupied molecular orbital.

The LUMO energy level E_LUMO of the dopant in the first emission layer EML1 is the same as that in the second emission layer EML2 and the HOMO energy level E_HOMO of the dopant in the first emission layer EML1 is the same as that in the second emission layer EML2, and thus an energy band gap in the first emission layer EML1 may be the same as that in the second emission layer EML2. The energy band gap is the difference between the HOMO energy level E_HOMO of the dopant and the LUMO energy level E_LUMO of the dopant.

Unlike this, FIG. 5B illustrates that the energy level of the first emission layer EML1 is different from that of the second emission layer EML2 because the first dopant of the first emission layer EML1 is different from the second dopant of the second emission layer EML2. A first LUMO energy level 1_LUMO of the first dopant of the first emission layer EML1 may be larger than a second LUMO energy level 2_LUMO of the second dopant of the second emission layer EML2. A first HOMO energy level 1_HOMO of the first dopant of the first emission layer EML1 may be smaller than a second HOMO energy level 2_HOMO of the second dopant of the second emission layer EML2. Therefore, the energy band gap in the first emission layer EML1 may be larger than that in the second emission layer EML2.

As illustrated in FIGS. 5A and 5B, a hole C1 may move from the hole transport layer HTL to the first emission layer EML1, and an electron C2 may move from the electron transport layer ETL to the second emission layer EML2. Accordingly, the hole C1 and the electron C2 may be bonded in the emission part EMA to form an exciton and emit light.

In an embodiment, the absolute value of the LUMO energy level of the first host of the first emission layer EML1 may be about 2.0 eV to about 3.5 eV. The LUMO energy level of the first host may be different from the LUMO energy level of the electron transport host of the second emission layer EML2. The difference between the LUMO energy level of the electron transport host and the LUMO energy level of the first host may be about 0.2 eV to about 0.4 eV. The LUMO energy level of the electron transport host may be smaller than the LUMO energy level of the first host by about 0.2 eV to about 0.4 eV. Unlike this, the LUMO energy level of the electron transport host may be larger than the LUMO energy level of the first host by about 0.2 eV to about 0.4 eV.

For example, the difference between the LUMO energy level of the electron transport host and the LUMO energy level of the first host may be about 0.3 eV. The absolute value of the LUMO energy level of the electron transport host may be about 1.7 eV to about 3.8 eV. More specifically, the absolute value of the LUMO energy level of the first host may be about 2.43 eV, and the absolute value of the LUMO energy level of the electron transport host may be about 2.63 eV. However, this is exemplary, and the embodiment of the disclosure is not limited thereto.

The absolute value of the LUMO energy level of the hole transport host may be about 2.0 eV to about 3.0 eV. For example, the absolute value of the LUMO energy level of the hole transport host may be about 2.42 eV.

In an embodiment, the absolute value of the HOMO energy level of the first host of the first emission layer EML1 may be about 4.0 eV to about 6.0 eV. The HOMO energy level of the first host of the first emission layer EML1 may be different from the HOMO energy level of the hole transport host of the second emission layer EML2. The difference between the HOMO energy level of the hole transport host and the HOMO energy level of the first host may be about 0.1 eV to about 0.5 eV. The HOMO energy level of the hole transport host may be smaller than the HOMO energy level of the first host by about 0.1 eV to about 0.5 eV. For example, the absolute value of the HOMO energy level of the first host may be about 5.55 eV, and the absolute value of the HOMO energy level of the hole transport host may be about 5.65 eV. Unlike this, the HOMO energy level of the hole transport host may be larger than the HOMO energy level of the first host by about 0.1 eV to about 0.5 eV.

The absolute value of the HOMO energy level of the electron transport host may be larger than the absolute value of the HOMO energy level of the first host and the hole transport host. For example, the absolute value of the HOMO energy level of the electron transport host may be about 4.0 eV to about 6.0 eV. More specifically, the absolute value of the HOMO energy level of the electron transport host may be about 5.70 eV.

In an embodiment, the first host of the first emission layer EML1 may include any one among host compounds in Compound Group 1 below. The emission layer EML1 may include, as a host, any one among the host compounds in Compound Group 1 below. For example, the first host may include an anthracene derivative or a pyrene derivative.

[Compound Group 1]

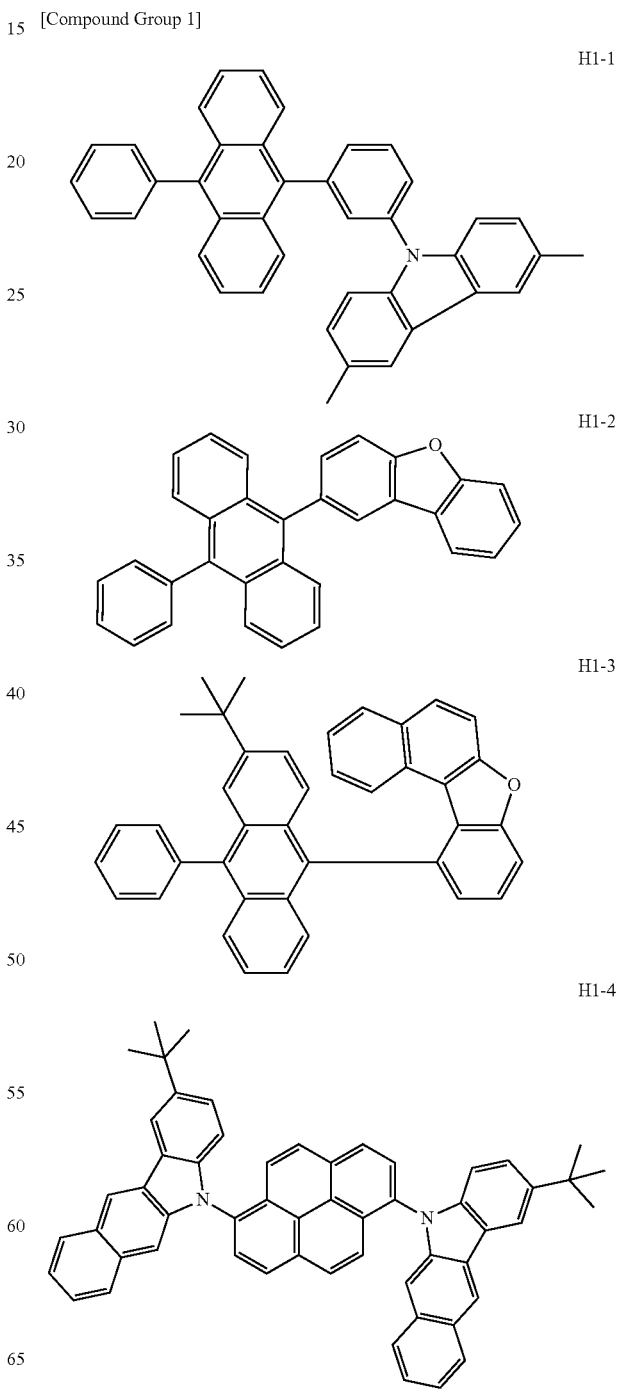

H1-5
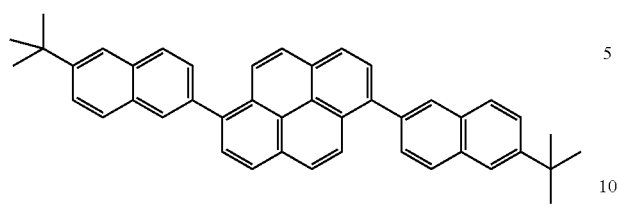
H1-6
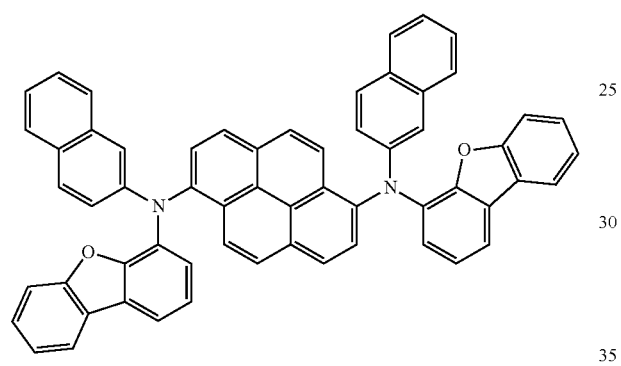
H1-7
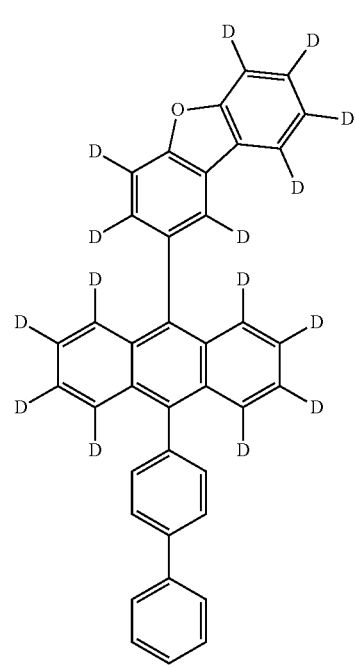
H1-8
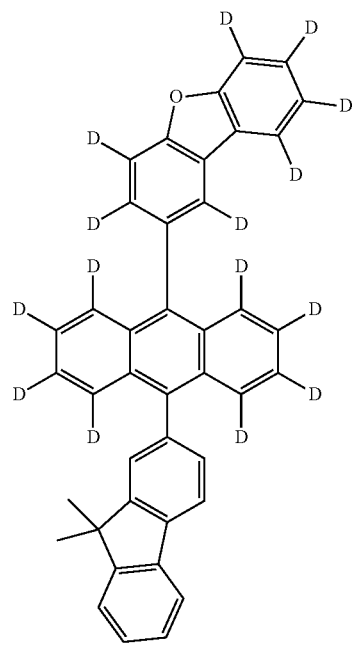
H1-9
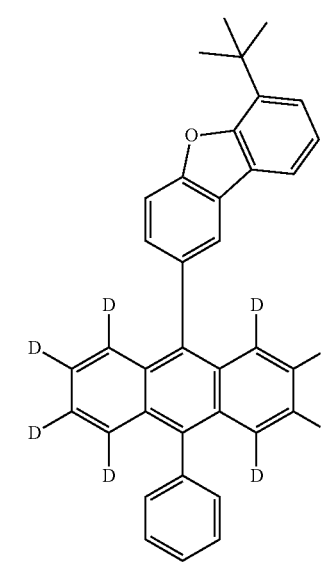
H1-10
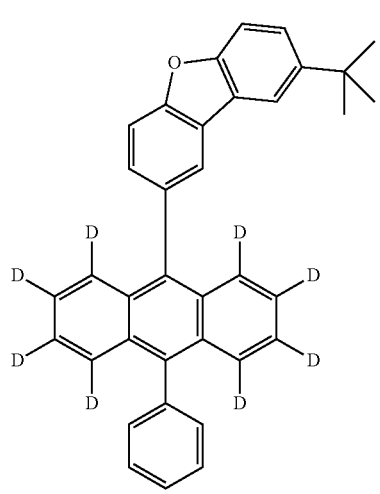

H1-11

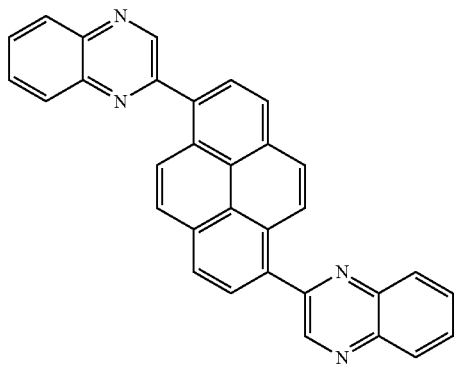

H1-12

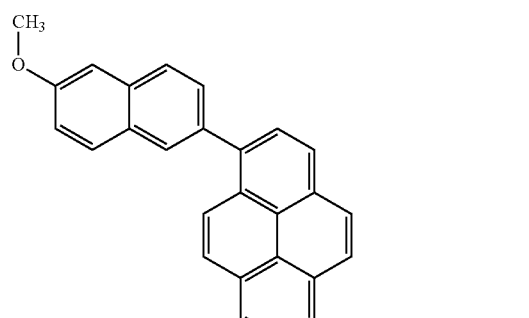

H1-13

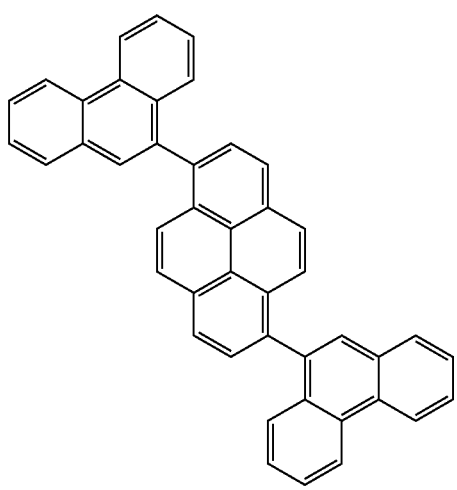

H1-14

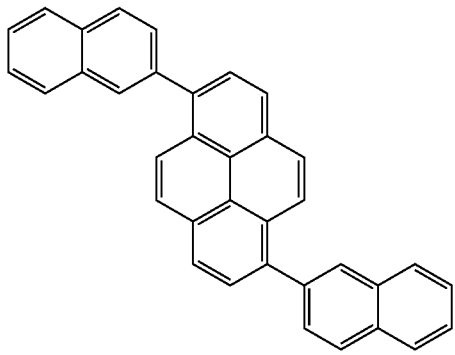

H1-15

H1-16

H1-17

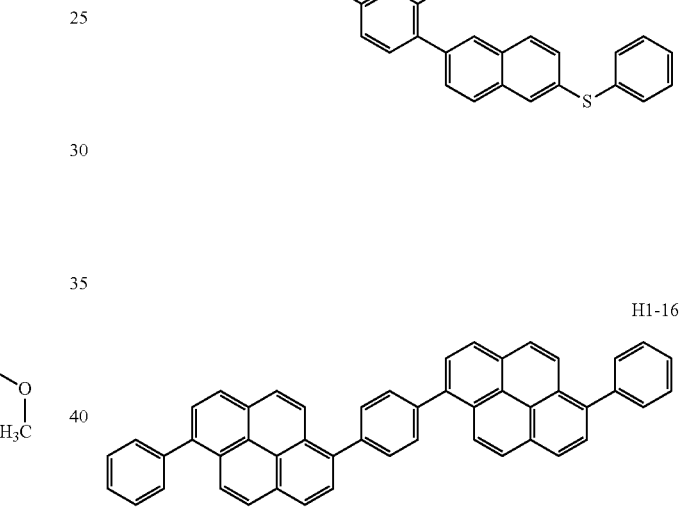

In addition, the first emission layer EML1 may include a fluoranthene derivative, a chrysene derivative, a dehydrobenzanthracene derivative, or a triphenylene derivative. For example, the first emission layer EML1 may include a compound represented by Formula E-1 below. The compound represented by Formula E-1 below may be used as the first host of the first emission layer EML1.

[Formula E-1]

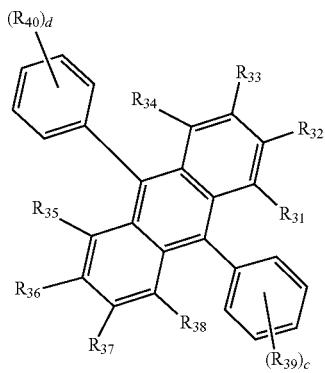

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may be each independently an integer of 0 to 5.

Formula E-1 may be represented by any one among Compounds E1 to E19 below:

E1

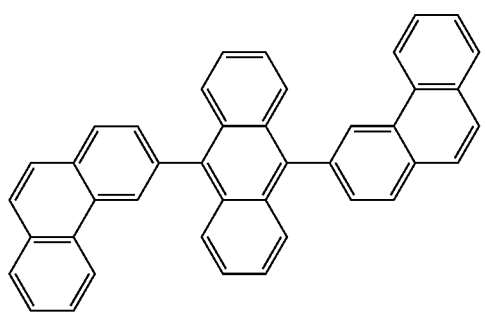

E2

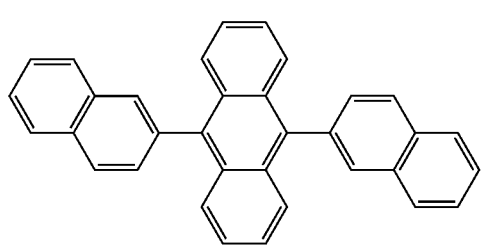

E3

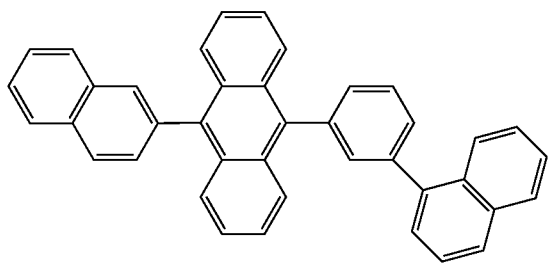

E4

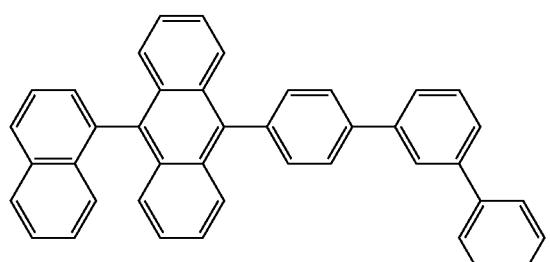

E5

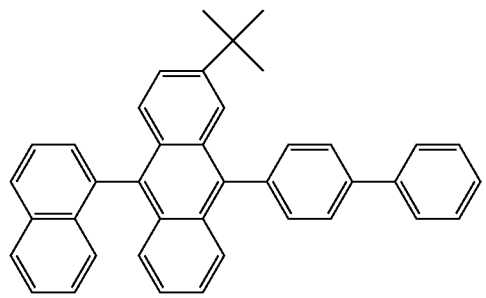

E6

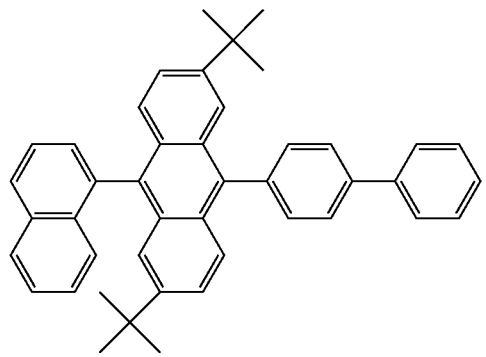

E7

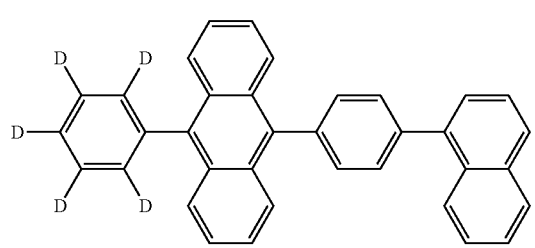

E8
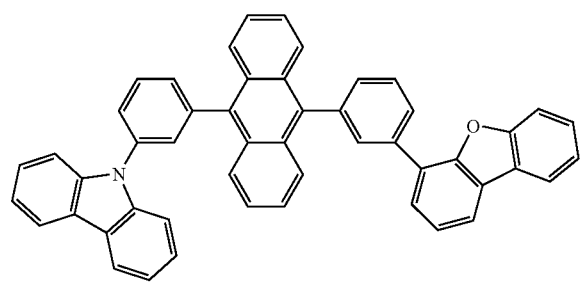
E9
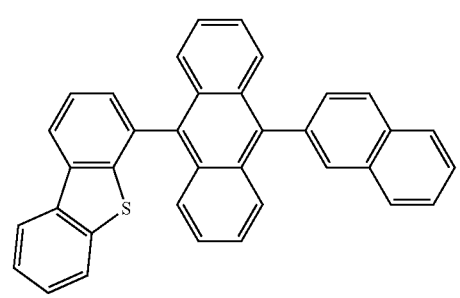
E10
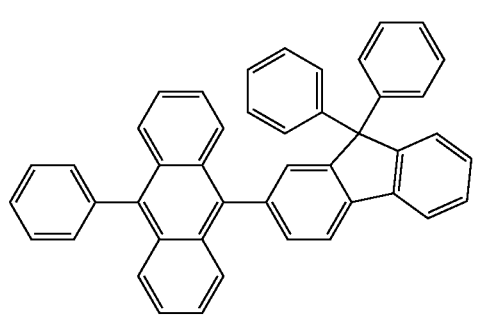
E11
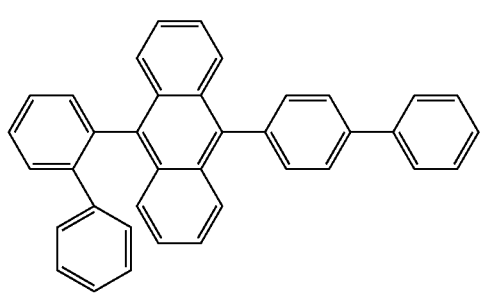
E12
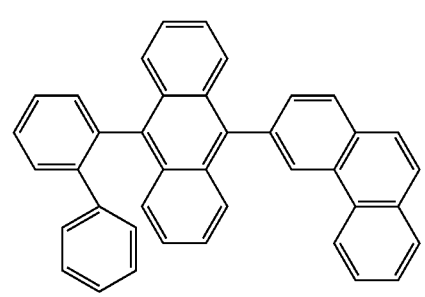
E13
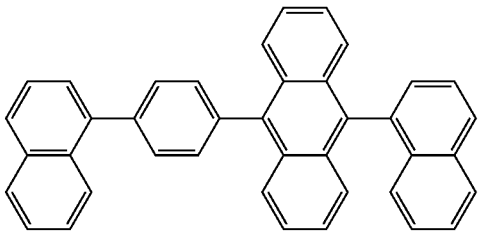
E14
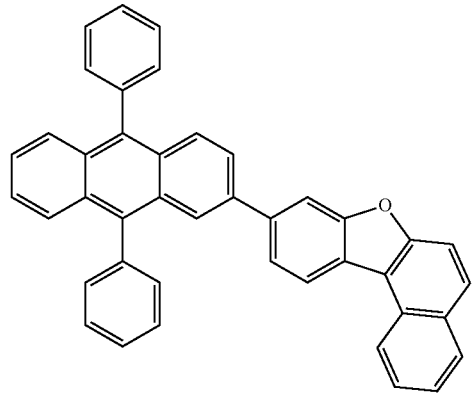
E15
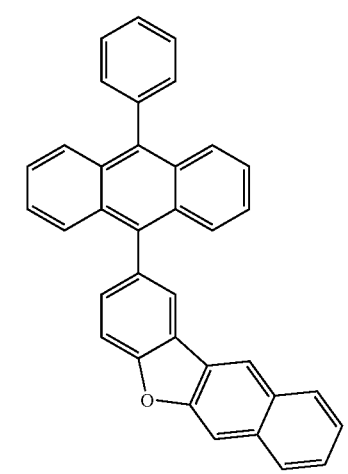
E16
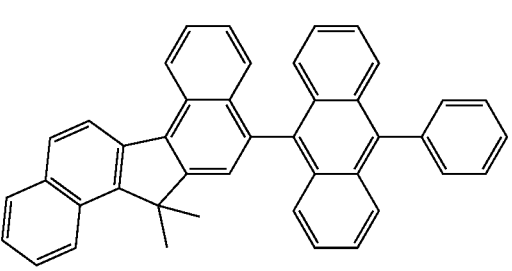

-continued
E17 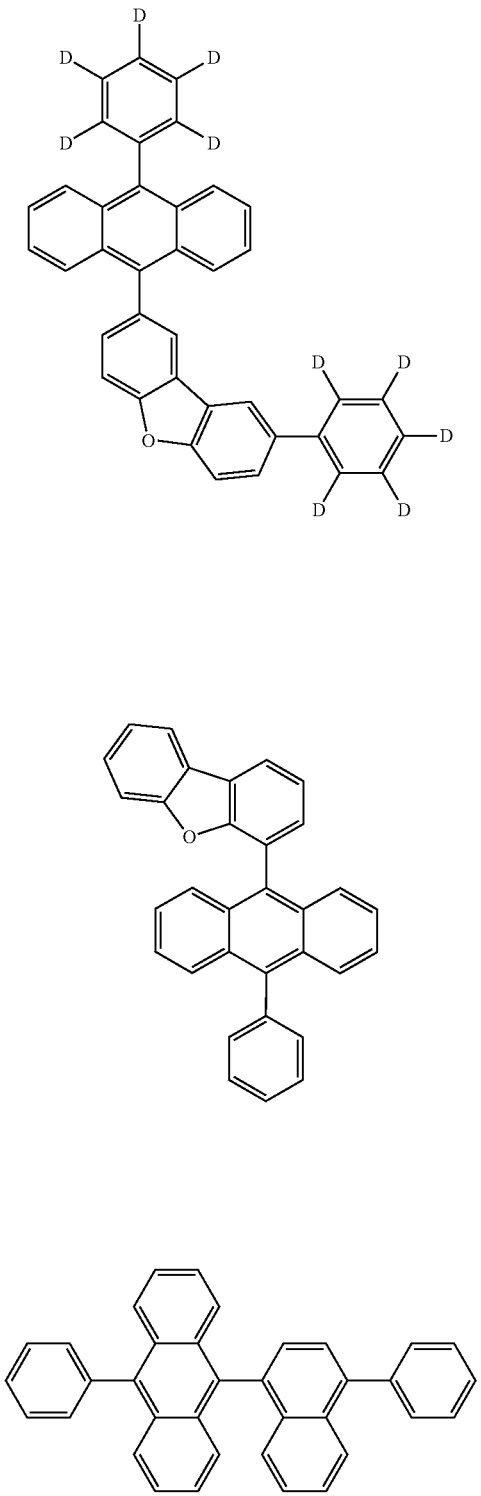
E18
E19
[Compound Group 2]
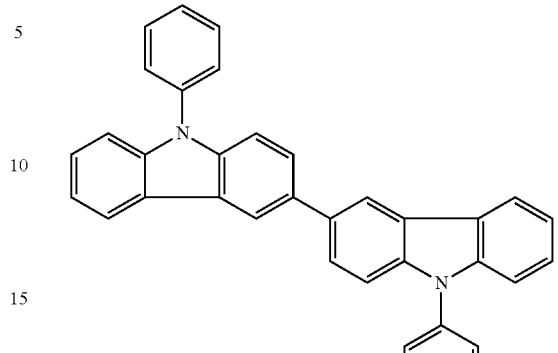
H2-1
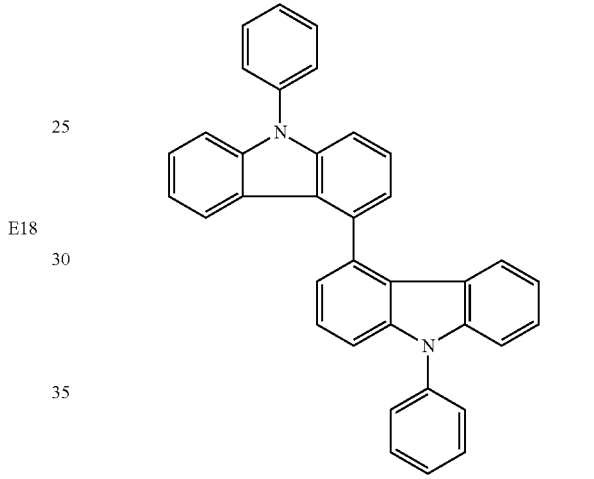
H2-2
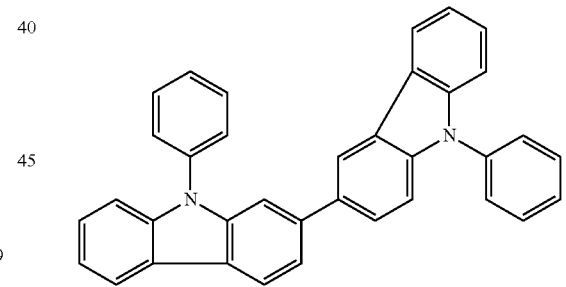
H2-3
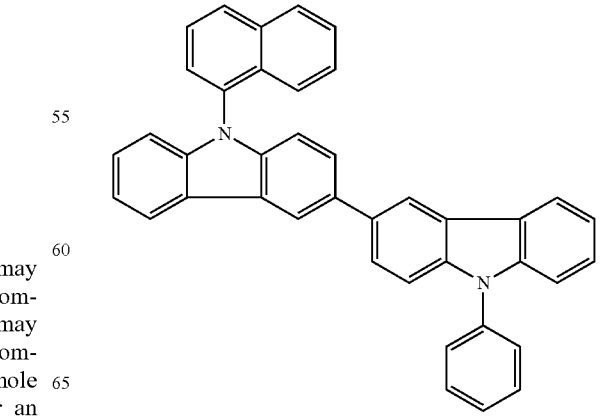
H2-4
The hole transport host of the emission layer EML2 may include any one among hole transport compounds in Compound Group 2 below. The emission layer EML2 may include, as a host, any one among the hole transport compounds in Compound Group 2. For example, the hole transport host may include a carbazole derivative or an amine derivative.

-continued
H2-5
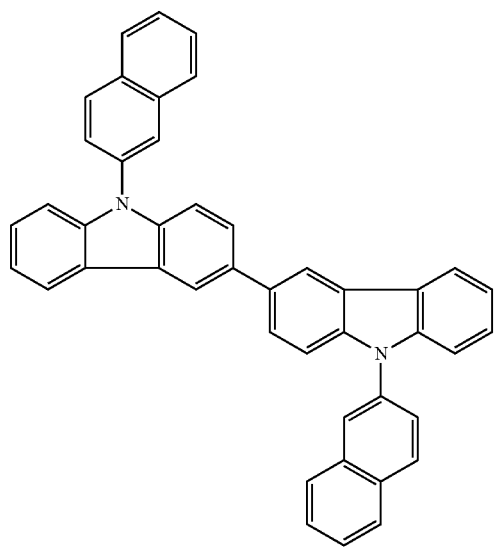
H2-6
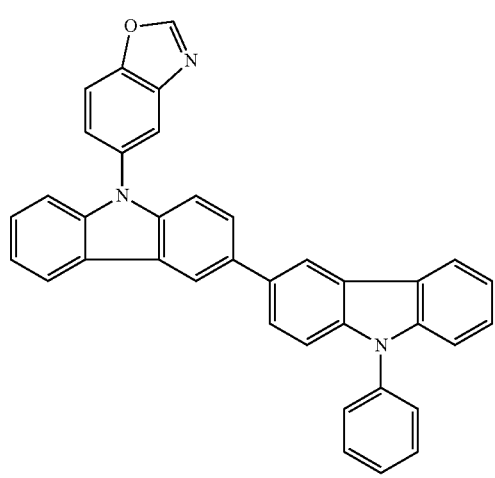
H2-7
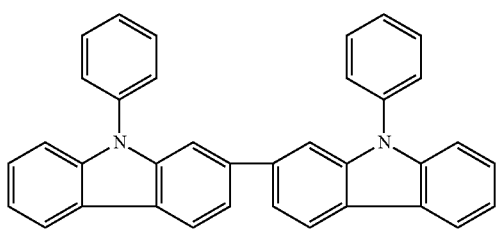
H2-8
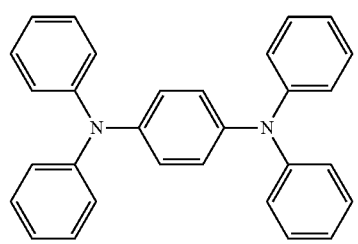
-continued
H2-9
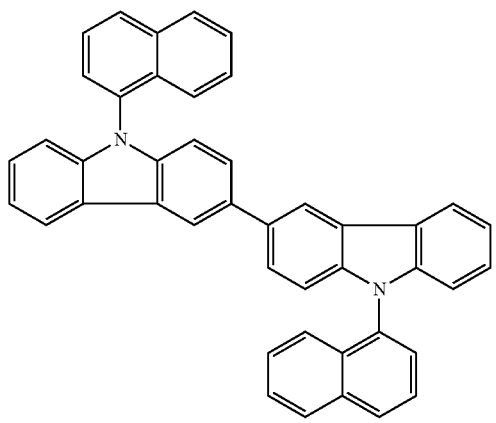
H2-10
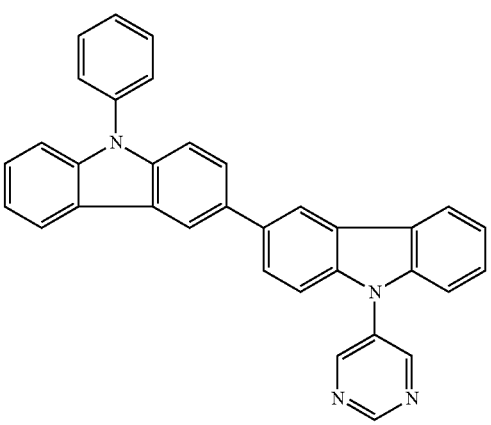
H2-11
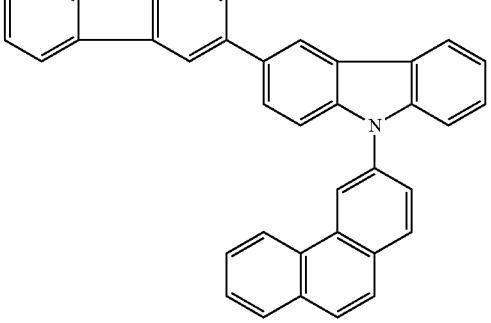

H2-12
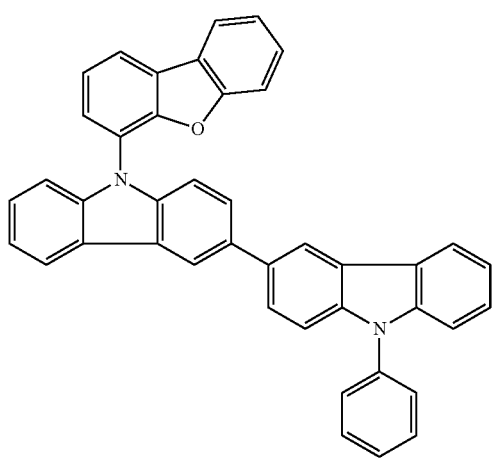
H2-13
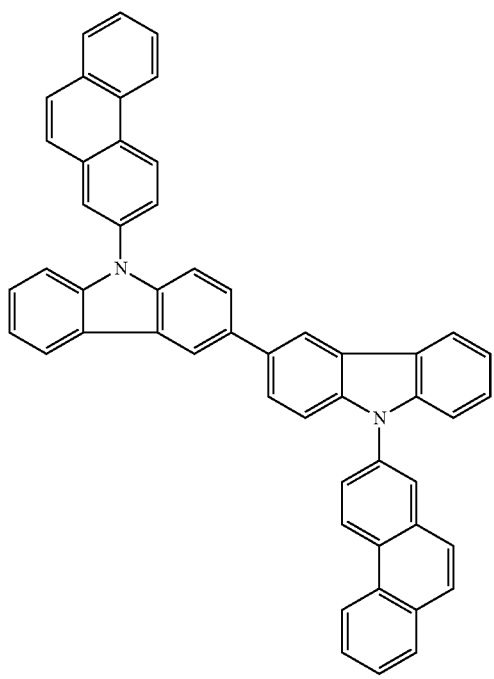
H2-14
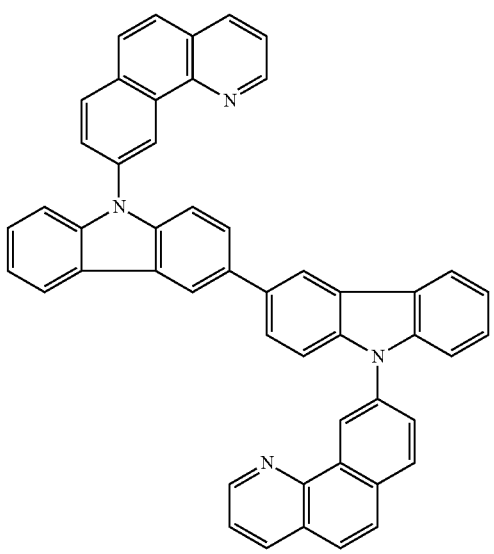
H2-15
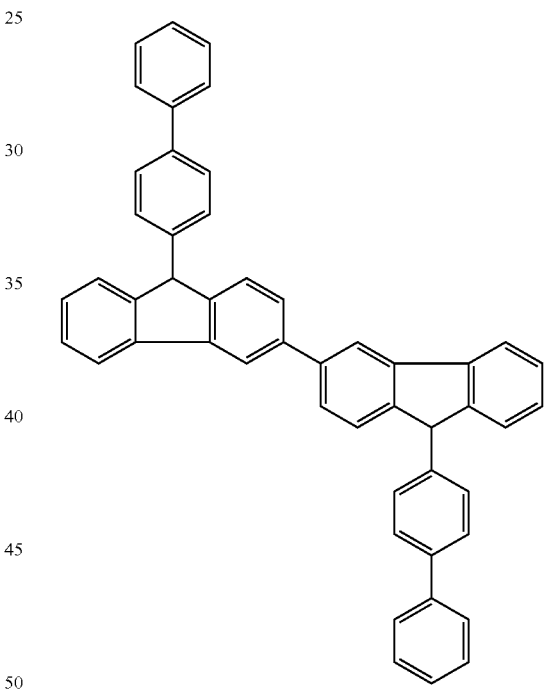
H2-16
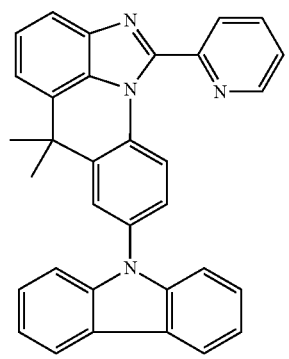

H2-17
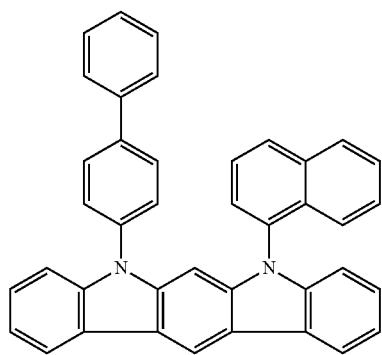
H2-18
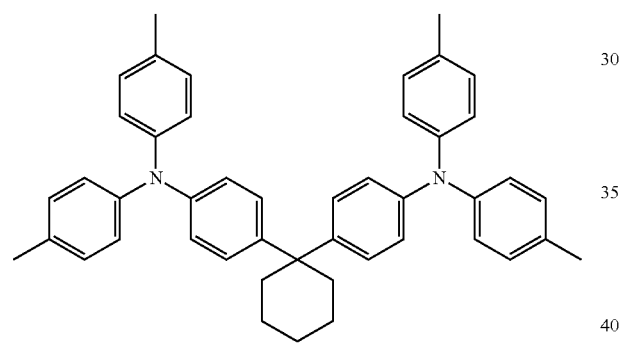
H2-19
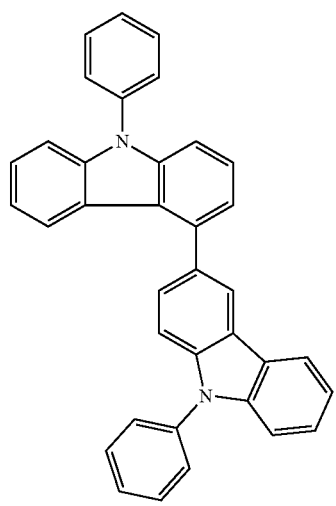
H2-20
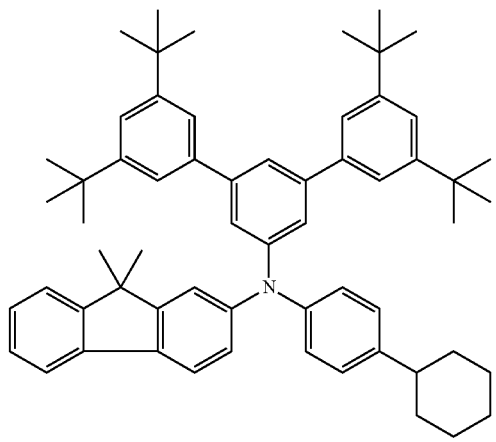
H2-21
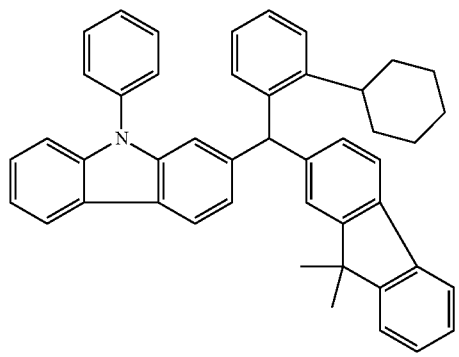
H2-22
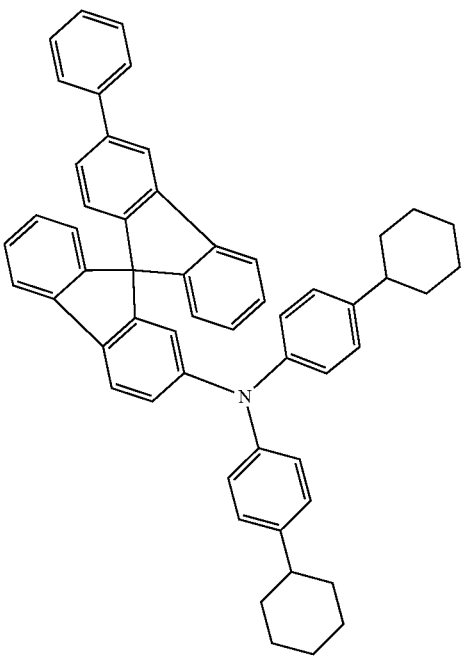

The electron transport host of the emission layer EML2 may include any one among electron transport compounds in Compound Group 3 below. The emission layer EML2 may include, as a host, any one among the electron transport compounds in Compound Group 3. The electron transport host may include a heteroaryl derivative. The heteroaryl derivative may include a heteroaryl group containing N, O, or S as a ring-forming atom.

[Compound Group 3]

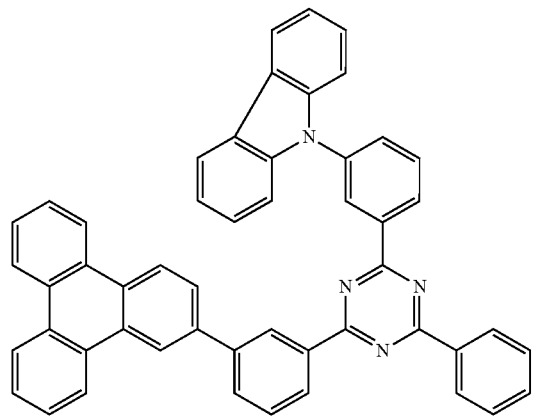

H3-1

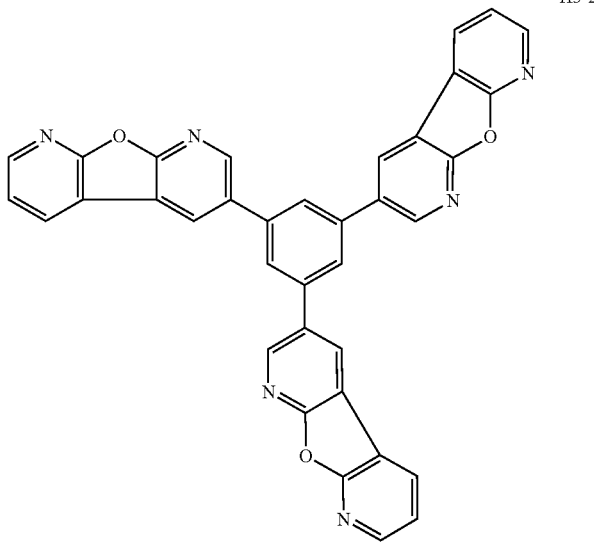

H3-2

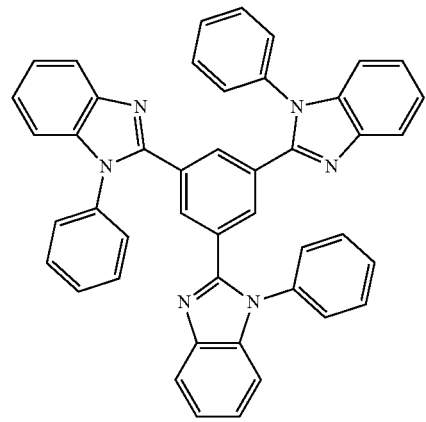

H3-3

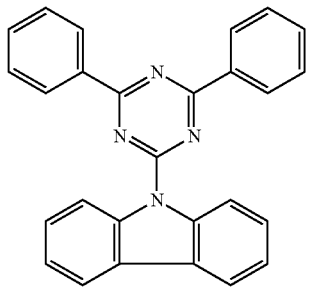

H3-4

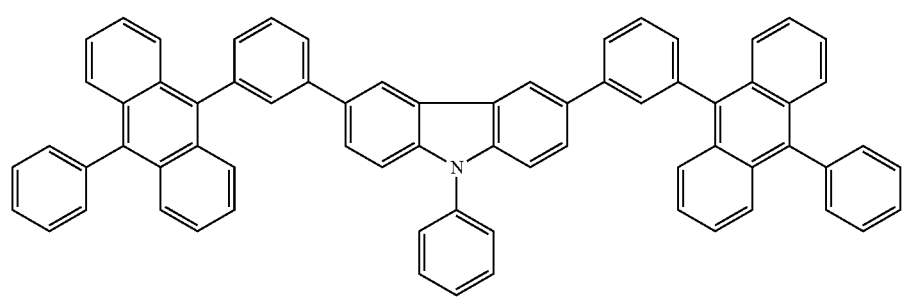

H3-5

-continued
H3-6
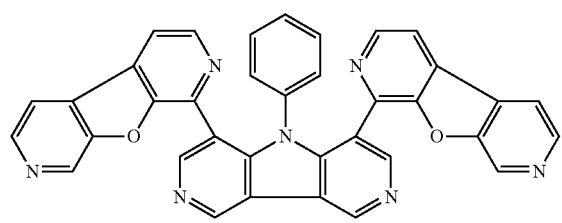
H3-7
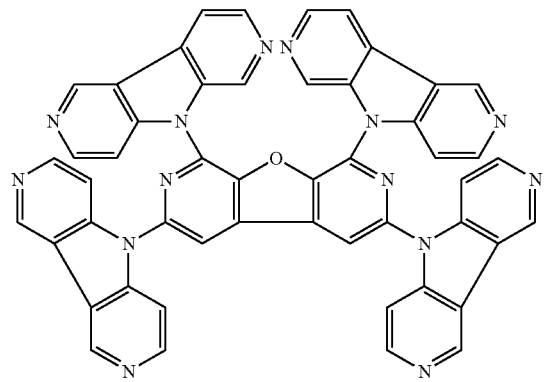
H3-8
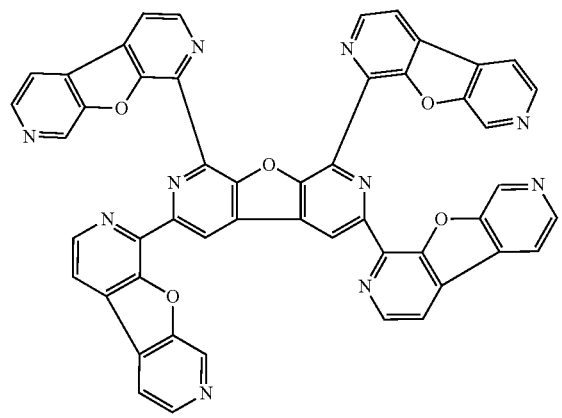
H3-9
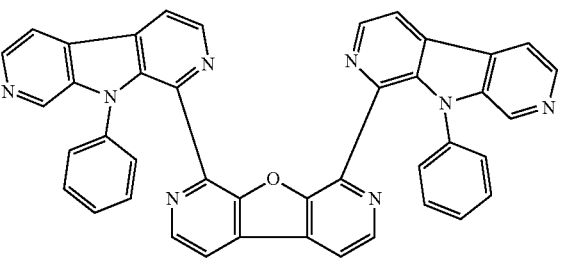
H3-10
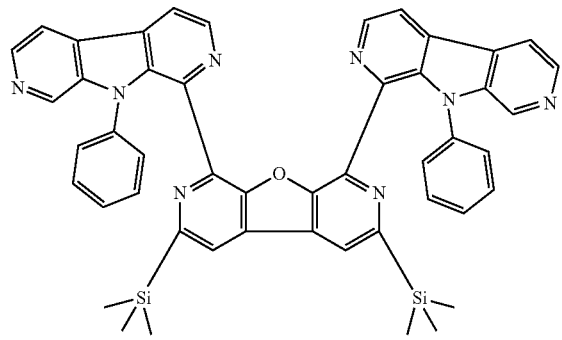
H3-11
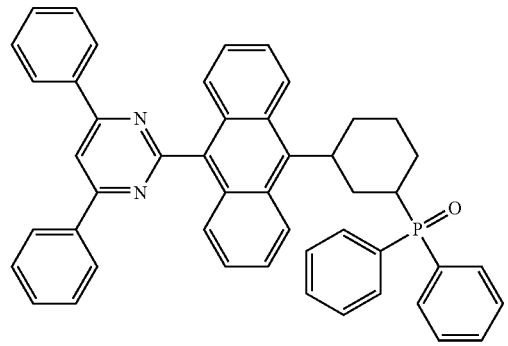
H3-12
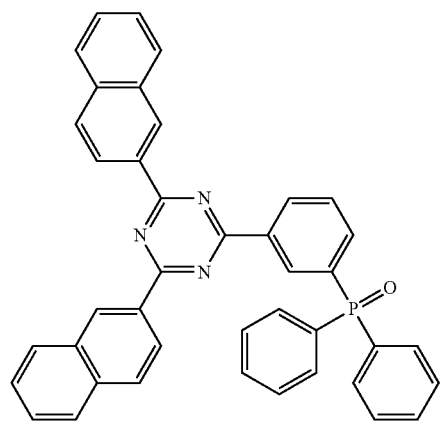
H3-13
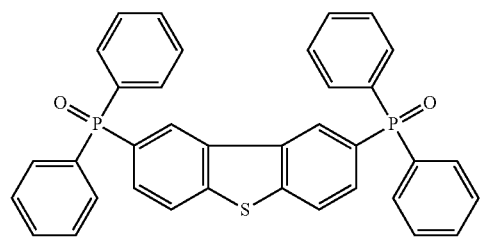

-continued
H3-14
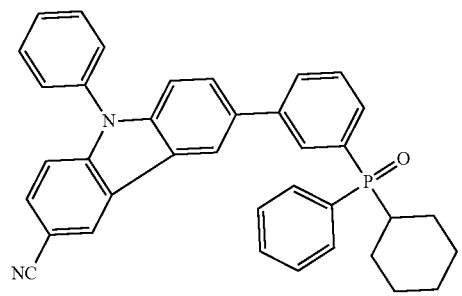
H3-15
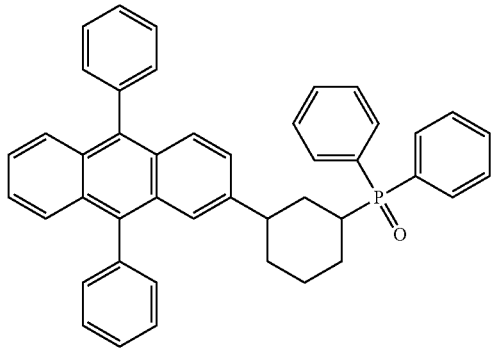
H3-16
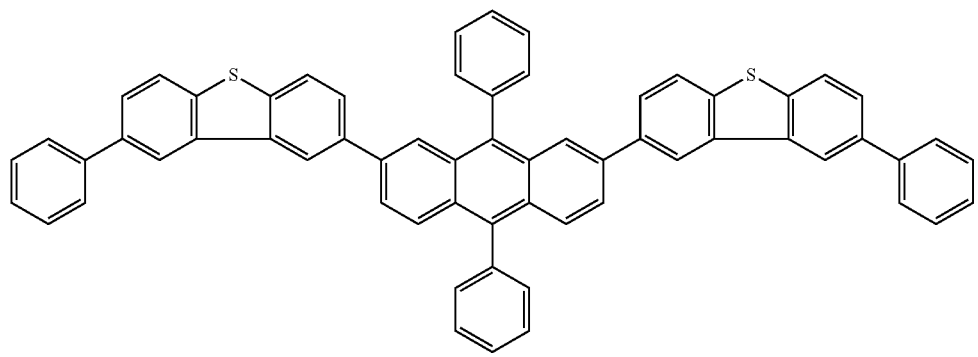
H3-17
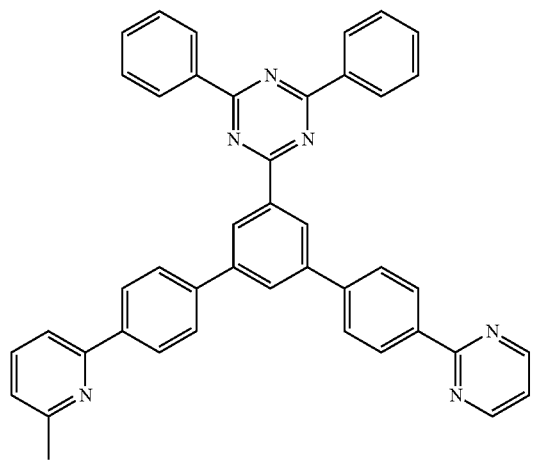
H3-18
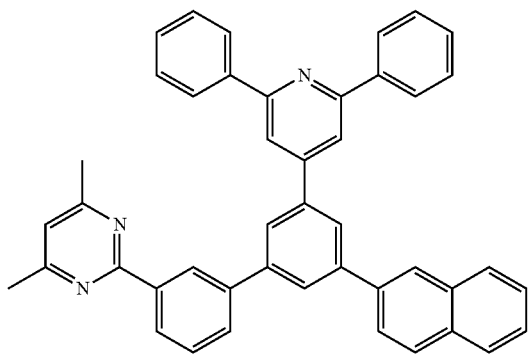
H3-19
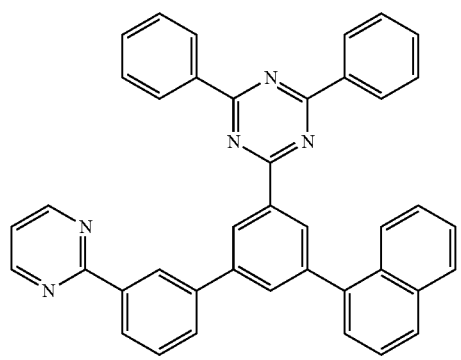
H3-20
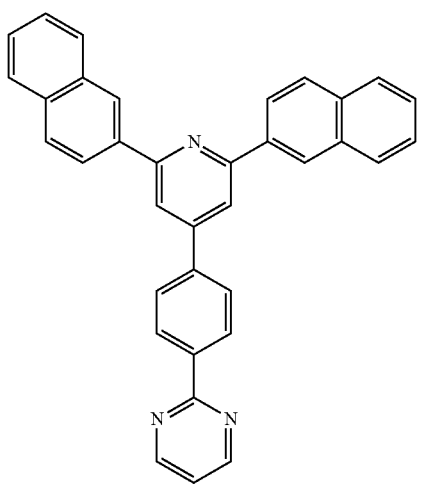

H3-21

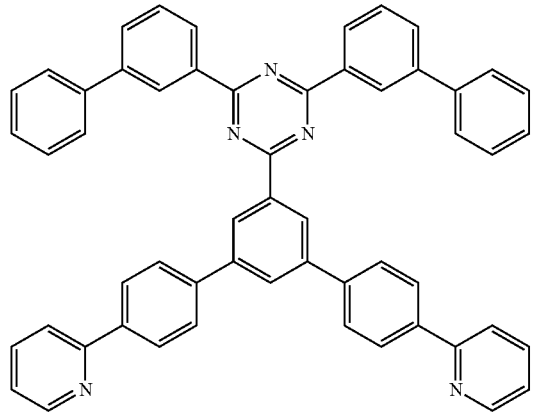

H3-22

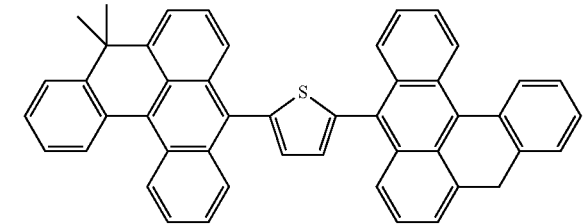

The light emitting element including one emission layer composed of one host and one dopant includes a recombination zone adjacent to the hole transport region. In the light emitting element, the recombination zone is a zone in which holes and electrons are bonded, and in case that one host has electron transport characteristics stronger than hole transport characteristics, the recombination zone is formed to be adjacent to the hole transport region. As the recombination zone is adjacent to the hole transport region, the electron blocking layer, etc. included in the hole transport region is deteriorated, thereby causing the efficiency and service life of the light emitting element to be reduced.

In the light emitting element ED of an embodiment, the first hole mobility of the first host in the first emission layer EML1 may satisfy about $5.0 \times 10^{-6}$ cm$^2$/Vs to about $1.0 \times 10^{-3}$ cm$^2$/Vs, the second hole mobility of the host mixture including the hole transport host and the electron transport host in the second emission layer EML2 may satisfy about $1.0 \times 10^{-6}$ cm$^2$/Vs to about $1.0 \times 10^{-4}$ cm$^2$/Vs, and the first hole mobility may be larger than the second hole mobility. Accordingly, the recombination zone may move to the interface between the first emission layer EML1 and the second emission layer EML2 in the emission part EMA, thereby preventing the deterioration phenomenon of the hole transport region HTR, etc. adjacent to the emission part EMA. Therefore, the light emitting element ED of an embodiment including the first emission layer EML1 and the second emission layer EML2 may exhibit improved efficiency and service life characteristics.

Referring to FIGS. 3A to 3B again, the first electrode EL1 has conductivity. The first electrode EL1 may be formed of a metal material, a metal alloy, or a conductive compound. The first electrode EL1 may be an anode or a cathode. However, the embodiment of the disclosure is not limited thereto. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). As another example, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but the embodiment of the disclosure is not limited thereto. In addition, the first electrode EL1 may include the above-described metal materials, combinations of at least two metal materials of the above-described metal materials, oxides of the above-described metal materials, or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, or an auxiliary emission layer (not shown), or an electron blocking layer EBL. The thickness of the hole transport region HTR may be, for example, from about 50 Å to about 15,000 Å.

The hole transport region HTR may have a single layer formed of a single material, a single layer formed of different materials, or a multilayer structure including layers formed of different materials.

For example, the hole transport region HTR may have a single layer structure of the hole injection layer HIL or the hole transport layer HTL, or may have a single layer structure formed of a hole injection material and a hole transport material. In addition, the hole transport region HTR may have a single layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in order from the first electrode EL1, but the embodiment of the disclosure is not limited thereto.

The hole transport region HTR may include a hole transport layer HTL, and the absolute value of the HOMO energy level of the hole transport layer HTL may be about 5.25 eV to about 5.5 eV. For example, the hole transport layer HTL may contain NPB having the absolute value of the HOMO energy level of about 5.35 eV. However, this is exemplary, and the material contained in the hole transport layer HTL is not limited thereto.

In an embodiment, the light emitting element ED including the hole transport layer HTL having the absolute value of the HOMO energy level satisfying about 5.25 eV to about 5.5 eV may not include an electron blocking layer EBL. However, this is exemplary, and the light emitting element ED may include both the hole transport layer HTL and the electron blocking layer EBL having the absolute value of the HOMO energy level satisfying the range of about 5.25 eV to about 5.5 eV. In the light emitting element ED, the electron blocking layer EBL may be disposed to be adjacent to the first emission layer EML1 of the emission part EMA.

The electron blocking layer EBL may prevent the electron injection from the electron transport region ETR to the hole transport region HTR. In addition, the electron blocking layer EBL may increase the luminous efficiency of the emission layer (e.g., the first emission layer and the second emission layer) which emits blue light by controlling the balance of the hole and electron.

The emission part EMA may include a dopant material. As a dopant material, a styryl derivative (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]biphenyl (DPAVBi), perylene and a derivative thereof (e.g., 2,5,8,11-tetra-t-butylperylene (TBP)), pyrene and a derivative thereof (e.g., 1,1-dipyrene, 1,4-dipyrenylbenzene, 1,4-bis(N,N-diphenylamino)pyrene), etc. may be included. However, this is exemplary, and the embodiment of the disclosure is not limited thereto.

In each light emitting element ED of embodiments illustrated in FIGS. 3A to 3D, the electron transport region ETR is provided on the emission part EMA. The electron transport region ETR may include at least one of the hole blocking layer HBL, the electron transport layer ETL, or the electron injection layer EIL, but the embodiment of the disclosure is not limited thereto.

The electron transport region ETR may have a single layer formed of a single material, a single layer formed of different materials, or a multilayer structure including layers formed of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of different materials, or may have a structure in which an electron transport layer ETL/electron injection layer EIL, a hole blocking layer HBL/electron transport layer ETL/electron injection layer EIL are stacked in order from the emission part EMA, but the embodiment of the disclosure is not limited thereto. The electron transport region ETR may have a thickness, for example, from about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

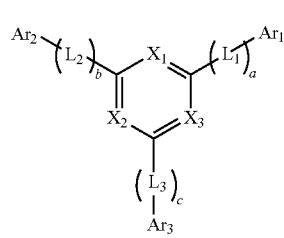

[Formula ET-1]

In Formula ET-1, at least one among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In case that a to c are an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, the embodiment of the disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), 1,3-Bis[3,5-di(pyridin-3-yl)phenyl]benzene (BmPyPhB), or a mixture thereof.

In addition, the electron transport regions ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but the embodiment of the disclosure is not limited thereto. The electron transport region ETR may also be formed of a mixture material of an electron transport material and an insulating organometallic salt. The organometallic salt may be a material having an energy band gap of about 4 eV or more. Specifically, the organometallic salt may include, for example, a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), diphenyl(4-(triphenyl silyl)phenyl)phosphine oxide (TSPO1), or 4,7-diphenyl-1,10-phenanthroline (Bphen) in addition to the above-described materials, but the embodiment of the disclosure is not limited thereto. The electron transport region ETR may include the above-described compounds of the electron transport region in at least one of the electron injection layer EIL, the electron transport layer ETL, or the hole blocking layer HBL.

In case that the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned range, satisfactory electron transport characteristics may be obtained without a substantial increase in a driving voltage. In case that the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, satisfactory electron injection characteristics may be obtained without a substantial increase in a driving voltage.

The second electrode EL2 is provided on the electron transport region ETR. The second electrode EL2 may be a common electrode. The second electrode EL2 may be a cathode or an anode, but the embodiment of the disclosure is not limited thereto. For example, in case that the first electrode EL1 is an anode, the second electrode EL2 may be a cathode, and in case that the first electrode EL1 is a cathode, the second electrode EL2 may be an anode.

The second electrode EL2 may be a transmissive electrode, a transflective electrode, or a reflective electrode. In case that the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

In case that the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgYb). As another example, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be connected with an auxiliary electrode. If the second electrode EL2 is connected with the auxiliary electrode, the resistance of the second electrode EL2 may decrease.

A capping layer CPL may further be disposed on the second electrode EL2 of the light emitting element ED of an embodiment. The capping layer CPL may include a multi-layer or a single layer.

The capping layer CPL may be an organic layer or an inorganic layer. For example, in case that the capping layer CPL contains an inorganic material, the inorganic material may include an alkaline metal compound (for example, LiF), an alkaline earth metal compound (for example, $MgF_2$), SiON, $SiN_x$, $SiO_y$, etc.

For example, in case that the capping layer CPL includes an organic material, the organic material may include α-NPD, NPB, TPD, m-MTDATA, $Alq_3$, CuPc, N4,N4,N4', N4'-tetra(biphenyl-4-yl)biphenyl-4,4'-diamine (TPD15), 4,4',4''-tris(carbazol-9-yl)triphenylamine (TCTA), etc., or an epoxy resin, or acrylate such as methacrylate. However, the embodiment of the disclosure is not limited thereto, and the capping layer CPL may include at least one among Compounds P1 to P5 below:

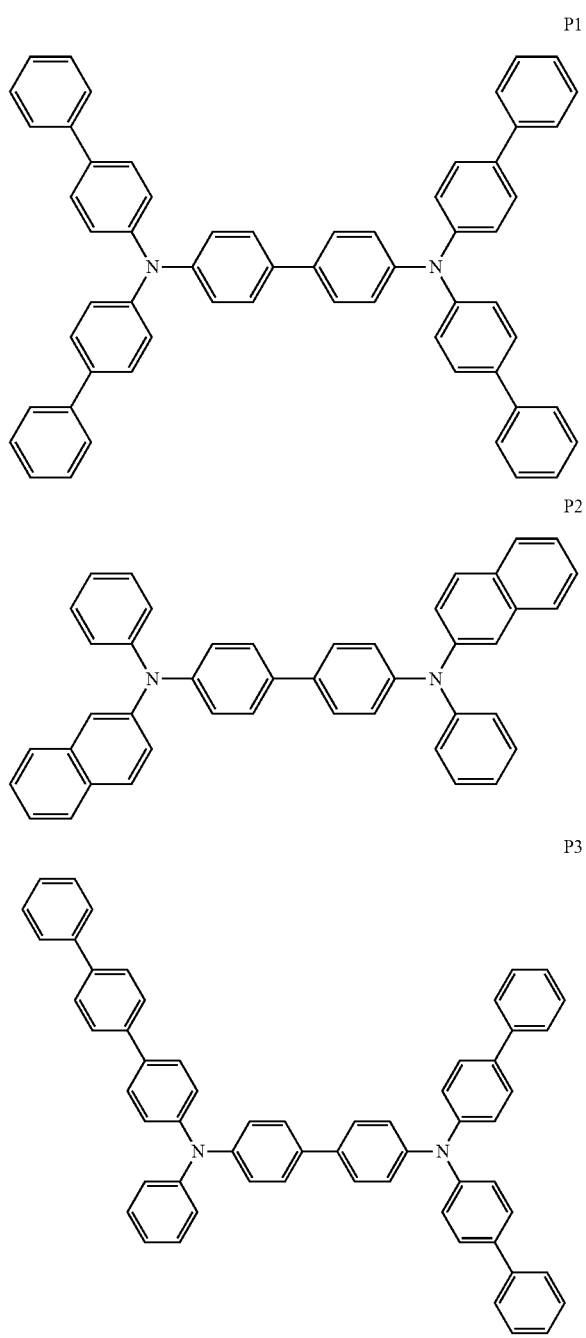

-continued

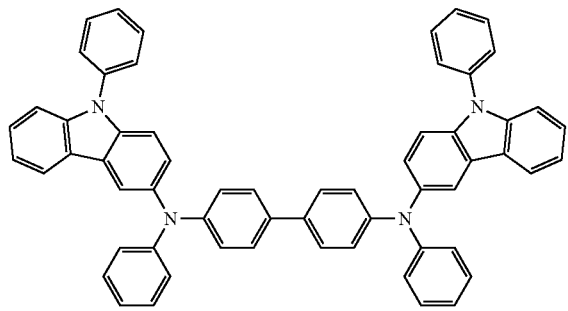

P4

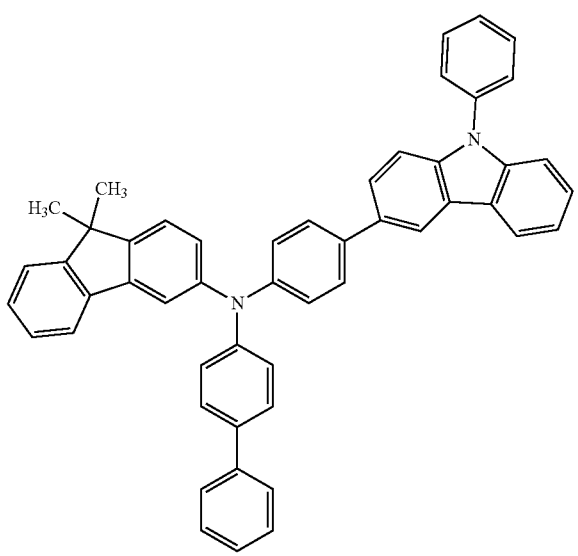

P5

The refractive index of the capping layer CPL may be about 1.6 or more. Specifically, the refractive index of the capping layer CPL may be about 1.6 or more with respect to light in a wavelength range of about 550 nm to about 660 nm.

The light emitting element of an embodiment may include emission parts disposed between the first electrode EL1 and the second electrode EL2. FIGS. 6A to 6H illustrate light emitting elements ED-TDa1 to ED-TDa3, ED-TDb1 to ED-TDb3, ED-TDc, and ED-TDd including the emission parts. The light emitting elements ED-TDa1 to ED-TDa3, ED-TDb1 to ED-TDb3, ED-TDc, and ED-TDd may include a first emission part EMA1, a second emission part EMA2, and a third emission part EMA3, which are disposed between the first electrode EL1 and the second electrode EL2.

At least one of the first emission part EMA1, the second emission part EMA2, or the third emission part EMA3 may include first emission layers EML1, EML1-1, EML2-1, and EML3-1 and second emission layers EML2, EML1-2, EML2-2, and EML3-2. The first emission layers EML1, EML1-1, EML2-1, and EML3-1 may contain a first host and a first dopant, and the second emission layers EML2, EML1-2, EML2-2, and EML3-2 may contain a hole transport host, an electron transport host, and a second dopant. A first hole mobility of the first host in the first emission layers EML1, EML1-1, EML2-1, and EML3-1 may be about $5.0 \times 10^{-6}$ cm$^2$/Vs to about $1.0 \times 10^{-3}$ cm$^2$/Vs, a second hole mobility of a host mixture including the hole transport host and the electron transport host in the second emission layers EML2, EML1-2, EML2-2, and EML3-2 may be about $1.0 \times 10^{-6}$ cm$^2$/Vs to about $1.0 \times 10^{-4}$ cm$^2$/Vs, and the first hole mobility may be larger than the second hole mobility. The light emitting elements ED-TDa1 to ED-TDa3, ED-TDb1 to ED-TDb3, ED-TDc, and ED-TDd of an embodiment, in which at least one emission part among the emission parts EMA1, EMA2, and EMA3 includes the first emission layer and the second emission layer, may exhibit improved efficiency and service life characteristics.

Hereinafter, in describing the light emitting elements of embodiments with reference to FIGS. 6A to 6H, the duplicated features which have been described in FIGS. 1 to 5B are not described again, but their differences will be mainly described.

Figure 6A:
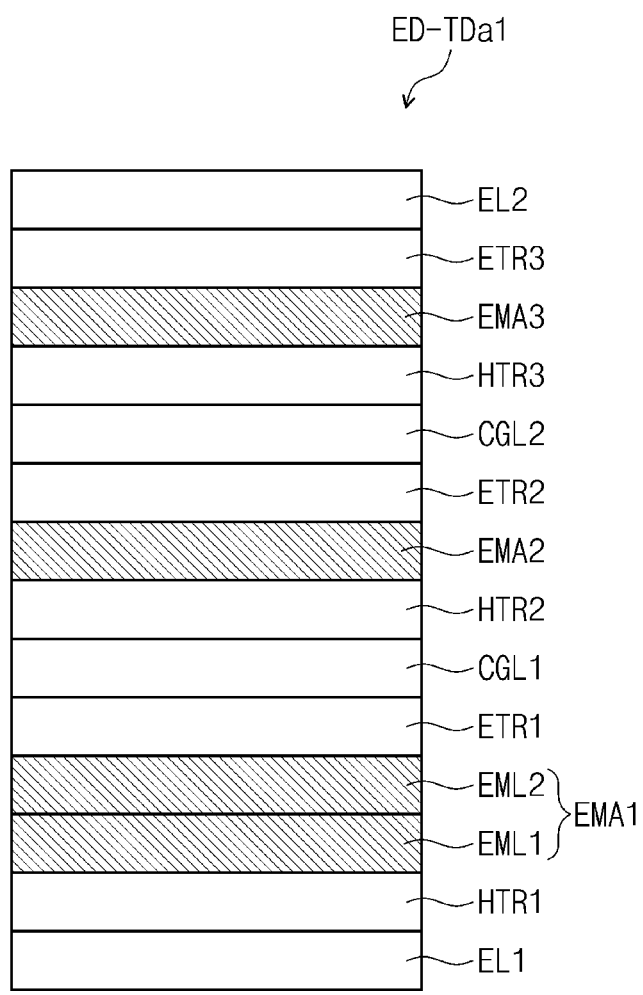
FIG. 6A is a schematic cross-sectional view illustrating a light emitting element according to an embodiment of the disclosure.
Figure 6B:
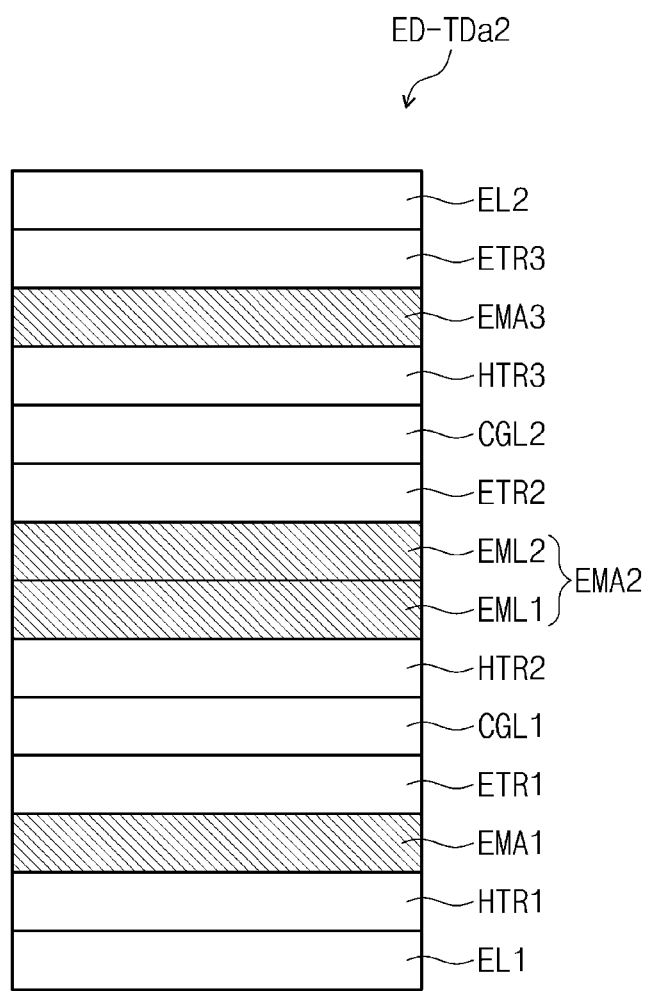
FIG. 6B is a schematic cross-sectional view illustrating a light emitting element according to an embodiment of the disclosure.
Figure 6C:
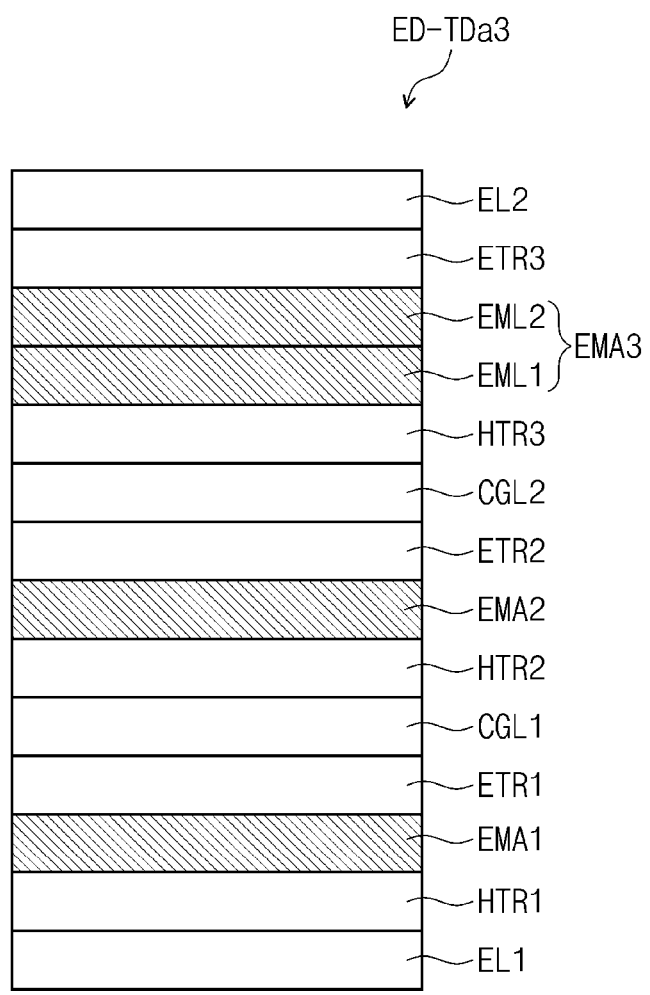
FIG. 6C is a schematic cross-sectional view illustrating a light emitting element according to an embodiment of the disclosure.

FIGS. 6A to 6C illustrate the light emitting elements ED-TDa1, ED-TDa2, and ED-TDa3 including three emission parts EMA1, EMA2, and EMA3 of which any one emission part includes two emission layers EML1 and EML2. Referring to FIG. 6A, the light emitting element ED-TDa1 may include the first electrode EL1, the first emission part EMA1, the second emission part EMA2, the third emission part EMA3, and the second electrode EL2 which are sequentially stacked. In the light emitting element ED-TDa1, the first emission part EMA1 may include two emission layers EML1 and EML2, and each of the second emission part EMA2 and the third emission part EMA3 may include one emission layer.

Each of the second emission part EMA2 and the third emission part EMA3 may include one dopant and one host. The host of the second emission part EMA2 may be the same as or different from the first host, the hole transport host, and/or the electron transport host of the first emission part EMA1. The dopant of the second emission part EMA2 may be the same as or different from the first dopant and/or the second dopant of the first emission part EMA1. The host of the second emission part EMA2 may be the same as or different from the first host, the hole transport host, and/or the electron transport host of the first emission part EMA1. The dopant of the third emission part EMA3 may be the same as or different from the first dopant and and/or second dopant of the first emission part EMA1. The host of the second emission part EMA2 may be the same as or different from the host of the third emission part EMA3. The dopant of the second emission part EMA2 may be the same as or different from the dopant of the emission part EMA3.

Referring to FIG. 6B, the second emission part EMA2 of the light emitting element ED-TDa2 may include the first emission layer EML1 and the second emission layer EML2 disposed on the first emission layer EML1. In the light emitting element ED-TDa2, each of the first emission part EMA1 and the third emission part EMA3 may include an emission layer.

Each of the first emission part EMA1 and the third emission part EMA3 may include one host and one dopant. The host of the first emission part EMA1 may be the same as or different from the first host, the hole transport host, and/or the electron transport host of the second emission part EMA2. The dopant of the first emission part EMA1 may be the same as or different from the first dopant and/or the second dopant of the second emission part EMA2. The host of the third emission part EMA3 may be the same as or different from the first host, the hole transport host, and/or the electron transport host of the second emission part EMA2. The dopant of the third emission part EMA3 may be the same as or different from the first dopant and/or the second dopant of the second emission part EMA2. The host of the first emission part EMA1 may be the same as or different from the host of the third emission part EMA3. The dopant of the first emission part EMA1 may be the same as or different from the dopant of the third emission part EMA3.

Referring to FIG. 6C, the third emission part EMA3 of the light emitting element ED-TDa3 may include the first emission layer EML1 and the second emission layer EML2 disposed on the first emission layer EML1. In the light emitting element ED-TDa3, each of the first emission part EMA1 and the second emission part EMA2 may include an emission layer.

Each of the first emission part EMA1 and the second emission part EMA2 may include one host and one dopant. The host of the first emission part EMA1 may be the same as or different from the first host, the hole transport host, and/or the electron transport host of the third emission part EMA3. The dopant of the first emission part EMA1 may be the same as or different from the first dopant and/or the second dopant of the third emission part EMA3. The host of the second emission part EMA2 may be the same as or different from the first host, the hole transport host, and/or the electron transport host of the third emission part EMA3. The dopant of the second emission part EMA2 may be the same as or different from the first dopant and/or the second dopant of the third emission part EMA3. The host of the first emission part EMA1 may be the same as or different from the host of the second emission part EMA2. The dopant of the first emission part EMA1 may be the same as or different from the dopant of the second emission part EMA2.

Referring to FIGS. 6A to 6C, a first hole transport region HTR1 may be disposed between the first electrode EL1 and the first emission part EMA1. A first electron transport region ETR1, a first charge generation layer CGL1, and a second hole transport region HTR2 may be sequentially stacked between the first emission part EMA1 and the second emission part EMA2. A second electron transport region ETR2, a second charge generation layer CGL2, and a third electron transport region ETR3 may be sequentially stacked between the second emission part EMA2 and the third emission part EMA3. The third electron transport region ETR3 may be disposed between the third emission part EMA3 and the second electrode EL2.

The first charge generation layer CGL1 and the second charge generation layer CGL2 may be disposed between the neighboring emission parts. Each of the first charge generation layer CGL1 and the second charge generation layer CGL2 may include a p-type charge generation layer and/or an n-type charge generation layer.

Figure 6D:
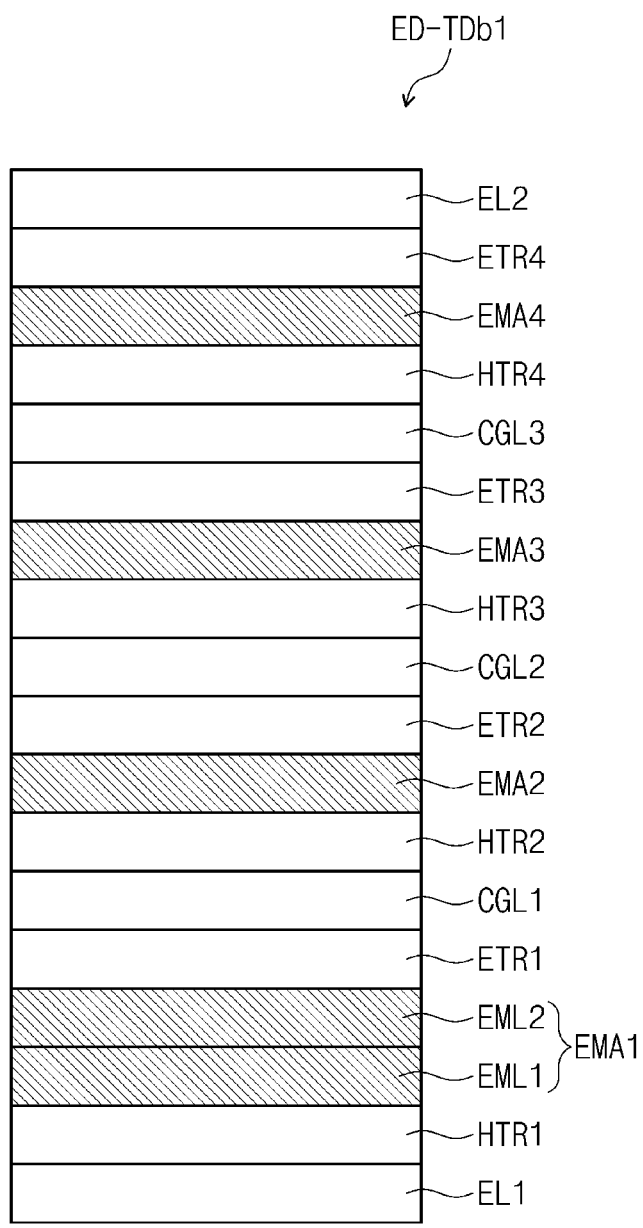
FIG. 6D is a schematic cross-sectional view illustrating a light emitting element according to an embodiment of the disclosure.
Figure 6E:
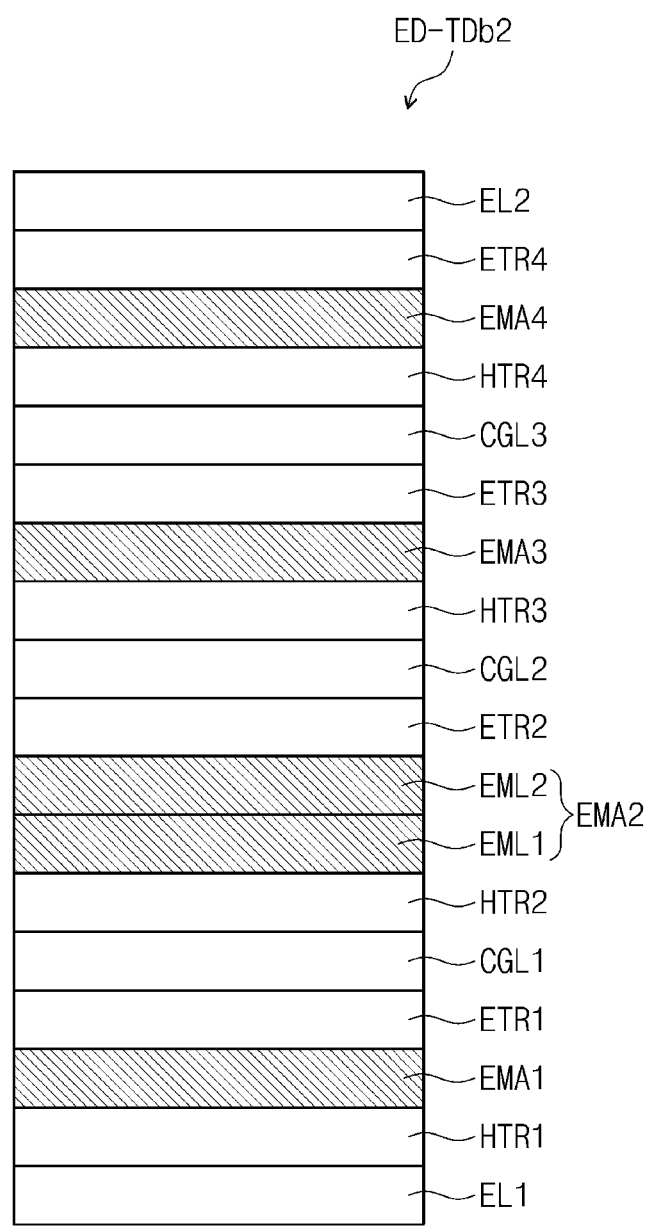
FIG. 6E is a schematic cross-sectional view illustrating a light emitting element according to an embodiment of the disclosure.
Figure 6F:
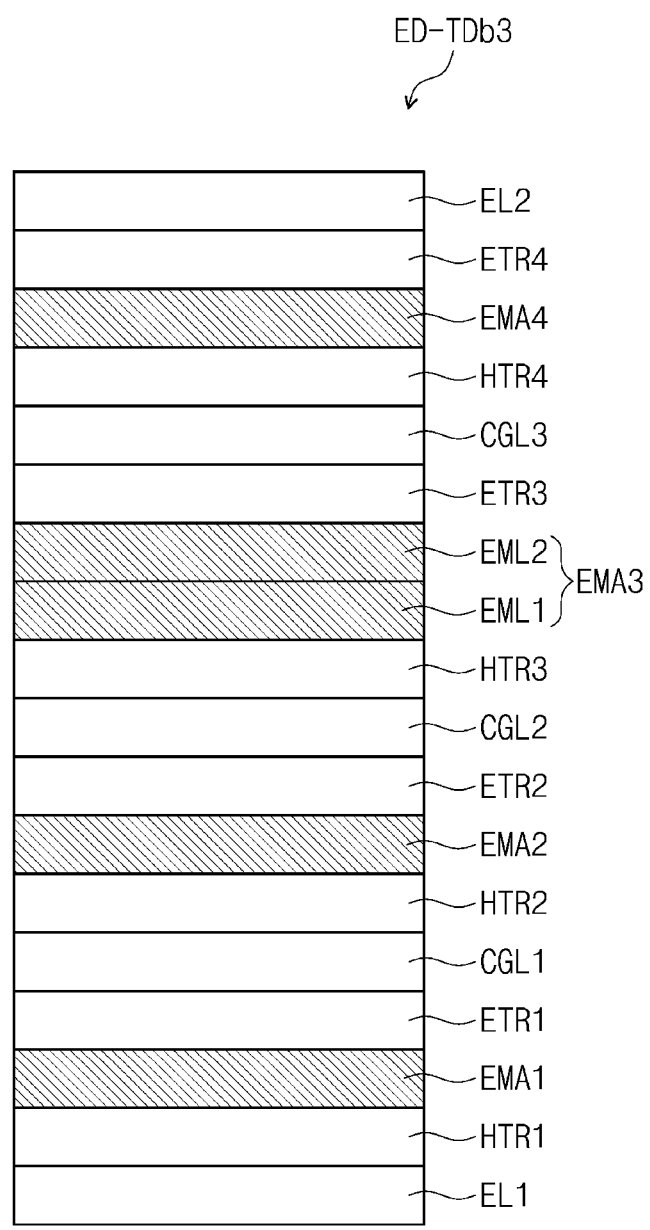
FIG. 6F is a schematic cross-sectional view illustrating a light emitting element according to an embodiment of the disclosure.

The light emitting elements ED-TDb1, ED-TDb2, and ED-TDb3 of embodiments may further include a fourth emission part EMA4 disposed on the third emission part EMA3. FIGS. 6D to 6F illustrate the light emitting elements ED-TDb1, ED-TDb2, and ED-TDb3 including four emission parts EMA1, EMA2, EMA3, and EMA4.

The fourth emission part EMA4 may include a host and a dopant different from those of the first to third emission parts EMA1, EMA2, and EMA3. Unlike this, the fourth emission part EMA4 may include the same host and dopant as at least one among the first to third emission parts EMA1, EMA2, and EMA3.

For example, the first to third emission parts EMA1, EMA2, and EMA3 may emit light having a center wavelength of about 440 nm to about 480 nm, and the fourth emission part EMA4 may emit light having a center wavelength of about 500 nm to about 650 nm. More specifically, the first to third light emission parts EMA1, EMA2, and EMA3 may emit blue light, and the fourth emission part EMA4 may emit green light. However, this is exemplary, and the color of the light emitted from the emission parts EMA1 to EMA4 is not limited thereto.

FIG. 6D illustrates that the first emission part EMA1 of the light emitting element ED-TDb1 includes the first emission layer EML1 and the second emission layer EML2, and each of the second to fourth emission parts EMA2 to EMA4 includes an emission layer. For example, the light emitting element ED-TDb1 in FIG. 6D may be the case where the light emitting element ED-TDa1 in FIG. 6A further includes a third charge generation layer CGL3, a fourth hole transport region HTR4, the fourth emission part EMA4, and a fourth electron transport region ETR4. The third charge generation layer CGL3, the fourth hole transport region HTR4, the fourth emission part EMA4, and the fourth electron transport region ETR4 may be sequentially disposed between the third electron transport region ETR3 and the second electrode EL2. The third charge generation layer CGL3 may be disposed between the neighboring emission parts. The third charge generation layer CGL3 may include the p-type charge generation layer and/or the n-type charge generation layer.

FIG. 6E illustrates that the second emission part EMA2 of the light emitting element ED-TDb2 includes the first emission layer EML1 and the second emission layer EML2. It is illustrated that each of the first emission part EMA1, the third emission part EMA3, and the fourth emission part EMA4 of the light emitting element ED-TDb2 includes an emission layer. The light emitting element ED-TDb2 in FIG. 6E may be the case where the light emitting element ED-TDa2 in FIG. 6B further includes the third charge generation layer CGL3, the fourth hole transport region HTR4, the fourth emission part EMA4, and the fourth electron transport region ETR4, which are sequentially stacked between the third electron transport region ETR3 and the second electrode EL2.

FIG. 6F illustrates that the third emission part EMA3 of the light emitting element ED-TDb3 includes the first emission layer EML1 and the second emission layer EML2. It is illustrated that each of the first emission part EMA1, the second emission part EMA2, and the fourth emission part EMA4 of the light emitting element ED-TDb3 includes an emission layer. The light emitting element ED-TDb3 in FIG. 6F may be the case where the light emitting element ED-TDa3 in FIG. 6C further includes the third charge generation layer CGL3, the fourth hole transport region HTR4, the fourth emission part EMA4, and the fourth electron transport region ETR4, which are sequentially stacked between the third electron transport region ETR3 and the second electrode EL2.

Figure 6G:
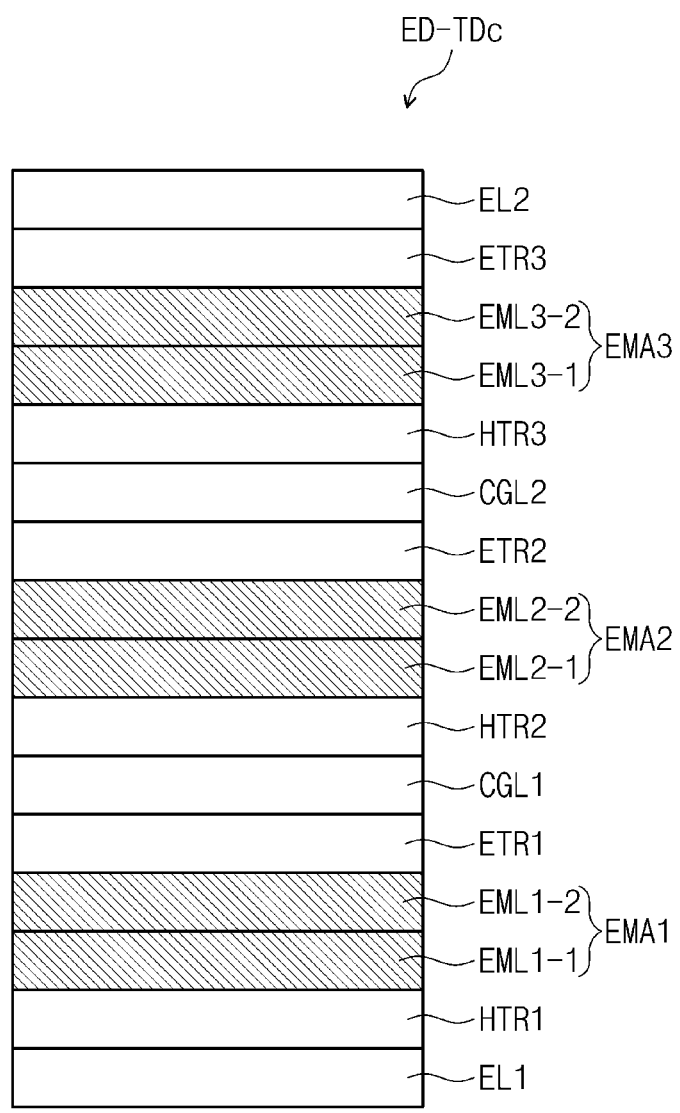
FIG. 6G is a schematic cross-sectional view illustrating a light emitting element according to an embodiment of the disclosure.
Figure 6H:
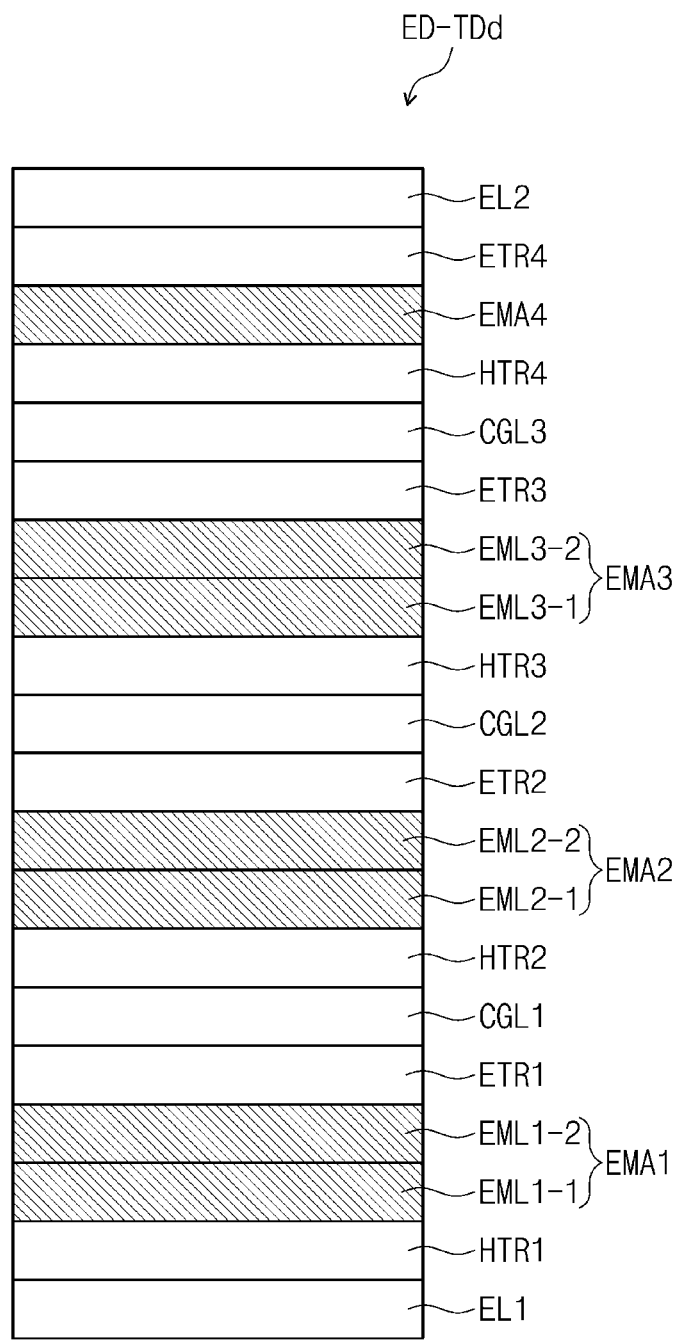
FIG. 6H is a schematic cross-sectional view illustrating a light emitting element according to an embodiment of the disclosure.

Referring to FIGS. 6G and 6H, the light emitting elements ED-TDc and ED-TDd may include the first to third emission parts EMA1, EMA2, and EMA3, and each of the first to third emission parts EMA1, EMA2, and EMA3 may include two emission layers.

The first emission part EMA1 may include a 1-1-th emission layer EML1-1 and a 1-2-th emission layer EML1-2 disposed on the 1-1-th emission layer EML1-1. The second emission part EMA2 may include a 2-1-th emission layer EML2-1 and a 2-2-th emission layer EML2-2 disposed on the 2-1-th emission layer EML2-1. The third emission part EMA3 may include a 3-1-th emission layer EML3-1 and a 3-2-th emission layer EML3-2 disposed on the 3-1-th emission layer EML3-1.

The description of the first emission layer EML1 as described above may be equally applied to the 1-1-th emission layer EML1-1 of the first emission part EMA1, the 2-1-th emission layer EML2-1 of the second emission part EMA2, and the 3-1-th emission layer EML3-1 of the third emission part EMA3. The description of the second emission layer EML2 as described above may be equally applied to the 1-2-th emission layer EML1-2 of the first emission part EMA1, the 2-2-th emission layer EML2-2 of the second emission part EMA2, and the 3-2-th emission layer EML3-2 of the third emission part EMA3.

A hole mobility of the first host in the 1-1-th emission layer EML1-1 may be about $5.0 \times 10^{-6}$ cm$^2$/Vs to about $1.0 \times 10^{-3}$ cm$^2$/Vs, and a hole mobility of a host mixture including the hole transport host and the electron transport host in the 1-2-th emission layer EML1-2 may be about $1.0 \times 10^{-6}$ cm$^{-2}$/Vs to about $1.0 \times 10^{-4}$ cm$^2$/Vs. The hole mobility in the 1-1-th emission layer EML1-1 may be larger than that in the 1-2-th emission layer EML1-2. The hole mobility in the 1-1-th emission layer EML1-1 may be about five fold or more of that in the 1-2-th emission layer EML1-2.

A hole mobility of the first host in the 2-1-th emission layer EML2-1 may be about $5.0 \times 10^{-6}$ cm$^2$/Vs to about $1.0 \times 10^{-3}$ cm$^2$/Vs, and a hole mobility of a host mixture including the hole transport host and the electron transport host in the 2-2-th emission layer EML2-2 may be about $1.0 \times 10^{-6}$ cm$^{-2}$/Vs to about $1.0 \times 10^{-4}$ cm$^2$/Vs. The hole mobility in the 2-1-th emission layer EML2-1 may be larger than that in the 2-2-th emission layer EML2-2. The hole mobility in the 2-1-th emission layer EML2-1 may be about five fold or more of that in the 2-2-th emission layer EML2-2.

A hole mobility of the first host in the 3-1-th emission layer EML3-1 may be about $5.0 \times 10^{-6}$ cm$^2$/Vs to about $1.0 \times 10^{-3}$ cm$^2$/Vs, and a hole mobility of a host mixture including the hole transport host and the electron transport host in the 3-2-th emission layer EML3-2 may be about $1.0 \times 10^{-6}$ cm$^{-2}$/Vs to about $1.0 \times 10^{-4}$ cm$^2$/Vs. The hole mobility in the 3-1-th emission layer EML3-1 may be larger than that in the 3-2-th emission layer EML3-2. The hole mobility in the 3-1-th emission layer EML3-1 may be about five fold or more of that in the 3-2-th emission layer EML3-2.

Each of the 1-1-th emission layer EML1-1, the 2-1-th emission layer EML2-1, and the 3-1-th emission layer EML3-1 may include one host and one dopant. In the 1-1-th emission layer EML1-1, the 2-1-th emission layer EML2-1, and the 3-1-th emission layer EML3-1, the hosts may be the same or at least one thereof may be different from the rest. In the 1-1-th emission layer EML1-1, the 2-1-th emission layer EML2-1, and the 3-1-th emission layer EML3-1, the dopants may be the same or at least one thereof may be different from the rest.

Each of the 1-2-th emission layer EML1-2, the 2-2-th emission layer EML2-2, and the 3-2-th emission layer EML3-2 may include two hosts and one dopant. In the 1-2-th emission layer EML1-2, the 2-2-th emission layer EML2-2, and the 3-2-th emission layer EML3-2, the dopants may be the same or at least one thereof may be different from the rest. In the 1-2-th emission layer EML1-2, the 2-2-th emission layer EML2-2, and the 3-2-th emission layer EML3-2, two hosts may be the same or at least one thereof may be different from the rest.

The hole transport host of the 1-2-th emission layer EML1-2, the hole transport host of the 2-2-th emission layer EML2-2, and the hole transport host of the 3-2-th emission layer EML3-2 may all be the same or at least one thereof may be different from the rest. The electron transport host of the 1-2-th emission layer EML1-2, the electron transport host of the 2-2-th emission layer EML2-2, and the electron transport host of the 3-2-th emission layer EML3-2 may be the same as one another or at least one thereof may be different from the rest.

Referring to FIG. 6H, the fourth emission part EMA4 may be further disposed on the third emission part EMA3. The light emitting element ED-TDd in FIG. 6H may be the case where the light emitting element ED-TDc in FIG. 6G further includes the third charge generation layer CGL3, the fourth hole transport region HTR4, the fourth emission part EMA4, and the fourth electron transport region ETR4, which are disposed between the third electron transport region ETR3 and the second electrode EL2. In the light emitting element ED-TDd, the fourth emission part EMA4 may include an emission layer, and each of the first to third emission parts EMA1, EMA2, and EMA3 may include two emission layers.

As illustrated in FIGS. 6A to 6H, the description of the hole transport region HTR as described above may be equally applied to the first hole transport region HTR1, the second hole transport region HTR2, the third hole transport region HTR3, and the fourth hole transport region HTR4. In addition, the description of the electron transport region ETR as described above may be equally applied to the first electron transport region ETR1, the second electron transport region ETR2, the third electron transport region ETR3, and the fourth electron transport region ETR4.

Figure 7:
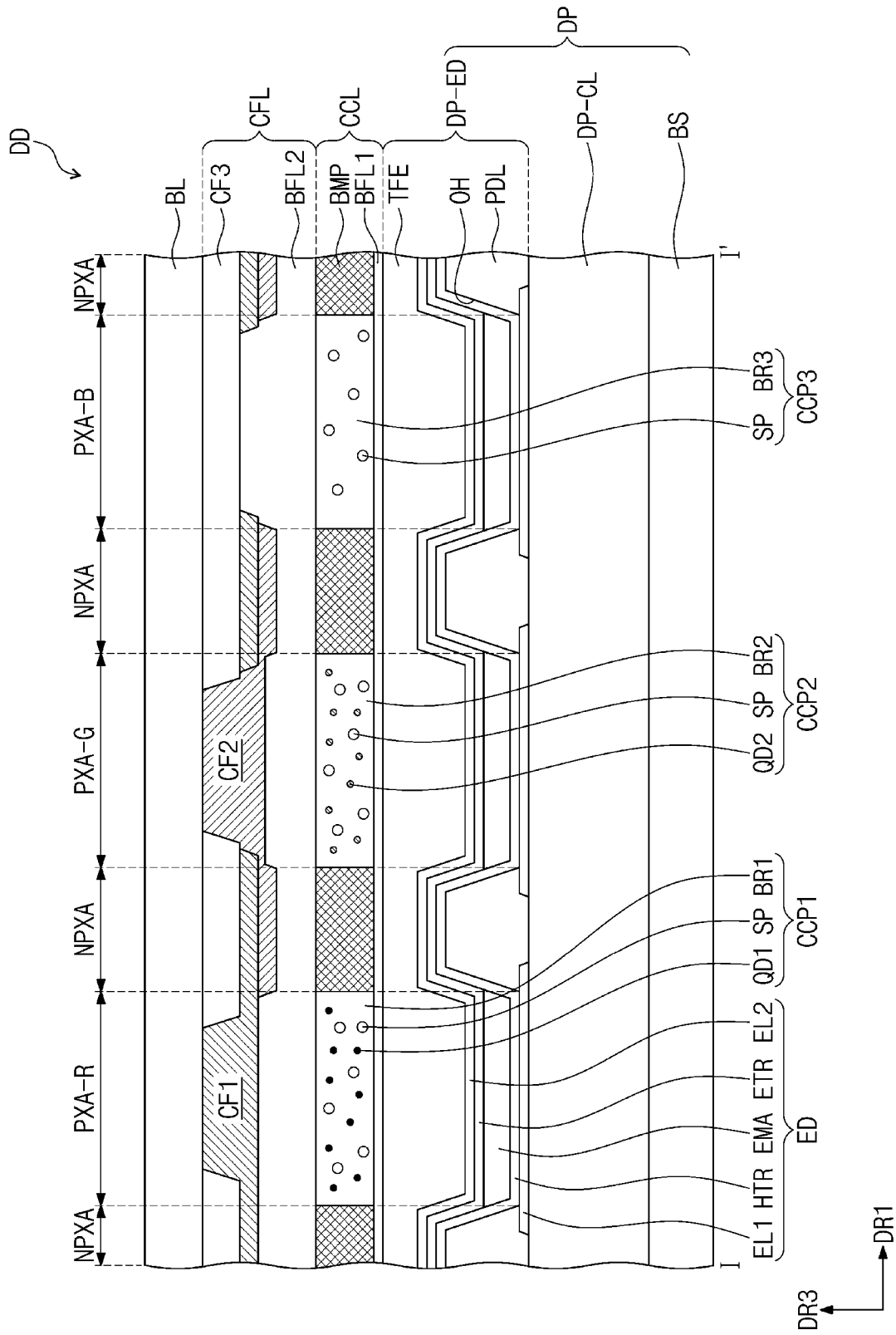
FIG. 7 is a schematic cross-sectional view illustrating a display device according to an embodiment.
Figure 8:
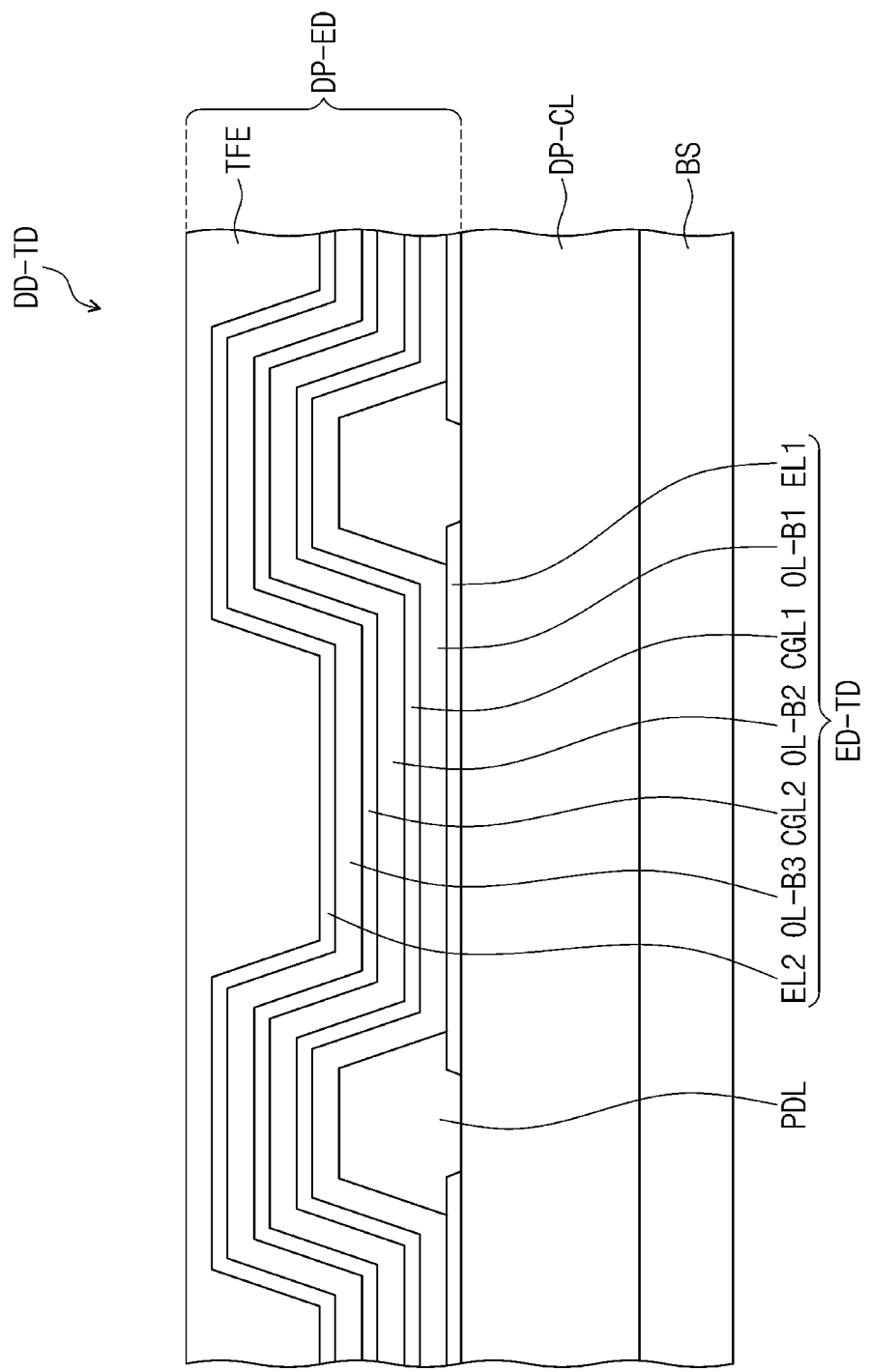
FIG. 8 is a schematic cross-sectional view illustrating a portion of a display device according to an embodiment of the disclosure.

FIGS. 7 and 8 are schematic cross-sectional views illustrating display devices according to embodiments. Hereinafter, in describing the display devices of embodiments with reference to FIGS. 7 and 8, the duplicated features which have been described in FIGS. 1 to 6H are not described again, but their differences will be mainly described.

Referring to FIG. 7, the display device DD according to an embodiment may include a display panel DP including a display element layer DP-ED, a light control layer CCL, and a color filter layer CFL disposed on the display panel DP.

In an embodiment illustrated in FIG. 7, the display panel DP may include a base layer BS, and a circuit layer DP-CL and the display element layer DP-ED provided on the base layer BS, and the display element layer DP-ED may include a light emitting element ED.

The light emitting element ED may include a first electrode EL1, a hole transport region HTR disposed on the first electrode EL1, an emission part EMA disposed on the hole transport region HTR, an electron transport region ETR disposed on the emission part EMA, and a second electrode EL2 disposed on the electron transport region ETR. The structures of the light emitting elements in FIGS. 3A to 6H as described above may be equally applied to the structure of the light emitting element ED illustrated in FIG. 7.

Referring to FIG. 7, the emission part EMA may be disposed in an opening OH defined in a pixel defining film PDL. For example, the emission layer EML which is divided by the pixel defining film PDL and provided corresponding to each light emitting regions PXA-R, PXA-G, and PXA-B may emit light in a same wavelength range. In the display device DD of an embodiment, the emission part EMA may emit blue light or white light. Unlike the configuration illustrated, in an embodiment, the emission part EMA may be provided as a common layer in the entire light emitting regions PXA-R, PXA-G, and PXA-B.

The light control layer CCL may be disposed on the display panel DP. The light control layer CCL may include a light conversion body. The light conversion body may be a quantum dot, a phosphor, or the like. The light conversion body may emit provided light by converting the wavelength thereof. For example, the light control layer CCL may a layer containing the quantum dot or a layer containing the phosphor.

The light control layer CCL may include light control parts CCP1, CCP2 and CCP3. The light control parts CCP1, CCP2, and CCP3 may be spaced apart from each other.

Referring to FIG. 7, divided patterns BMP may be disposed between the light control parts CCP1, CCP2, and CCP3 which are spaced apart from each other, but the embodiment of the disclosure is not limited thereto. FIG. 7 illustrates that the divided patterns BMP do not overlap the light control parts CCP1, CCP2, and CCP3, but at least a portion of the edges of the light control parts CCP1, CCP2, and CCP3 may overlap the divided patterns BMP.

The light control layer CCL may include a first light control part CCP1 containing a first quantum dot QD1 which converts first color light, provided from the light emitting element ED, into second color light, a second light control part CCP2 containing a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot.

The cores of the quantum dots QD1 and QD2 may be selected from among a Group II-VI compound, a Group III-VI compound, a Group compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in particles in a uniform concentration distribution, or may be present in a same particle in a partially different concentration distribution. In addition, a core-shell structure in which a quantum dot surrounds another quantum dot may also be possible. The core-shell structure may have a concentration gradient at which the concentration of elements present in the shell decreases toward the core.

In some embodiments, a quantum dot may have the above-described core-shell structure including a core containing nanocrystals and a shell surrounding the core. The shell of the quantum dot may serve as a protection layer to prevent the chemical deformation of the core so as to maintain semiconductor properties, and/or a charging layer to impart electrophoresis properties to the quantum dot. The shell may be a single layer or a multilayer. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the embodiment of the disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the disclosure is not limited thereto.

The quantum dot may have a full width at half maximum (FWHM) of a light emission wavelength spectrum of about 45 nm or less, preferably about 40 nm or less, and more preferably about 30 nm or less, and color purity or color reproducibility may be improved in the above range. In addition, light emitted through such a quantum dot is emitted in all directions, and thus a wide viewing angle may be improved.

In addition, although the form of a quantum dot is not particularly limited as long as it is a form commonly used in the art, more specifically, a quantum dot in the form of spherical, pyramidal, multi-arm, or cubic nanoparticles, nanotubes, nanowires, nanofibers, sheet-like nanoparticles, etc. may be used.

The quantum dot may control the color of emitted light according to the particle size thereof, and accordingly, the quantum dot may have various emission colors such as blue, red, and green.

In addition, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include a quantum dot but include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one among $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control part CCP1, the second light control part CCP2, and the third light control part CCP3 each may include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent the penetration of moisture and/or oxygen (hereinafter, referred to as "moisture or oxygen"). The barrier layer BFL1 may block the light control parts CCP1, CCP2 and CCP3 from being exposed to moisture or oxygen. The barrier layer BFL1 may cover the light control parts CCP1, CCP2, and CCP3. In addition, the barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed as (or formed of) a single layer or layers.

In the display device DD of an embodiment, the color filter layer CFL may be disposed on the light control layer CCL. For example, the color filter layer CFL may be directly disposed on the light control layer CCL. In this case, the barrier layer BFL2 may be omitted.

The color filter layer CFL may include filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment or dye. The first filter CF1 may include a red pigment or dye, the second filter CF2 may include a green pigment or dye, and the third filter CF3 may include a blue pigment or dye. However, the embodiment of the disclosure is not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated from each other but be provided as a filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may be a member which provides a base surface on which the color filter layer CFL, the light control layer CCL, and the like are disposed. The base substrate BL may be a glass substrate, a metal substrate, a plastic substrate, etc. However, the embodiment of the disclosure is not limited thereto, and the base substrate BL may be an inorganic layer, an organic layer, or a composite layer. In addition, unlike the configuration illustrated, in an embodiment, the base substrate BL may be omitted.

FIG. 8 is a schematic cross-sectional view illustrating a part of a display device according to an embodiment. FIG. 8 illustrates a schematic cross-sectional view of a part corresponding to the display panel DP of FIG. 7. In a display device DD-TD of an embodiment, a light emitting element ED-TD may include light emitting structures OL-B1, OL-B2, and OL-B3. The light emitting element ED-TD may include a first electrode EL1 and a second electrode EL2 which face each other, and the light emitting structures OL-B1, OL-B2, and OL-B3 sequentially stacked in a thickness direction between the first electrode EL1 and the second electrode EL2. The light emitting structures OL-B1, OL-B2, and OL-B3 each may include one or two emission layers, and a hole transport region HTR and an electron transport region ETR disposed with the emission layer located therebetween. The light emitting element ED-TD in FIG. 8 may be any one among the light emitting elements ED-TDa1 to ED-TDa3, ED-TDb1 to ED-TDb3, ED-TDc, and ED-TDd in FIGS. 6A to 6H as described above. Unlike the configuration illustrated, the light emitting element ED-TD in FIG. 8 may include three charge generation layers and at least five emission layers disposed with the charge generation layer located therebetween.

FIG. 9 is a schematic plan view of a display device DD-a according to an embodiment. Unlike FIG. 1, it is illustrated that the display device DD-a further includes a white light emitting region PXA-W. As described above, in case that the light emitting element of an embodiment emits white light, the display device DD-a may further include the white light emitting region PXA-W. However, this is exemplary, and the shape and arrangement of the light emitting regions PXA-R, PXA-G, PXA-B, and PXA-W including the white light emitting region PXA-W are not limited thereto.

Hereinafter, with reference to Examples and Comparative Examples, the light emitting element according to an embodiment of the disclosure will be described in detail. In addition, Examples described below are only illustrations to assist the understanding of the disclosure, and the scope of the disclosure is not limited thereto.

Examples

1. Manufacture and Evaluation of Light Emitting Elements

1-1) Manufacture of Light Emitting Elements

The light emitting elements of Examples 1-1 to 1-5 and Comparative Examples 1-1 to 1-8 were manufactured as follows. The light emitting elements of Examples 1-1 to 1-5 are light emitting elements according to embodiments, and the first emission layer of the emission part includes one host and one dopant, and the second emission layer of the emission part includes two hosts and one dopant. The light emitting elements of Comparative Examples 1-1 to 1-8 each include one emission layer, or two emission layers.

A first electrode having a three-layered structure containing ITO/Ag/ITO was formed on a glass substrate, washed with ultrapure water, cleansed by ultrasonic waves, irradiated with ultraviolet rays for about 30 minutes, and treated with ozone. Thereafter, HATCN was deposited to a thickness of about 50 Å, and NPB was deposited to a thickness of about 600 Å to form a hole transport region.

A dopant and a host were co-deposited at a weight ratio of 3:97 to form an emission part. On the emission part, a 50 Å-thick layer was formed of T2T, a 300 Å-thick layer was formed by co-depositing TPM-TAZ and Liq at a weight ratio of 5:5, and a 10 Å-thick layer was formed of Yb to form an electron transport region. A 100 Å-thick second electrode was formed of AgMg (containing Mg at a volume ratio of about 10%). In addition, a 700 Å-thick capping layer was formed of P4 on the second electrode EL2.

For Comparative Examples 1-1 to 1-4 and 1-8, a 50 Å-thick layer was formed of TCTA on the NPB before the emission part was formed.

(Compounds Used to Manufacture Light Emitting Elements)

HATCN

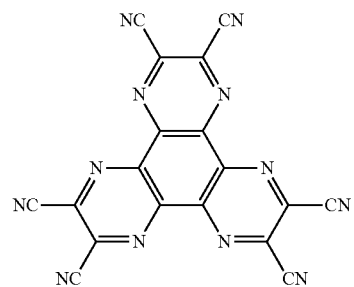

NPB

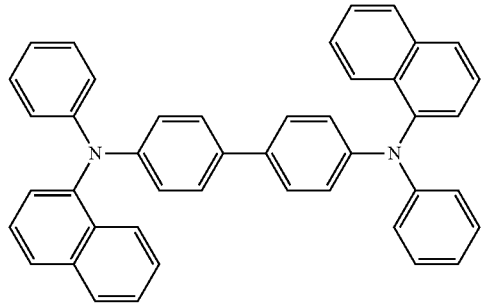

T2T

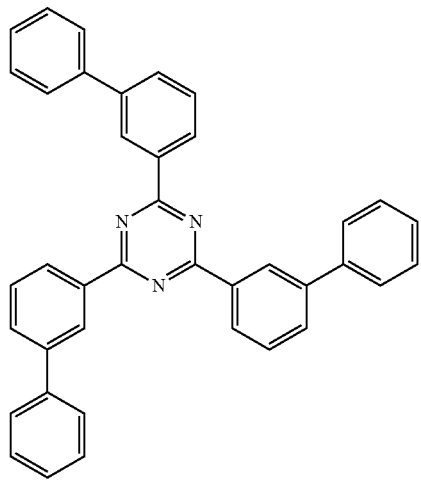

TPM-TAZ

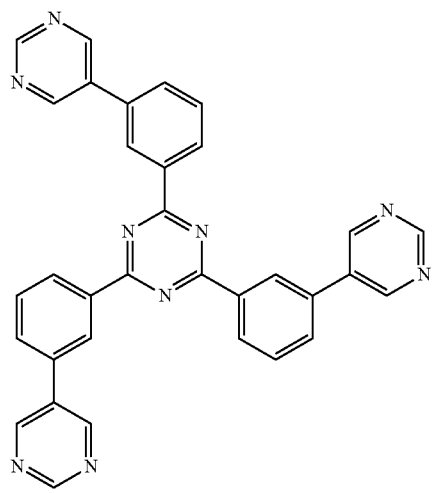

TCTA

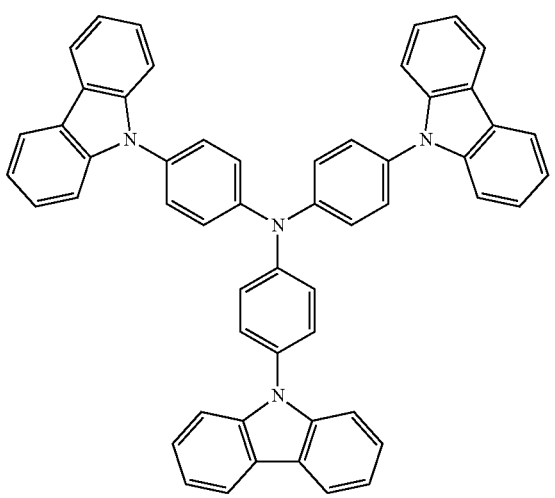

P4

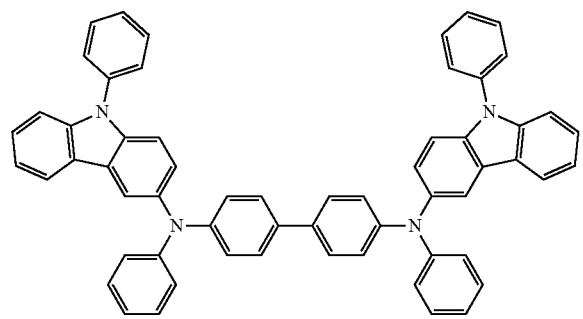

D1

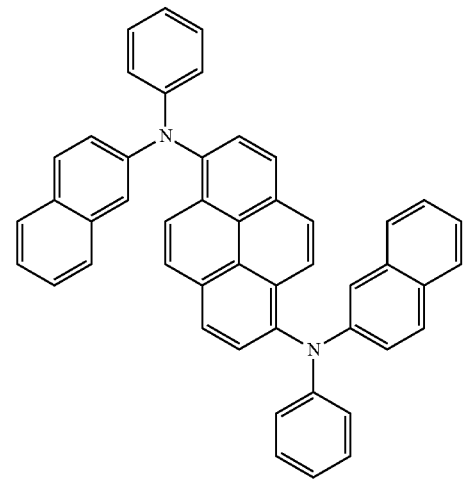

H1-1

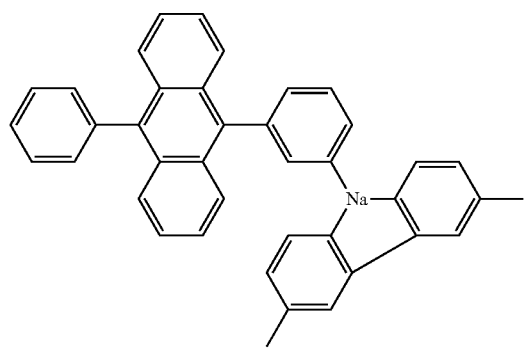

H2-5

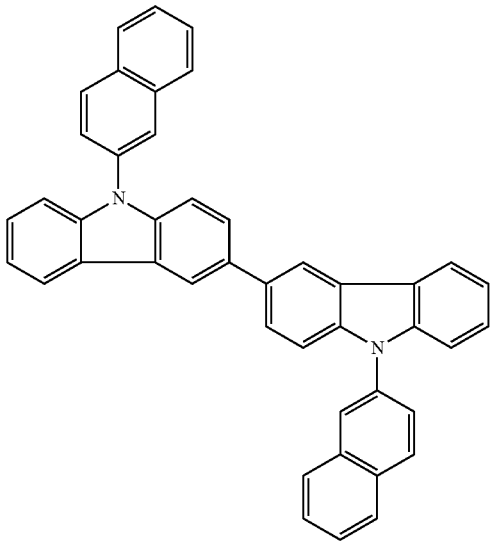

H3-1

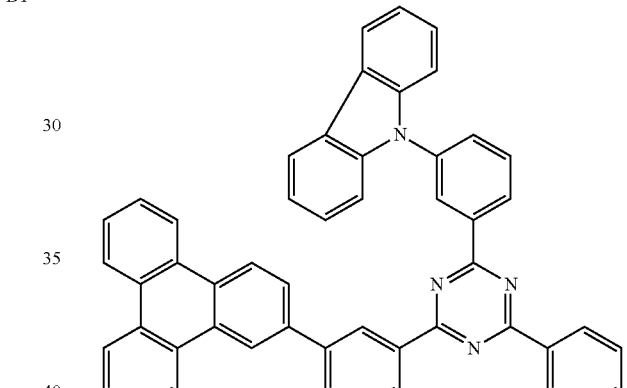

In the light emitting elements of Comparative Examples 1-1 to 1-8 and Examples 1-1 to 1-5, host materials of the emission part and the thickness of the emission part are listed in Table 1. In all the light emitting elements of Comparative Examples and Examples, D1 was used as a dopant material of the emission part. In Table 1, "N/A" means that the second emission layer is not formed.

TABLE 1

| | First emission layer | | Second emission layer | |
|---|---|---|---|---|
| Division | Host | Thickness (Å) | Host | Thickness (Å) |
| Comparative Example 1-1 | H3-1 | 180 | N/A | |
| Comparative Example 1-2 | H2-5 | 180 | N/A | |
| Comparative Example 1-3 | H1-1 | 180 | N/A | |
| Comparative Example 1-4 | H2-5, H3-1 (5:5) | 180 | N/A | |
| Comparative Example 1-5 | H1-1 | 90 | H2-5 | 90 |
| Comparative Example 1-6 | H1-1 | 90 | H3-1 | 90 |

TABLE 1-continued

| Division | First emission layer Host | First emission layer Thickness (Å) | Second emission layer Host | Second emission layer Thickness (Å) |
|---|---|---|---|---|
| Example 1-1 | H1-1 | 90 | H2-5, H3-1 (8:2) | 90 |
| Example 1-2 | H1-1 | 90 | H2-5, H3-1 (6:4) | 90 |
| Example 1-3 | H1-1 | 90 | H2-5, H3-1 (5:5) | 90 |
| Example 1-4 | H1-1 | 90 | H2-5, H3-1 (4:6) | 90 |
| Example 1-5 | H1-1 | 90 | H2-5, H3-1 (2:8) | 90 |
| Comparative Example 1-7 | H2-5, H3-1 (5:5) | 90 | H1-1 | 90 |
| Comparative Example 1-8 | H1-1, H2-5, H3-1 (1:1:1) | 180 | N/A | |

In Table 1, for the light emitting elements of Comparative Examples 1-4 and 1-7, the first emission layer was formed by providing, as hosts, H2-5 and H3-1 at a weight ratio of 5:5. For the light emitting element of Comparative Example 1-8, the first emission layer was formed by providing, as hosts, H1-1, H2-5, and H3-1 at a weight ratio of 1:1:1. For the light emitting elements of Examples 1-1 to 1-5, the second emission layer includes two hosts, H2-5, and H3-1. For the light emitting elements of Examples 1-1 to 1-5, two hosts in the second emission layer have a weight ratio of 2:8 to 8:2.

For the light emitting element of Example 1-1, the second emission layer was formed by providing, as hosts, H2-5 and H3-1 at a weight ratio of 8:2. For the light emitting element of Example 1-2, the second emission layer was formed by providing, as hosts, H2-5 and H3-1 at a weight ratio of 6:4. For the light emitting element of Example 1-3, the second emission layer was formed by providing, as hosts, H2-5 and H3-1 at a weight ratio of 5:5. For the light emitting element of Example 1-4, the second emission layer was formed by providing, as hosts, H2-5 and H3-1 at a weight ratio of 4:6. For the light emitting element of Example 1-5, the second emission layer was formed by providing, as hosts, H2-5 and H3-1 at a weight ratio of 2:8.

1-2) Evaluation of Light Emitting Elements

Driving voltages, efficiencies, and service lives of the light emitting elements of Comparative Examples 1-1 to 1-8 and Examples 1-1 to 1-5 are evaluated and listed in Table 2. The driving voltages, efficiencies, and service lives are relative values, which are represented for comparison in case that it is assumed that each of the driving voltage, efficiency, and service life of the light emitting element of Comparative Example 1-1 is 100%. In case that the driving voltages, efficiencies, and service lives of the light emitting elements were evaluated, the brightness was based on about 1,500 nit. In Table 2, the service life ($T_{97}$) represents a relative value of the time taken for the brightness to reduce to 97% of the initial brightness. In Table 2, the driving voltages and efficiencies of the light emitting elements were measured by using PR670 spectrometer from Photo Research, Inc. and 2602B SourceMeter from Keithley, Inc. The service lives of the light emitting elements were measured by using constant temperature evaluation facilities made by ENC, Inc. and Photodiode (BPW-34S) and K6500 from Keithley, Inc.

TABLE 2

| Division | Driving voltage | Efficiency | Service life ($T_{97}$) |
|---|---|---|---|
| Comparative Example 1-1 | 100% | 100% | 100% |
| Comparative Example 1-2 | 95% | 90% | 100% |
| Comparative Example 1-3 | 95% | 85% | 80% |
| Comparative Example 1-4 | 98% | 95% | 100% |
| Comparative Example 1-5 | 100% | 105% | 145% |
| Comparative Example 1-6 | 95% | 103% | 145% |
| Example 1-1 | 92% | 131% | 162% |
| Example 1-2 | 92% | 121% | 169% |
| Example 1-3 | 93% | 115% | 174% |
| Example 1-4 | 94% | 112% | 179% |
| Example 1-5 | 95% | 110% | 181% |
| Comparative Example 1-7 | 105% | 85% | 80% |
| Comparative Example 1-8 | 99% | 96% | 100% |

Referring to Table 2, it may be seen that the light emitting elements of Examples 1-1 to 1-5 have improved efficiencies and service lives compared to the light emitting elements of Comparative Examples 1-1 to 1-8. In addition, it may be seen that the light emitting elements of Examples have reduced driving voltages compared to the light emitting elements of Comparative Examples. It may be seen that the light emitting element of Comparative Example 1-7 containing two hosts in the first emission layer and one host in the second emission layer has an increase in the driving voltage and decreases in the efficiency and service life.

Each of the light emitting elements of Examples 1-1 to 1-5 includes the first emission layer and the second emission layer, and it is believed that the first emission layer contains one host and one dopant and the second emission layer contains two hosts and one dopant, and thus the efficiencies and service lives are improved. It is believed that the recombination zone of the light emitting element is formed at the interface between the first emission layer and the second emission layer, and the deterioration phenomenon in the configuration of the hole transport region, etc. adjacent to the first emission layer is prevented, and thus the efficiencies and service lives are improved. Accordingly, the light emitting element of an embodiment including the first emission layer and the second emission layer may have improved efficiency and service life.

2. Manufacture and Evaluation of Light Emitting Elements 2-1) Manufacture of Light Emitting Elements The light emitting elements of Comparative Examples 2-1 to 2-10 and Examples 2-1 to 2-5 were manufactured as follows. The light emitting elements of Comparative Examples 2-1 to 2-3 were manufactured in the same manner as the light emitting elements of Comparative Examples 1-1 to 1-3 except that a 50 Å-thick layer was not formed of TCTA on the NPB. The light emitting elements of Comparative Examples 2-4 to 2-6 were manufactured in the same manner as the light emitting elements of Comparative Examples 1-1 to 1-3. The light emitting elements of Comparative Examples 2-7 and 2-8 were manufactured in the same manner as the light emitting elements of Comparative Examples 1-5 and 1-6. The light emitting elements of Comparative Examples 2-9 and 2-10 were manufactured in the same manner as the light emitting elements of Comparative Examples 1-5 and 1-6 except that a 50 Å-thick layer was formed of TCTA on the NPB before the emission part was formed.

For the light emitting elements of Comparative Examples 2-1 to 2-10 and Examples 1-1 to 1-5, host materials of the emission part and the thickness of the emission part are listed in Table 3. In all the light emitting elements of Comparative Examples and Examples, D1 was used as a dopant material of the emission part. In Table 3, "N/A" means that the second emission layer is not formed.

TABLE 3

| | First emission layer | | Second emission layer | |
|---|---|---|---|---|
| Division | Host | Thickness (Å) | Host | Thickness (Å) |
| Comparative Example 2-1 | H3-1 | 180 | N/A | |
| Comparative Example 2-2 | H2-5 | 180 | N/A | |
| Comparative Example 2-3 | H1-1 | 180 | N/A | |
| Comparative Example 2-4 | H3-1 | 180 | N/A | |
| Comparative Example 2-5 | H2-5 | 180 | N/A | |
| Comparative Example 2-6 | H1-1 | 180 | N/A | |
| Comparative Example 2-7 | H1-1 | 90 | H2-5 | 90 |
| Comparative Example 2-8 | H1-1 | 90 | H3-1 | 90 |
| Comparative Example 2-9 | H1-1 | 90 | H2-5 | 90 |
| Comparative Example 2-10 | H1-1 | 90 | H3-1 | 90 |
| Example 2-1 | H1-1 | 90 | H2-5, H3-1 (8:2) | 90 |
| Example 2-2 | H1-1 | 90 | H2-5, H3-1 (6:4) | 90 |
| Example 2-3 | H1-1 | 90 | H2-5, H3-1 (5:5) | 90 |
| Example 2-4 | H1-1 | 90 | H2-5, H3-1 (4:6) | 90 |
| Example 2-5 | H1-1 | 90 | H2-5, H3-1 (2:8) | 90 |

In Table 3, each of the light emitting elements of Comparative Examples 2-1 to 2-6 includes the first emission layer and does not include the second emission layer. Each of the light emitting elements of Comparative Examples 2-7 to 2-10 includes the first emission layer and the second emission layer, and each of the first emission layer and the second emission layer contains one host and one dopant.

Each of the light emitting elements of Examples 2-1 to 2-5 includes the first emission layer and the second emission layer, the first emission layer contains one host and one dopant, and the second emission layer contains two hosts and one dopant. The light emitting elements of Examples 2-1 to 2-5 have the second emission layer formed by providing, as hosts, H2-5 and H3-1 at a weight ratio of 8:2, 6:4, 5:5, 4:6, or 2:8. The light emitting elements of Examples 2-1 to 2-5 have two hosts having a weight ratio of 2:8 to 8:2 in the second emission layer.

2-2) Evaluation of Light Emitting Elements

Driving voltages, efficiencies, and service lives of the light emitting elements of Comparative Examples 2-1 to 2-10 and Examples 2-1 to 2-5 are evaluated and listed in Table 4. The driving voltages, efficiencies, and service lives are relative values, which are represented for comparison in case that it is assumed that each of the driving voltage, efficiency, and service life of the light emitting element of Comparative Example 2-1 is 100%. In case that the driving voltages, efficiencies, and service lives of the light emitting elements are evaluated, the brightness is based on about 1,500 nit. In Table 4, the service life ($T_{97}$) represents a relative value of the time taken for the brightness to reduce to 97% of the initial brightness. In Table 4, the evaluation of the driving voltages, efficiencies, and service lives of the light emitting elements was conducted in the same manner as the manner in Table 2.

TABLE 4

| Division | Driving voltage | Efficiency | Service life (T97) |
|---|---|---|---|
| Comparative Example 2-1 | 100% | 100% | 100% |
| Comparative Example 2-2 | 95% | 90% | 100% |
| Comparative Example 2-3 | 95% | 85% | 80% |
| Comparative Example 2-4 | 112% | 95% | 52% |
| Comparative Example 2-5 | 115% | 72% | 48% |
| Comparative Example 2-6 | 128% | 65% | 20% |
| Comparative Example 2-7 | 100% | 105% | 145% |
| Comparative Example 2-8 | 95% | 103% | 145% |
| Comparative Example 2-9 | 98% | 108% | 145% |
| Comparative Example 2-10 | 93% | 106% | 145% |
| Example 2-1 | 92% | 132% | 160% |
| Example 2-2 | 92% | 122% | 165% |
| Example 2-3 | 93% | 115% | 170% |
| Example 2-4 | 94% | 112% | 175% |
| Example 2-5 | 95% | 111% | 182% |

Referring to Table 4, it may be seen that the light emitting elements of Examples 2-1 to 2-5 have superior efficiencies and service lives compared to the light emitting elements of Comparative Examples 2-1 to 2-10. In addition, it may be seen that the light emitting elements of Examples 2-1 to 2-5 have reduced driving voltages compared to the light emitting elements of Comparative Examples 2-1 to 2-10. It is believed that each of the light emitting elements of Examples 2-1 to 2-5 includes the first emission layer containing one host and the second emission layer containing two hosts, thereby improving efficiencies and service lives.

3. Manufacture and Evaluation of Light Emitting Elements 3-1) Manufacture of Light Emitting Elements The light emitting elements of Comparative Examples 3-1 to 3-8 and Examples 3-1 to 3-5 were manufactured as follows. The light emitting elements of Comparative Examples 3-1 to 3-8 and Examples 3-1 to 3-5 each include three emission parts. Each of the light emitting elements of Examples 3-1 to 3-5 may be a structure in which the light emitting element ED-TDc in FIG. 6G further includes a capping layer.

For the light emitting elements of Comparative Examples 3-1 to 3-4 and 3-8, each of the three emission parts includes an emission layer. For the light emitting elements of Comparative Examples 3-5 to 3-7 and the light emitting elements of Examples 3-1 to 3-5, each of the three emission parts includes two emission layers.

A first electrode having a three-layered structure containing ITO/Ag/ITO was formed on a glass substrate, washed with ultrapure water, cleansed by ultrasonic waves, irradiated with ultraviolet rays for about 30 minutes, and treated with ozone. Thereafter, HATCN was deposited to a thickness of about 50 Å, and NPB was deposited to a thickness of about 600 Å to form a first hole transport region.

A dopant and a host were co-deposited at a weight ratio of 3:97 to form a first emission part. On the first emission part, a 50 Å-thick layer was formed of T2T, and a 300 Å-thick layer was formed by co-depositing TPM-TAZ and Liq at a weight ratio of 5:5 to form a first electron transport region.

On the first electron transport region, BCP and Li were co-deposited at a weight ratio of 1:100 to form a 100 Å-thick first charge generation layer. Thereafter, HATCN was deposited to a thickness of about 50 Å, and NPB was deposited to a thickness of about 600 Å to form a second hole transport region.

On the second hole transport region, a dopant and a host were co-deposited at a weight ratio of 3:97 to form a second emission part. On the second emission part, a 50 Å-thick layer was formed of T2T, and a 300 Å-thick layer was formed by co-depositing TPM-TAZ and Liq at a weight ratio of 5:5 to form a second electron transport region.

On the second electron transport region, BCP and Li were co-deposited at a weight ratio of 1:100 to form a 100 Å-thick second charge generation layer. HATCN was deposited to a thickness of about 50 Å, and NPB was deposited to a thickness of about 600 Å to form a third hole transport region.

A dopant and a host were co-deposited at a weight ratio of 3:97 to form a third emission part. On the third emission part, a 50 Å-thick layer was formed of T2T, a 300 Å-thick layer was formed by co-depositing TPM-TAZ and Liq at a weight ratio of 5:5, and Yb was deposited to a thickness of about 10 Å to form a third electron transport region. A 100 Å-thick second electrode was formed of AgMg (containing Mg at a volume ratio of about 10%). In addition, a 700 Å-thick capping layer was formed of P4 on the second electrode EL2.

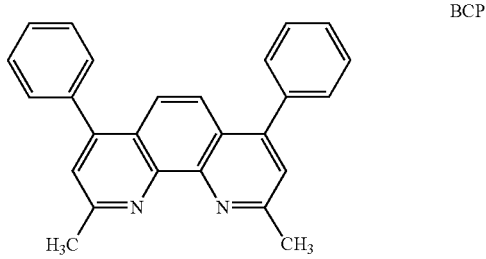 [SMILES: Cc1cc(-c2ccccc2)c2ccc3c(-c4ccccc4)cc(C)nc3c2n1]

BCP

In Examples 3-1 to 3-4 and 3-8, a 50 Å-thick layer was formed of TCTA on the NPB before the first emission part was formed, a 50 Å-thick layer was formed of TCTA on the NPB before the second emission part was formed, and a 50 Å-thick layer was formed of TCTA on the NPB before the third emission part was formed.

For each of the light emitting elements of Comparative Examples 3-1 to 3-8 and Examples 3-1 to 3-5, the first emission part to the third emission part were all formed equally. For example, for the light emitting element of Example 3-1, the first emission part, the second emission part, and the third emission part were all formed equally.

For the light emitting elements of Comparative Examples 3-1 to 3-8 and Examples 3-1 to 3-5, host materials of the emission part and the thickness of the emission part are listed in Table 5. In the light emitting elements of Comparative Examples 3-1 to 3-8 and the light emitting elements of Examples 3-1 to 3-5, D1 was used as a dopant material of the emission part. In Table 5, "N/A" means that the second emission layer is not formed.

TABLE 5

| | First emission layer | | Second emission layer | |
|---|---|---|---|---|
| Division | Host | Thickness (Å) | Host | Thickness (Å) |
| Comparative Example 3-1 | H3-1 | 180 | N/A | |
| Comparative Example 3-2 | H2-5 | 180 | N/A | |
| Comparative Example 3-3 | H1-1 | 180 | N/A | |
| Comparative Example 3-4 | H2-5, H3-1 (5:5) | 180 | N/A | |
| Comparative Example 3-5 | H1-1 | 90 | H2-5 | 90 |
| Comparative Example 3-6 | H1-1 | 90 | H3-1 | 90 |
| Example 3-1 | H1-1 | 90 | H2-5, H3-1 (8:2) | 90 |
| Example 3-2 | H1-1 | 90 | H2-5, H3-1 (6:4) | 90 |
| Example 3-3 | H1-1 | 90 | H2-5, H3-1 (5:5) | 90 |
| Example 3-4 | H1-1 | 90 | H2-5, H3-1 (4:6) | 90 |
| Example 3-5 | H1-1 | 90 | H2-5, H3-1 (2:8) | 90 |
| Comparative Example 3-7 | H2-5, H3-1 (5:5) | 90 | H1-1 | 90 |
| Comparative Example 3-8 | H1-1, H2-5, H3-1 (1:1:1) | 180 | N/A | |

Referring to Table 5, for each of the light emitting elements of Comparative Examples 3-1 to 3-4 and 3-8, the first to third emission parts each include an emission layer, and the host and dopant in the first to third emission parts are the same. For each of the light emitting elements of Comparative Examples 3-5 to 3-7 and Examples 3-1 to 3-5, the first to third emission parts include two emission layers, the first emission layer of each of the first to third emission parts have the same host and dopant, and the second emission layer of each of the first to third emission parts have the same host and dopant.

For the light emitting element of Comparative Example 3-4, the first emission layer of each of the first to third emission parts was formed by providing, as hosts, H2-5 and H3-1 at a weight ratio of 5:5, and the second emission layer was not formed. For the light emitting element of Comparative Example 3-7, the first emission layer of each of the first to third emission parts was formed by providing, as hosts, H2-5 and H3-1 at a weight ratio of 5:5, and the second emission layer of each of the first to third emission parts was formed by providing H1-1 as a host. For the light emitting element of Comparative Example 3-8, the first emission layer of each of the first to third emission parts was formed by providing, as hosts, H1-1, H2-5, and H3-1 at a weight ratio of 1:1:1, and the second emission layer was not formed.

For the light emitting elements of Examples 3-1 to 3-5, the first emission layer of each of the first to third emission parts was formed by providing H1-1 as a host, and the second emission layer of each of the first to third emission parts was formed by providing, as hosts, H2-5 and H3-1 at a weight ratio of 8:2, 6:4, 5:5, 4:6, or 2:8. For the light emitting elements of Examples 3-1 to 3-5, two hosts in the second emission layer of each of the first to third emission parts have a weight ratio of 2:8 to 8:2.

3-2) Evaluation of Light Emitting Elements

Driving voltages, efficiencies, and service lives of the light emitting elements of Comparative Examples 3-1 to 3-8 and Examples 3-1 to 3-5 are evaluated and listed in Table 6. The driving voltages, efficiencies, and service lives are relative values, which are represented for comparison in case that it is assumed that each of the driving voltage, efficiency, and service life of the light emitting element of Comparative Example 3-1 is 100%. In case that the driving voltages, efficiencies, and service lives of the light emitting elements of Comparative Examples 3-1 to 3-8 and Examples 3-1 to 3-5 were evaluated, the brightness was based on about 4,500 nit. In Table 6, the service life ($T_{97}$) represents a relative value of the time taken for the brightness to reduce to 97% of the initial brightness. In Table 6, the evaluation of the driving voltages, efficiencies, and service lives of the light emitting elements was conducted in the same manner as the manner in Table 2.

TABLE 6

| Division | Driving voltage | Efficiency | Service life (T97) |
|---|---|---|---|
| Comparative Example 3-1 | 100% | 100% | 100% |
| Comparative Example 3-2 | 95% | 90% | 98% |
| Comparative Example 3-3 | 96% | 84% | 81% |
| Comparative Example 3-4 | 99% | 96% | 100% |
| Comparative Example 3-5 | 100% | 104% | 148% |
| Comparative Example 3-6 | 96% | 102% | 145% |
| Example 3-1 | 91% | 128% | 158% |
| Example 3-2 | 92% | 123% | 168% |
| Example 3-3 | 93% | 117% | 173% |
| Example 3-4 | 95% | 113% | 182% |
| Example 3-5 | 95% | 110% | 185% |
| Comparative Example 3-7 | 106% | 83% | 82% |
| Comparative Example 3-8 | 100% | 97% | 101% |

Referring to Table 6, it may be seen that the light emitting elements of Examples 3-1 to 3-5 have improved efficiencies and service lives compared to the light emitting elements of Comparative Examples 3-1 to 3-8. In addition, it may be seen that the light emitting elements of Examples 3-1 to 3-5 have reduced driving voltages compared to the light emitting elements of Comparative Examples 3-1 to 3-8.

The light emitting element of Comparative Example 3-7 includes three emission parts, and each of the three emission parts includes the first emission layer and the second emission layer. It is believed that for the light emitting element of Comparative Example 3-7, the first emission layer contains two hosts and the second emission layer contains one host, thereby reducing the efficiency and service life and increasing the driving voltage.

The light emitting elements of Examples 3-1 to 3-5 include three emission parts, each of the three emission parts includes two emission layers, the first emission layer contains one host, and the second emission layer contains two hosts. Accordingly, it is believed that the light emitting elements of Examples 3-1 to 3-5 have improved efficiencies and service lives.

4. Manufacture and Evaluation of Light Emitting Elements 4-1) Manufacture of Light Emitting Elements The light emitting elements of Comparative Examples 4-1 to 4-8 and Examples 4-1 to 4-5 were manufactured as follows. The light emitting elements of Comparative Examples 4-1 to 4-8 and Examples 4-1 to 4-5 each include four emission parts. Each of the light emitting elements of Examples 4-1 to 4-5 may be a structure in which the light emitting element ED-TDd in FIG. 6H further includes a capping layer.

For the light emitting elements of Comparative Examples 4-1 to 4-4 and 4-8, each of the four emission parts includes an emission layer. For the light emitting elements of Comparative Examples 4-5 to 4-7 and Examples 4-1 to 4-5, each of the first to third emission parts includes two emission layers, and the fourth emission part includes an emission layer.

A first electrode having a three-layered structure containing ITO/Ag/ITO was formed on a glass substrate, washed with ultrapure water, cleansed by ultrasonic waves, irradiated with ultraviolet rays for about 30 minutes, and treated with ozone. Thereafter, HATCN was deposited to a thickness of about 50 Å, and NPB was deposited to a thickness of about 600 Å to form a first hole transport region.

A dopant and a host were co-deposited at a weight ratio of 3:97 to form a first emission part. On the first emission part, a 50 Å-thick layer was formed of T2T, and a 200 Å-thick layer was formed by co-depositing TPM-TAZ and Liq at a weight ratio of 5:5 to form a first electron transport region.

On the first electron transport region, BCP and Li were co-deposited at a weight ratio of 1:100 to form a 100 Å-thick first charge generation layer. Thereafter, HATCN was deposited to a thickness of about 50 Å, and NPB was deposited to a thickness of about 600 Å to form a second hole transport region.

On the second hole transport region, a dopant and a host were co-deposited at a weight ratio of 3:97 to form a second emission part. On the second emission part, a 50 Å-thick layer was formed of T2T, and a 200 Å-thick layer was formed by co-depositing TPM-TAZ and Liq at a weight ratio of 5:5 to form a second electron transport region.

On the second electron transport region, BCP and Li were co-deposited at a weight ratio of 1:100 to form a 100 Å-thick second charge generation layer. HATCN was deposited to a thickness of about 50 Å, and NPB was deposited to a thickness of about 600 Å to form a third hole transport region.

A dopant and a host were co-deposited at a weight ratio of 3:97 to form a third emission part. On the third emission part, a 50 Å-thick layer was formed of T2T, and a 200 Å-thick layer was formed by co-depositing TPM-TAZ and Liq at a weight ratio of 5:5 to form a third electron transport region.

On the third electron transport region, BCP and Li were co-deposited at a weight ratio of 1:100 to form a 100 Å-thick third charge generation layer. Thereafter, HATCN was deposited to a thickness of about 50 Å, NPB was deposited to a thickness of about 600 Å, and TCTA was deposited to a thickness of about 50 Å to form a fourth hole transport region.

Irppy3 and TPBi were co-deposited at a weight ratio of 3:97 to form a fourth emission part. On the fourth emission part, a 200 Å-thick layer was formed by co-depositing TPM-TAZ and Liq at a weight ratio of 5:5, and Yb was deposited to a thickness of about 10 Å to form a fourth electron transport region. A 100 Å-thick second electrode was formed of AgMg (containing Mg at a volume ratio of about 10%). In addition, a 700 Å-thick capping layer was formed of P4 on the second electrode EL2.

For Comparative Examples 4-1 to 4-4 and 4-8, a 50 Å-thick layer was formed of TCTA on the NPB before the first emission part to third emission part were formed. For each of the light emitting elements of Comparative Examples 4-1 to 4-8 and Examples 4-1 to 4-5, the first emission part to the third emission part were all formed equally. For example, for the light emitting element of Example 4-1, the first emission part to the third emission part were formed equally.

For the light emitting elements of Comparative Examples 4-1 to 4-8 and Examples 4-1 to 4-5, host materials of the first to third emission parts and the thickness of the emission part are listed in Table 7. In the light emitting elements of Comparative Examples 4-1 to 4-8 and Examples 4-1 to 4-5, D1 was used as a dopant material of the emission part. In Table 7, "N/A" means that the second emission layer is not formed.

TABLE 7

| Division | First emission layer | | Second emission layer | |
|---|---|---|---|---|
| | Host | Thickness (Å) | Host | Thickness (Å) |
| Comparative Example 4-1 | H3-1 | 180 | N/A | |
| Comparative Example 4-2 | H2-5 | 180 | N/A | |
| Comparative Example 4-3 | H1-1 | 180 | N/A | |
| Comparative Example 4-4 | H2-5, H3-1 (5:5) | 180 | N/A | |
| Comparative Example 4-5 | H1-1 | 90 | H2-5 | 90 |
| Comparative Example 4-6 | H1-1 | 90 | H3-1 | 90 |
| Example 4-1 | H1-1 | 90 | H2-5, H3-1 (8:2) | 90 |
| Example 4-2 | H1-1 | 90 | H2-5, H3-1 (6:4) | 90 |
| Example 4-3 | H1-1 | 90 | H2-5, H3-1 (5:5) | 90 |
| Example 4-4 | H1-1 | 90 | H2-5, H3-1 (4:6) | 90 |
| Example 4-5 | H1-1 | 90 | H2-5, H3-1 (2:8) | 90 |
| Comparative Example 4-7 | H2-5, H3-1 (5:5) | 90 | H1-1 | 90 |
| Comparative Example 4-8 | H1-1, H2-5, H3-1 (1:1:1) | 180 | N/A | |

In Table 7, for each of the light emitting elements of Comparative Examples 4-1 to 4-4 and 4-8, the first to third emission parts each include an emission layer, and the host and dopant in the first to third emission parts are the same. For each of the light emitting elements of Comparative Examples 4-5 to 4-7 and Examples 4-1 to 4-5, each of the first to third emission parts includes two emission layers, the first emission layer of each of the first to third emission parts have the same host and dopant, and the second emission layer of each of the first to third emission parts have the same host and dopant.

For the light emitting element of Comparative Example 4-4, the first emission layer of each of the first to third emission parts was formed by providing, as hosts, H2-5 and H3-1 at a weight ratio of 5:5, and the second emission layer was not formed. For the light emitting element of Comparative Example 4-7, the first emission layer of each of the first to third emission parts was formed by providing, as hosts, H2-5 and H3-1 at a weight ratio of 5:5, and the second emission layer of each of the first to third emission parts was formed by providing H1-1 as a host. For the light emitting element of Comparative Example 4-8, the first emission layer of each of the first to third emission parts was formed by providing, as hosts, H1-1, H2-5, and H3-1 at a weight ratio of 1:1:1, and the second emission layer was not formed.

For the light emitting elements of Examples 4-1 to 4-5, the first emission layer of each of the first to third emission parts was formed by providing H1-1 as a host, and the second emission layer of each of the first to third emission parts was formed by providing, as hosts, H2-5 and H3-1 at a weight ratio of 8:2, 6:4, 5:5, 4:6, or 2:8. For the light emitting elements of Examples 4-1 to 4-5, two hosts in the second emission layer of each of the first to third emission parts have a weight ratio of 2:8 to 8:2.

4-2) Evaluation of Light Emitting Elements

Driving voltages, efficiencies, and service lives of the light emitting elements of Comparative Examples 4-1 to 4-8 and Examples 4-1 to 4-5 are evaluated and listed in Table 8. The driving voltages, efficiencies, and service lives are relative values, which are represented for comparison in case that it is assumed that each of the driving voltage, efficiency, and service life of the light emitting element of Comparative Example 4-1 is 100%. In case that the driving voltages, efficiencies, and service lives of the light emitting elements of Comparative Examples 4-1 to 4-8 and Examples 4-1 to 4-5 were evaluated, the brightness was based on about 20,000 nit. In Table 8, the service life ($T_{97}$) represents a relative value of the time taken for the brightness to reduce to 97% of the initial brightness. In Table 8, the evaluation of the driving voltages, efficiencies, and service lives of the light emitting elements was conducted in the same manner as the manner in Table 2.

TABLE 8

| Division | Driving voltage | Efficiency | Service life (T97) |
|---|---|---|---|
| Comparative Example 4-1 | 100% | 100% | 100% |
| Comparative Example 4-2 | 95% | 93% | 100% |
| Comparative Example 4-3 | 97% | 86% | 84% |
| Comparative Example 4-4 | 98% | 96% | 99% |
| Comparative Example 4-5 | 101% | 107% | 143% |
| Comparative Example 4-6 | 95% | 105% | 140% |
| Example 4-1 | 92% | 138% | 159% |
| Example 4-2 | 92% | 126% | 165% |
| Example 4-3 | 94% | 121% | 178% |
| Example 4-4 | 95% | 112% | 189% |
| Example 4-5 | 95% | 111% | 190% |
| Comparative Example 4-7 | 104% | 86% | 85% |
| Comparative Example 4-8 | 100% | 98% | 102% |

Referring to Table 8, it may be seen that the light emitting elements of Examples 4-1 to 4-5 have improved efficiencies and service lives compared to the light emitting elements of Comparative Examples 4-1 to 4-8. In addition, it may be seen that the light emitting elements of Examples 4-1 to 4-5 have reduced driving voltages compared to the light emitting elements of Comparative Examples 4-1 to 4-8.

The light emitting elements of Examples 4-1 to 4-5 include four emission parts, each of the first to third emission parts includes two emission layers, the first emission layer contains one host, and the second emission layer contains two hosts. Accordingly, it is believed that the light emitting elements of Examples 4-1 to 4-5 have improved efficiencies and service lives.

5. Manufacture and Evaluation of Light Emitting Elements 5-1) Manufacture of Light Emitting Elements The light emitting elements of Comparative Examples 5-1 to 5-6 and Examples 5-1 to 5-5 were manufactured as follows. The light emitting elements of Comparative Examples 5-1 to 5-6 and Examples 5-1 to 5-5 each include four emission parts. Each of the light emitting elements of Examples 5-1 to 5-5 may be a structure in which the light emitting element ED-TDb1 in FIG. 6D further includes a capping layer.

The light emitting elements of Comparative Examples 5-1 to 5-4 were manufactured in the same manner as the light emitting elements of Comparative Examples 4-1 to 4-4. The light emitting elements of Comparative Examples 5-5 and 5-6 were manufactured in the same manner as the light emitting elements of Comparative Examples 4-5 and 4-6 except that only an emission layer was formed in case that the second emission part and the third emission part were formed. The light emitting elements of Examples 5-1 to 5-5 were manufactured in the same manner as the light emitting elements of Examples 4-1 to 4-5 except that only an emission layer was formed in case that the second emission part and the third emission part were formed.

For the light emitting elements of Comparative Examples 5-1 to 5-6 and Examples 5-1 to 5-5, the second emission part and the third emission part each include only an emission layer, and the emission layer contains H3-1 as a host and D1 as a dopant. For the light emitting elements of Comparative Examples 5-1 to 5-6 and Examples 5-1 to 5-5, host materials of the first emission part and the thickness of the emission part are listed in Table 9. In all the light emitting elements of Comparative Examples and Examples, D1 was used as a dopant material of the first to third emission parts. In Table 9, "N/A" means that the second emission layer is not formed.

TABLE 9

| Division | First emission layer | | Second emission layer | |
|---|---|---|---|---|
| | Host | Thickness (Å) | Host | Thickness (Å) |
| Comparative Example 5-1 | H3-1 | 180 | | N/A |
| Comparative Example 5-2 | H2-5 | 180 | | N/A |
| Comparative Example 5-3 | H1-1 | 180 | | N/A |
| Comparative Example 5-4 | H2-5, H3-1 (5:5) | 180 | | N/A |
| Comparative Example 5-5 | H1-1 | 90 | H2-5 | 90 |
| Comparative Example 5-6 | H1-1 | 90 | H3-1 | 90 |
| Example 5-1 | H1-1 | 90 | H2-5, H3-1 (8:2) | 90 |
| Example 5-2 | H1-1 | 90 | H2-5, H3-1 (6:4) | 90 |
| Example 5-3 | H1-1 | 90 | H2-5, H3-1 (5:5) | 90 |
| Example 5-4 | H1-1 | 90 | H2-5, H3-1 (4:6) | 90 |
| Example 5-5 | H1-1 | 90 | H2-5, H3-1 (2:8) | 90 |

Referring to Table 9, for the light emitting elements of Comparative Examples 5-1 to 5-4, each of the first to third emission parts include an emission layer. For the light emitting elements of Comparative Examples 5-5 and 5-6 and Examples 5-1 to 5-5, the first emission part includes the first emission layer and the second emission layer, and each of the second emission part and the third emission part includes an emission layer.

For each of the light emitting elements of Examples 5-1 to 5-5, the first emission part includes the first emission layer and the second emission layer, the first emission layer contains one host and one dopant, and the second emission layer contains two hosts and one dopant. For the light emitting elements of Examples 5-1 to 5-5, the second emission layer of the first emission part was formed by providing, as hosts, H2-5 and H3-1 at a weight ratio of 8:2, 6:4, 5:5, 4:6, or 2:8. For the light emitting elements of Examples 5-1 to 5-5, two hosts in the second emission layer have a weight ratio of 2:8 to 8:2.

5-2) Evaluation of Light Emitting Elements

Driving voltages, efficiencies, and service lives of the light emitting elements of Comparative Examples 5-1 to 5-6 and Examples 5-1 to 5-5 are evaluated and listed in Table 10. The driving voltages, efficiencies, and service lives are relative values, which are represented for comparison in case that it is assumed that each of the driving voltage, efficiency, and service life of the light emitting element of Comparative Example 5-1 is 100%. In case that the driving voltages, efficiencies, and service lives of the light emitting elements were evaluated, the brightness was based on about 20,000 nit. In Table 10, the service life ($T_{97}$) represents a relative value of the time taken for the brightness to reduce to 97% of the initial brightness. In Table 10, the evaluation of the driving voltages, efficiencies, and service lives of the light emitting elements was conducted in the same manner as the manner in Table 2.

TABLE 10

| Division | Driving voltage | Efficiency | Service life (T97) |
|---|---|---|---|
| Comparative Example 5-1 | 100% | 100% | 100% |
| Comparative Example 5-2 | 95% | 93% | 100% |
| Comparative Example 5-3 | 97% | 86% | 84% |
| Comparative Example 5-4 | 98% | 96% | 99% |
| Comparative Example 5-5 | 101% | 101% | 113% |
| Comparative Example 5-6 | 97% | 103% | 112% |
| Example 5-1 | 95% | 112% | 121% |
| Example 5-2 | 95% | 110% | 131% |
| Example 5-3 | 95% | 108% | 137% |
| Example 5-4 | 96% | 105% | 142% |
| Example 5-5 | 97% | 104% | 146% |

Referring to Table 10, it may be seen that the light emitting elements of Examples 5-1 to 5-5 have superior efficiencies and service lives compared to the light emitting elements of Comparative Examples 5-1 to 5-6. In addition, it may be seen that the light emitting elements of Examples 5-1 to 5-5 have reduced driving voltages compared to the light emitting elements of Comparative Examples 5-1 to 5-6. For the light emitting elements of Comparative Examples 5-5 and 5-6, the first emission part includes two emission layers, and each of the two emission layers contains one host and one dopant. It may be seen that the light emitting element of Comparative Example 5-5 has an increase in the driving voltage.

The light emitting elements of Examples 5-1 to 5-5 include four emission parts, the first emission part includes two emission layers, the first emission layer contains one host, and the second emission layer contains two hosts. Accordingly, it is believed that the light emitting elements of Examples 5-1 to 5-5 have improved efficiencies and service lives.

6. Manufacture and Evaluation of Light Emitting Elements 6-1) Manufacture of Light Emitting Elements The light emitting elements of Comparative Examples 6-1 to 6-6 and Examples 6-1 to 6-5 were manufactured as follows. The light emitting elements of Comparative Examples 6-1 to 6-6 and Examples 6-1 to 6-5 each include four emission parts. Each of the light emitting elements of Examples 6-1 to 6-5 may be a structure in which the light emitting element ED-TDb2 in FIG. 6E further includes a capping layer.

The light emitting elements of Comparative Examples 6-1 to 6-4 were manufactured in the same manner as the light emitting elements of Comparative Examples 4-1 to 4-4. The light emitting elements of Comparative Examples 6-5 and 6-6 were manufactured in the same manner as the light emitting elements of Comparative Examples 4-5 and 4-6 except that only an emission layer was formed in case that the first emission part and the third emission part were formed. The light emitting elements of Examples 6-1 to 6-5 were manufactured in the same manner as the light emitting elements of Examples 4-1 to 4-5 except that only an emission layer was formed in case that the first emission part and the third emission part were formed.

For the light emitting elements of Comparative Examples 6-1 to 6-6 and Examples 6-1 to 6-5, the first emission part and the third emission part each include only an emission layer, and the emission layer contains H3-1 as a host compound and D1 as a dopant. For the light emitting elements of Comparative Examples 6-1 to 6-6 and Examples 6-1 to 6-5, host materials of the second emission part and the thickness of the emission part are listed in Table 11. In all the light emitting elements of Comparative Examples and Examples, D1 was used as a dopant material of the first to third emission parts. In Table 11, "N/A" means that the second emission layer is not formed.

TABLE 11

| Division | First emission layer Host | Thickness (Å) | Second emission layer Host | Thickness (Å) |
|---|---|---|---|---|
| Comparative Example 6-1 | H3-1 | 180 | N/A | |
| Comparative Example 6-2 | H2-5 | 180 | N/A | |
| Comparative Example 6-3 | H1-1 | 180 | N/A | |
| Comparative Example 6-4 | H2-5, H3-1 (5:5) | 180 | N/A | |
| Comparative Example 6-5 | H1-1 | 90 | H2-5 | 90 |
| Comparative Example 6-6 | H1-1 | 90 | H3-1 | 90 |
| Example 6-1 | H1-1 | 90 | H2-5, H3-1 (8:2) | 90 |
| Example 6-2 | H1-1 | 90 | H2-5, H3-1 (6:4) | 90 |
| Example 6-3 | H1-1 | 90 | H2-5, H3-1 (5:5) | 90 |
| Example 6-4 | H1-1 | 90 | H2-5, H3-1 (4:6) | 90 |
| Example 6-5 | H1-1 | 90 | H2-5, H3-1 (2:8) | 90 |

Referring to Table 11, for the light emitting elements of Comparative Examples 6-1 to 6-4, each of the first to third emission parts includes an emission layer. For the light emitting elements of Comparative Examples 6-5 and 6-6 and Examples 6-1 to 6-5, the second emission part includes the first emission layer and the second emission layer, and each of the first emission part and the third emission part includes an emission layer.

For each of the light emitting elements of Examples 6-1 to 6-5, the second emission part includes the first emission layer and the second emission layer, the first emission layer contains one host and one dopant, and the second emission layer contains two hosts and one dopant. For the light emitting elements of Examples 6-1 to 6-5, the second emission layer of the second emission part was formed by providing, as hosts, H2-5 and H3-1 at a weight ratio of 8:2, 6:4, 5:5, 4:6, or 2:8. For the light emitting elements of Examples 6-1 to 6-5, two hosts in the second emission layer have a weight ratio of 2:8 to 8:2.

6-2) Evaluation of Light Emitting Elements

Driving voltages, efficiencies, and service lives of the light emitting elements of Comparative Examples 6-1 to 6-6 and Examples 6-1 to 6-5 are evaluated and listed in Table 12. The driving voltages, efficiencies, and service lives are relative values, which are represented for comparison in case that it is assumed that each of the driving voltage, efficiency, and service life of the light emitting element of Comparative Example 6-1 is 100%. In case that the driving voltages, efficiencies, and service lives of the light emitting elements were evaluated, the brightness was based on about 20,000 nit. In Table 12, the service life ($T_{97}$) represents a relative value of the time taken for the brightness to reduce to 97% of the initial brightness. In Table 12, the evaluation of the driving voltages, efficiencies, and service lives of the light emitting elements was conducted in the same manner as the manner in Table 2.

TABLE 12

| Division | Driving voltage | Efficiency | Service life (T97) |
|---|---|---|---|
| Comparative Example 6-1 | 100% | 100% | 100% |
| Comparative Example 6-2 | 95% | 93% | 100% |
| Comparative Example 6-3 | 97% | 86% | 84% |
| Comparative Example 6-4 | 98% | 96% | 99% |
| Comparative Example 6-5 | 101% | 100% | 111% |
| Comparative Example 6-6 | 97% | 102% | 110% |
| Example 6-1 | 95% | 113% | 120% |
| Example 6-2 | 95% | 111% | 129% |
| Example 6-3 | 95% | 109% | 135% |
| Example 6-4 | 96% | 106% | 140% |
| Example 6-5 | 97% | 105% | 143% |

Referring to Table 12, it may be seen that the light emitting elements of Examples 6-1 to 6-5 have superior efficiencies and service lives compared to the light emitting elements of Comparative Examples 6-1 to 6-6. In addition, it may be seen that the light emitting elements of Examples 6-1 to 6-5 have reduced driving voltages compared to the light emitting elements of Comparative Examples 6-1 to 6-6. For the light emitting elements of Comparative Examples 6-5 and 6-6, the first emission part includes two emission layers, and each of the two emission layers contains one host and one dopant. It may be seen that the light emitting element of Comparative Example 6-5 has an increase in the driving voltage.

The light emitting elements of Examples 6-1 to 6-5 include four emission parts, the second emission part includes two emission layers, the first emission layer contains one host, and the second emission layer contains two hosts. Accordingly, it is believed that the light emitting elements of Examples 6-1 to 6-5 have improved efficiencies and service lives.

7. Manufacture and Evaluation of Light Emitting Elements 7-1) Manufacture of Light Emitting Elements The light emitting elements of Comparative Examples 7-1 to 7-6 and Examples 7-1 to 7-5 were manufactured as follows. The light emitting elements of Comparative Examples 7-1 to 7-6 and Examples 7-1 to 7-5 each include four emission parts. Each of the light emitting elements of Examples 7-1 to 7-5 may be a structure in which the light emitting element ED-TDb3 in FIG. 6F further includes a capping layer.

The light emitting elements of Comparative Examples 7-1 to 7-4 were manufactured in the same manner as the light emitting elements of Comparative Examples 4-1 to 4-4. The light emitting elements of Comparative Examples 7-5 and 7-6 were manufactured in the same manner as the light emitting elements of Comparative Examples 4-5 and 4-6 except that only an emission layer was formed in case that the first emission part and the second emission part were formed. The light emitting elements of Examples 7-1 to 7-5 were manufactured in the same manner as the light emitting elements of Examples 4-1 to 4-5 except that only an emission layer was formed in case that the first emission part and the second emission part were formed.

For the light emitting elements of Comparative Examples 7-1 to 7-6 and Examples 7-1 to 7-5, the first emission part and the second emission part each include only an emission layer, and the emission layer contains H3-1 as a host and D1 as a dopant. For the light emitting elements of Comparative Examples 7-1 to 7-6 and Examples 7-1 to 7-5, host materials of the third emission part and the thickness of the emission part are listed in Table 13. In all the light emitting elements of Comparative Examples and Examples, D1 was used as a dopant material of the first to third emission parts. In Table 13, "N/A" means that the second emission layer is not formed.

TABLE 13

| Division | First emission layer | | Second emission layer | |
| --- | --- | --- | --- | --- |
| | Host | Thickness (Å) | Host | Thickness (Å) |
| Comparative Example 7-1 | H3-1 | 180 | N/A | |
| Comparative Example 7-2 | H2-5 | 180 | N/A | |
| Comparative Example 7-3 | H1-1 | 180 | N/A | |
| Comparative Example 7-4 | H2-5, H3-1 (5:5) | 180 | N/A | |
| Comparative Example 7-5 | H1-1 | 90 | H2-5 | 90 |
| Comparative Example 7-6 | H1-1 | 90 | H3-1 | 90 |
| Example 7-1 | H1-1 | 90 | H2-5, H3-1 (8:2) | 90 |
| Example 7-2 | H1-1 | 90 | H2-5, H3-1 (6:4) | 90 |
| Example 7-3 | H1-1 | 90 | H2-5, H3-1 (5:5) | 90 |
| Example 7-4 | H1-1 | 90 | H2-5, H3-1 (4:6) | 90 |
| Example 7-5 | H1-1 | 90 | H2-5, H3-1 (2:8) | 90 |

Referring to Table 13, for the light emitting elements of Comparative Examples 7-1 to 7-4, each of the first to third emission parts includes an emission layer. For the light emitting elements of Comparative Examples 7-5 and 7-6 and Examples 7-1 to 7-5, the third emission part includes the first emission layer and the second emission layer, and each of the first emission part and the second emission part includes an emission layer.

For each of the light emitting elements of Examples 7-1 to 7-5, the third emission part includes the first emission layer and the second emission layer, the first emission layer contains one host and one dopant, and the second emission layer contains two hosts and one dopant. For the light emitting elements of Examples 7-1 to 7-5, the second emission layer of the first emission part was formed by providing, as hosts, H2-5 and H3-1 at a weight ratio of 8:2, 6:4, 5:5, 4:6, or 2:8. For the light emitting elements of Examples 7-1 to 7-5, two hosts in the second emission layer have a weight ratio of 2:8 to 8:2.

7-2) Evaluation of Light Emitting Elements

Driving voltages, efficiencies, and service lives of the light emitting elements of Comparative Examples 7-1 to 7-6 and Examples 7-1 to 7-5 are evaluated and listed in Table 14. The driving voltages, efficiencies, and service lives are relative values, which are represented for comparison in case that it is assumed that each of the driving voltage, efficiency, and service life of the light emitting element of Comparative Example 7-1 is 100%. In case that the driving voltages, efficiencies, and service lives of the light emitting elements were evaluated, the brightness was based on about 20,000 nit. In Table 14, the service life ($T_{97}$) represents a relative value of the time taken for the brightness to reduce to 97% of the initial brightness. In Table 14, the evaluation of the driving voltages, efficiencies, and service lives of the light emitting elements was conducted in the same manner as the manner in Table 2.

TABLE 14

| Division | Driving voltage | Efficiency | Service life (T97) |
| --- | --- | --- | --- |
| Comparative Example 7-1 | 100% | 100% | 100% |
| Comparative Example 7-2 | 95% | 93% | 100% |
| Comparative Example 7-3 | 97% | 86% | 84% |
| Comparative Example 7-4 | 98% | 96% | 99% |
| Comparative Example 7-5 | 101% | 101% | 114% |
| Comparative Example 7-6 | 97% | 102% | 111% |
| Example 7-1 | 95% | 112% | 118% |
| Example 7-2 | 95% | 110% | 125% |
| Example 7-3 | 95% | 108% | 130% |
| Example 7-4 | 96% | 106% | 134% |
| Example 7-5 | 97% | 105% | 139% |

Referring to Table 14, it may be seen that the light emitting elements of Examples 7-1 to 7-5 have superior efficiencies and service lives compared to the light emitting elements of Comparative Examples 7-1 to 7-6. In addition, it may be seen that the light emitting elements of Examples 7-1 to 7-5 have reduced driving voltages compared to the light emitting elements of Comparative Examples 7-1 to 7-6. For each of the light emitting elements of Comparative Examples 7-5 and 7-6, the third emission part includes two emission layers, and each of the two emission layers contains one host and one dopant. It may be seen that the light emitting element of Comparative Example 7-5 has an increase in the driving voltage.

The light emitting elements of Examples 7-1 to 7-5 include four emission parts, the third emission part includes two emission layers, the first emission layer contains one host, and the second emission layer contains two hosts. Accordingly, it is believed that the light emitting elements of Examples 7-1 to 7-5 have improved efficiencies and service lives.

8. Manufacture and Evaluation of Light Emitting Elements 8-1) Manufacture of Light Emitting Elements The light emitting elements of Comparative Examples 8-1 to 8-9 and Example 8 were manufactured as follows. The light emitting elements of Comparative Examples 8-1 to 8-9 and Example 8 each include four emission parts. The light emitting element of Example 8 may be a structure in which the light emitting element ED-TDd in FIG. 6H further includes a capping layer.

For the light emitting elements of Comparative Examples 8-1 to 8-4, each of the four emission parts includes an emission layer. For the light emitting elements of Comparative Examples 8-5 to 8-9 and Example 8, each of the first to third emission parts includes two emission layers, and the fourth emission part includes an emission layer.

The light emitting element of Example 8 was manufactured in the same manner as the light emitting element of Example 4-3. The light emitting elements of Comparative Examples 8-1 to 8-6 were manufactured in the same manner as the light emitting elements of Comparative Examples 4-1 to 4-6. The light emitting elements of Comparative Examples 8-7 to 8-9 were manufactured in the same manner as the light emitting elements of Comparative Examples 4-5 except for the host used in case that the first to third emission parts were formed. HO 4 and HO 5 were hosts used in case that the first to third emission parts were formed in the light emitting elements of Comparative Examples 8-7 to 8-9. The hole mobility of HO 4 is about $2.3 \times 10^{-7}$ cm$^2$/Vs, and the hole mobility of HO 5 is about $1.5 \times 10^{-7}$ cm$^2$/Vs.

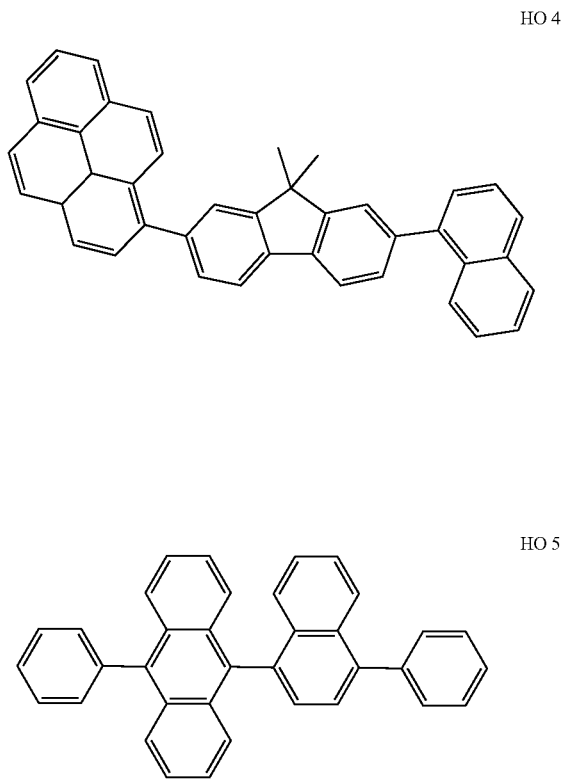

HO 4

HO 5

For the light emitting elements of Comparative Examples 8-1 to 8-9 and Example 8, host materials of the first to third emission parts and the thickness of the emission part are listed in Table 15. In the light emitting elements of Comparative Examples 8-1 to 8-9 and Example 8, D1 was used as a dopant material of the first to third emission parts. In Table 15, "N/A" means that the second emission layer is not formed.

TABLE 15

| Division | First emission layer | | Second emission layer | |
|---|---|---|---|---|
| | Host | Thickness (Å) | Host | Thickness (Å) |
| Comparative Example 8-1 | H3-1 | 180 | N/A | |
| Comparative Example 8-2 | H2-5 | 180 | N/A | |
| Comparative Example 8-3 | H1-1 | 180 | N/A | |
| Comparative Example 8-4 | H2-5, H3-1 (5:5) | 180 | N/A | |
| Comparative Example 8-5 | H1-1 | 90 | H2-5 | 90 |
| Comparative Example 8-6 | H1-1 | 90 | H3-1 | 90 |
| Example 8 | H1-1 | 90 | H2-5, H3-1 (5:5) | 90 |
| Comparative Example 8-7 | HO 4 | 90 | H2-5, H3-1 (5:5) | 90 |
| Comparative Example 8-8 | H1-1 | 90 | HO 5 | 90 |
| Comparative Example 8-9 | HO 4 | 90 | HO 5 | 90 |

In Table 15, for each of the light emitting elements of Comparative Examples 8-1 to 8-4, the first to third emission parts each include only an emission layer, and the host and dopant in the first to third emission parts are the same. For each of the light emitting elements of Comparative Examples 8-7 to 8-9 and Example 8, the first to third emission parts include two emission layers, the first emission layer of each of the first to third emission parts have the same host and dopant, and the second emission layer of each of the first to third emission parts have the same host and dopant.

For the light emitting element of Comparative Example 8-4, the first emission layer of each of the first to third emission parts was formed by providing, as hosts, H2-5 and H3-1 at a weight ratio of 5:5, and the second emission layer was not formed. For the light emitting element of Comparative Example 8-7, the first emission layer of each of the first to third emission parts was formed by providing HO 4 as a host and the second emission layer of each of the first to third emission parts was formed by providing, as hosts, H2-5 and H3-1 at a weight ratio of 5:5.

For the light emitting element of Comparative Example 8-8, the first emission layer of each of the first to third emission parts was formed by providing H1-1 as a host, and the second emission layer of each of the first to third emission parts was formed by providing HO 5 as a host. For the light emitting element of Comparative Example 8-9, the first emission layer of each of the first to third emission parts was formed by providing HO 4 as a host, and the second emission layer of each of the first to third emission parts was formed by providing HO 5 as a host.

For the light emitting element of Example 8, the first emission layer of each of the first to third emission parts was formed by providing H1-1 as a host. In addition, for the light emitting element of Example 8, the second emission layer of each of the first to third emission parts was formed by providing, as hosts, H2-5 and H3-1 at a weight ratio of 5:5.

8-2) Evaluation of Light Emitting Elements

Driving voltages, efficiencies, and service lives of the light emitting elements of Comparative Examples 8-1 to 8-9 and Example 8 are evaluated and listed in Table 16. The driving voltages, efficiencies, and service lives are relative values, which are represented for comparison in case that it is assumed that each of the driving voltage, efficiency, and service life of the light emitting element of Comparative Example 8-1 is 100%. In case that the driving voltages, efficiencies, and service lives of the light emitting elements were evaluated, the brightness was based on about 20,000 nit. In Table 16, the service life ($T_{97}$) represents a relative value of the time taken for the brightness to reduce to 97% of the initial brightness. In Table 16, the evaluation of the driving voltages, efficiencies, and service lives of the light emitting elements was conducted in the same manner as the manner in Table 2.

TABLE 16

| Division | Driving voltage | Efficiency | Service life (T97) |
|---|---|---|---|
| Comparative Example 8-1 | 100% | 100% | 100% |
| Comparative Example 8-2 | 95% | 93% | 100% |
| Comparative Example 8-3 | 97% | 86% | 84% |
| Comparative Example 8-4 | 98% | 96% | 99% |
| Comparative Example 8-5 | 101% | 107% | 143% |
| Comparative Example 8-6 | 95% | 105% | 140% |
| Example 8 | 94% | 121% | 178% |
| Comparative Example 8-7 | 101% | 107% | 122% |
| Comparative Example 8-8 | 101% | 105% | 120% |
| Comparative Example 8-9 | 102% | 103% | 121% |

Referring to Table 16, it may be seen that the light emitting element of Example 8 has superior efficiency and service life compared to the light emitting elements of Comparative Examples 8-1 to 8-9. In addition, the light emitting elements of Comparative Examples 8-5 and 8-7 to 8-9 have an increase in the driving voltage, and the light emitting element of Example 8 has the most decrease in the driving voltage. In Example 8, the first emission layer contains H1-1 as a host having a hole mobility of about $2.0 \times 10^{-4}$ cm$^2$/Vs, and the second emission layer contains, as hosts, H2-5 and H3-1 at a weight ratio of 5:5 having a hole mobility of about $4.3 \times 10^{-5}$ cm$^2$/Vs. For example, in the light emitting element of Example 8, the hole mobility of the host in the first emission layer corresponds to about $5.0 \times 10^{-6}$ cm$^2$/Vs to about $1.0 \times 10^{-3}$ cm$^2$/Vs, and the hole mobility of the host mixture including two hosts at a weight ratio of 5:5 in the second emission layer corresponds to about $1.0 \times 10^{-6}$ cm$^{-2}$/Vs to about $1.0 \times 10^{-4}$ cm$^2$/Vs. Accordingly, the light emitting element ED of an embodiment, which includes the first emission layer having a first hole mobility of about $5.0 \times 10^{-6}$ cm$^2$/Vs to about $1.0 \times 10^{-3}$ cm$^2$/Vs and the second emission layer having a second hole mobility of about $1.0 \times 10^{-6}$ cm$^2$/Vs to about $1.0 \times 10^{-4}$ cm$^2$/Vs, may exhibit desired efficiency and service life characteristics.

For the light emitting element of Comparative Example 8-7, the first emission layer adjacent to the hole transport region among two emission layers contains one host, and the second emission layer adjacent to the electron transport region contains two hosts. For the light emitting element of Comparative Example 8-7, the first emission layer contains HO 4 having a hole mobility of less than about $5.0 \times 10^{-6}$ cm$^2$/Vs. Accordingly, it is believed that the light emitting element of Comparative Example 8-7 has an increase in the driving voltage.

For the light emitting elements of Comparative Examples 8-8 and 8-9, the first emission layer contains one host, and the second emission layer contains one host. For the light emitting elements of Comparative Examples 8-8 and 8-9, the second emission layer contains HO 5 having a hole mobility of less than about $1.0 \times 10^{-6}$ cm$^2$/Vs. Accordingly, it is believed that the light emitting elements of Comparative Examples 8-8 and 8-9 have lower efficiencies and an increase in the driving voltages compared to the light emitting element of Example 8.

9. Compound Evaluation

Electron mobilities, hole mobilities, HOMO energy levels, and LUMO energy levels of hosts used in case that the light emitting elements of Comparative Examples 8-1 to 8-9 and Example 8 were manufactured are listed in Table 17. The host H2-5 and the host H3-1 were provided as a mixture with a weight ratio of 5:5, and the electron mobilities and hole mobilities were measured. The electron mobilities and hole mobilities were measured by using 2602B SourceMeter from Keithley, Inc. The values of the HOMO energy level and LUMO energy level were calculated by a non-empirical molecular orbital method. Specifically, the values of the HOMO energy level and LUMO energy level were calculated by using Gaussian 09 from Gaussian, Inc.

TABLE 17

| Division | Electron mobility (cm$^2$/Vs) | Hole mobility (cm$^2$/Vs) | HOMO (eV) | LUMO (eV) |
|---|---|---|---|---|
| H1-1 | $5.2 \times 10^{-4}$ | $2.0 \times 10^{-4}$ | −5.56 | −2.41 |
| H2-5 | $3.1 \times 10^{-5}$ | $4.3 \times 10^{-5}$ | −5.67 | −2.57 |
| H3-1 | (H2-5:H3-1 = 5:5) | (H2-5:H3-1 = 5:5) | −5.65 | −2.63 |
| HO 4 | $2.0 \times 10^{-7}$ | $2.3 \times 10^{-7}$ | −5.65 | −2.52 |
| HO 5 | $7.0 \times 10^{-7}$ | $1.5 \times 10^{-7}$ | −5.66 | −2.61 |

Referring to Table 17, it may be seen that for the light emitting element of Example 8, the hole mobility of the host H1-1 used in the first emission layer is about $2.0 \times 10^{-4}$ cm$^2$/Vs, which satisfies a range of about $5.0 \times 10^{-6}$ cm$^2$/Vs to about $1.0 \times 10^{-3}$ cm$^2$/Vs. It may be seen that the electron mobility of the host H1-1 is about $5.2 \times 10^{-4}$ cm$^2$/Vs, which satisfies a range of about $1.0 \times 10^{-5}$ cm$^2$/Vs to about $1.0 \times 10^{-2}$ cm$^2$/Vs. It may be seen that the absolute value of the LUMO energy level of the host H1-1 is about 2.41 eV, which satisfies a range of about 2.0 eV to about 3.5 eV. It may be seen that the absolute value of the HOMO energy level of the host H1-1 is about 5.56 eV, which satisfies a range of about 4.0 eV to about 6.0 eV.

In addition, it may be seen that for the light emitting element of Example 8, the hole mobility of the host mixture of H2-5 and H3-1 at a weight ratio of 5:5 used in the second emission layer is about $4.3 \times 10^{-5}$ cm$^2$/Vs, which satisfies a range of about $1.0 \times 10^{-6}$ cm$^2$/Vs to about $1.0 \times 10^{-4}$ cm$^2$/Vs. It may be seen that the electron mobility of the host mixture of H2-5 and H3-1 is about $3.1 \times 10^{-5}$ cm$^2$/Vs, which satisfies a range of about $1.0 \times 10^{-7}$ cm$^2$/Vs to about $5.0 \times 10^{-3}$ cm$^2$/Vs.

It may be seen that the difference in the HOMO energy level between the host H2-5 as a hole transport host and the host H1-1 is about 0.11 eV, which satisfies a range of about 0.1 eV to about 0.5 eV. It may be seen that the difference in the LUMO energy level between the host H3-1 as an electron transport host and the host H1-1 is about 0.22 eV, which satisfies a range of about 0.2 eV to about 0.4 eV.

The light emitting element of an embodiment may include the first electrode, the second electrode disposed on the first electrode, and the emission part disposed between the first electrode and the second electrode, and the emission part may include the first emission layer and the second emission layer disposed on the first emission layer. The first emission layer may contain the first host and the second dopant, and the second emission layer may contain the hole transport host, the electron transport host, and the second dopant. The first hole mobility in the first emission layer may be about $5.0\times10^{-6}$ cm$^2$/Vs to about $1.0\times10^{-3}$ cm$^2$/Vs, the second hole mobility in the second emission layer may be about $1.0\times10^{-6}$ cm$^2$/Vs to about $1.0\times10^{-4}$ cm$^2$/Vs, and the first hole mobility may be larger than the second hole mobility. The first hole mobility in the first emission layer and the second hole mobility in the second emission layer satisfy the aforementioned characteristics, and thus the recombination zone may be formed at the interface between the first emission layer and the second emission layer. The recombination zone is formed in the emission part, and thus the deteiroration phenomenon of the hole transport region, etc. adjacent to the emission part may be prevented. Accordingly, the light emitting element of an embodiment including the first emission layer containing one host and the second emission layer containing two hosts may exhibit desired efficiency and service life characteristics.

In addition, the light emitting element of an embodiment may include emission parts between the first electrode and the second electrode. The first to third emission parts may be disposed between the first electrode and the second electrode, and at least one among the first to third emission parts may include the first emission layer and the second emission layer. Accordingly, the light emitting element of an embodiment, in which at least one emission part among the emission parts includes the first emission layer and the second emission, may exhibit improved efficiency and service life characteristics.

The light emitting element of an embodiment may include the first emission layer containing one host and the second emission layer which is disposed on the first emission layer and contains two hosts, thereby exhibiting improved efficiency and service life characteristics.

Also, the light emitting element of an embodiment may include at least one emission part containing two hosts, thereby exhibiting improved efficiency and service life characteristics.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting element comprising:
   a first electrode;
   a second electrode disposed on the first electrode; and
   an emission part which is disposed between the first electrode and the second electrode and includes a first emission layer and a second emission layer disposed on the first emission layer, wherein the first emission layer comprises:
   a first host; and
   a first dopant,
   the second emission layer comprises:
   a hole transport host different from the first host;
   an electron transport host; and
   a second dopant,
   a first hole mobility of the first host is in a range of about $5.0\times10^{-6}$ cm$^2$/V·s to about $1.0\times10^{-3}$ cm$^2$/V·s,
   a second hole mobility of a host mixture including the hole transport host and the electron transport host is in a range of about $1.0\times10^{-6}$ cm$^2$/V·s to about $1.0\times10^{-4}$ cm$^2$/V·s, and
   the first hole mobility is larger than the second hole mobility.

2. The light emitting element of claim 1, wherein the first hole mobility is about five fold or more of the second hole mobility.

3. The light emitting element of claim 1, wherein an electron mobility of the first host is larger than an electron mobility of the electron transport host.

4. The light emitting element of claim 3, wherein the electron mobility of the first host is about 10 fold or more of the electron mobility of the electron transport host.

5. The light emitting element of claim 1, wherein an electron mobility of the first host is in a range of about $1.0\times10^{-5}$ cm$^2$/V·s to about $1.0\times10^{-2}$ cm$^2$/V·s.

6. The light emitting element of claim 1, wherein an electron mobility of the host mixture is in a range of about $1.0\times10^{-7}$ cm$^2$/V·s to about $5.0\times10^{-3}$ cm$^2$/V·s.

7. The light emitting element of claim 1, wherein a weight ratio of the hole transport host to the electron transport host is in a range of about 2:8 to about 8:2.

8. The light emitting element of claim 1, wherein an absolute value of a lowest unoccupied molecular orbital (LUMO) energy level of the first host is in a range of about 2.0 eV to about 3.5 eV.

9. The light emitting element of claim 8, wherein
   a LUMO energy level of the electron transport host is different from the LUMO energy level of the first host, and
   a difference between the LUMO energy level of the electron transport host and the LUMO energy level of the first host is in a range of about 0.2 eV to about 0.4 eV.

10. The light emitting element of claim 1, wherein an absolute value of a highest occupied molecular orbital (HOMO) energy level of the first host is in a range of about 4.0 eV to about 6.0 eV.

11. The light emitting element of claim 10, wherein
    a HOMO energy level of the electron transport host is different from the HOMO energy level of the first host, and
    a difference between the HOMO energy level of the electron transport host and the HOMO energy level of the first host is in a range of about 0.1 eV to about 0.5 eV.

12. The light emitting element of claim 1, wherein the first host comprises at least one of compounds in Compound Group 1 below:
[Compound Group 1]
H1-1
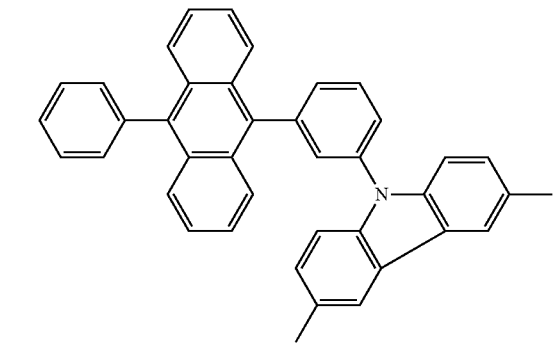
H1-2
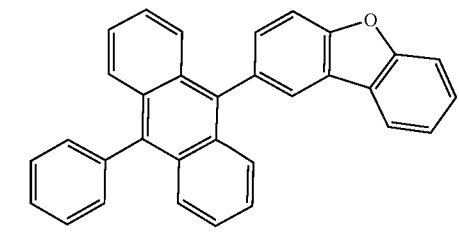
H1-3
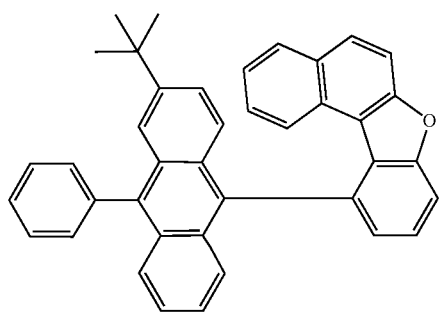
H1-4
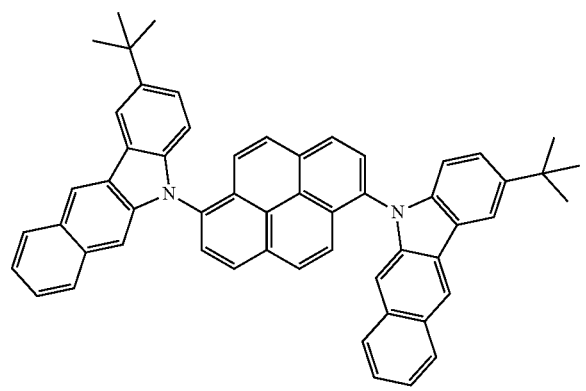
-continued
H1-5
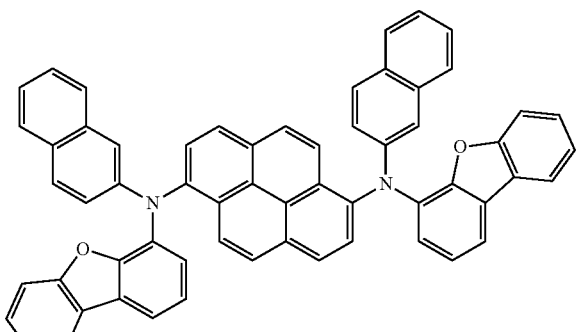
H1-6
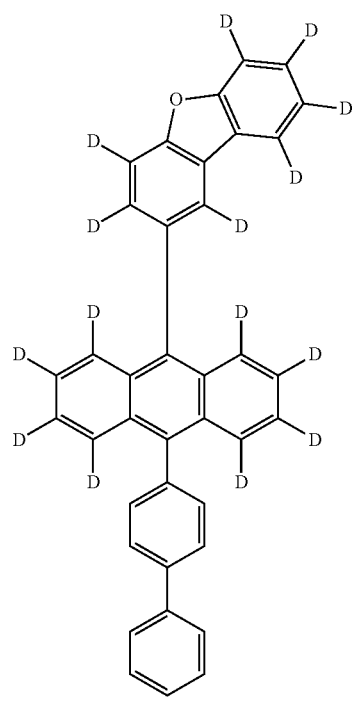
H1-7
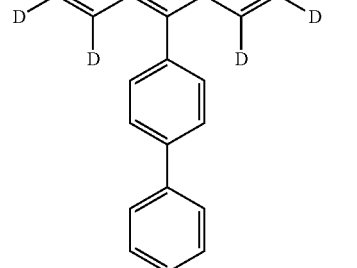

H1-8
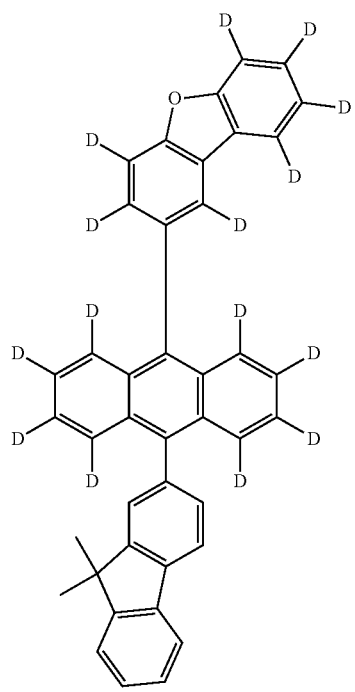
H1-9
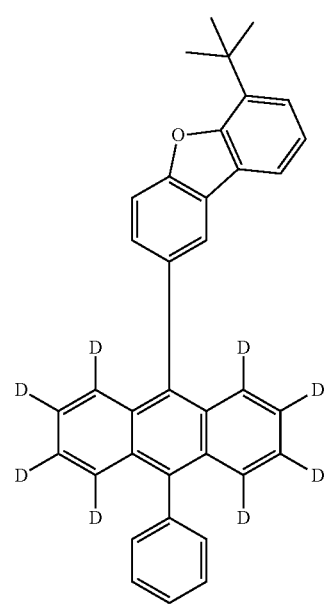
H1-10
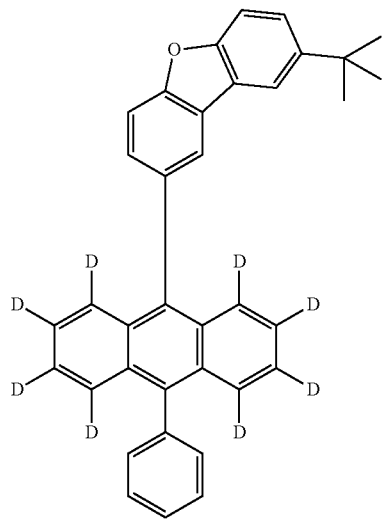
H1-11
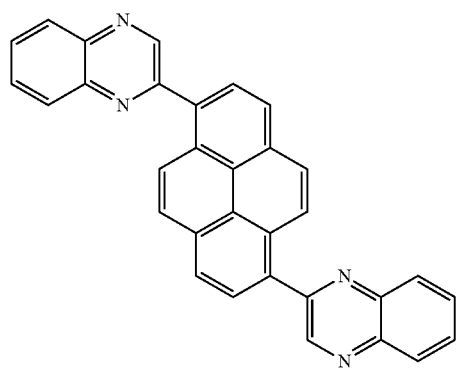
H1-12
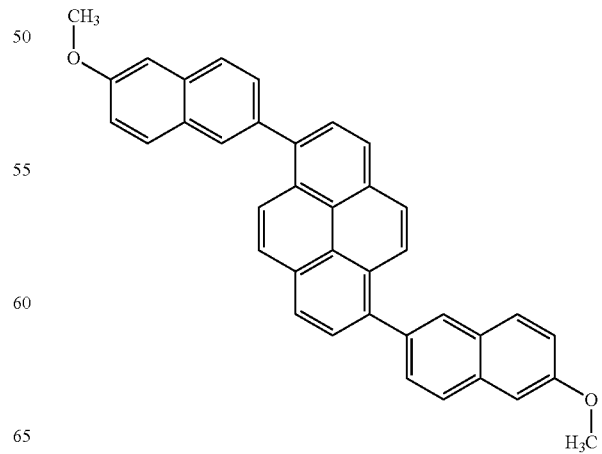

H1-13
H1-15
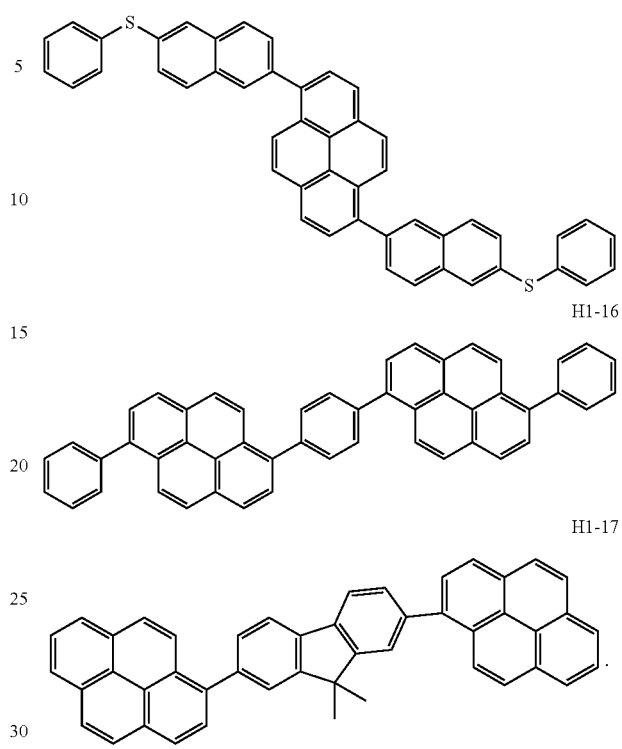
H1-16
H1-14
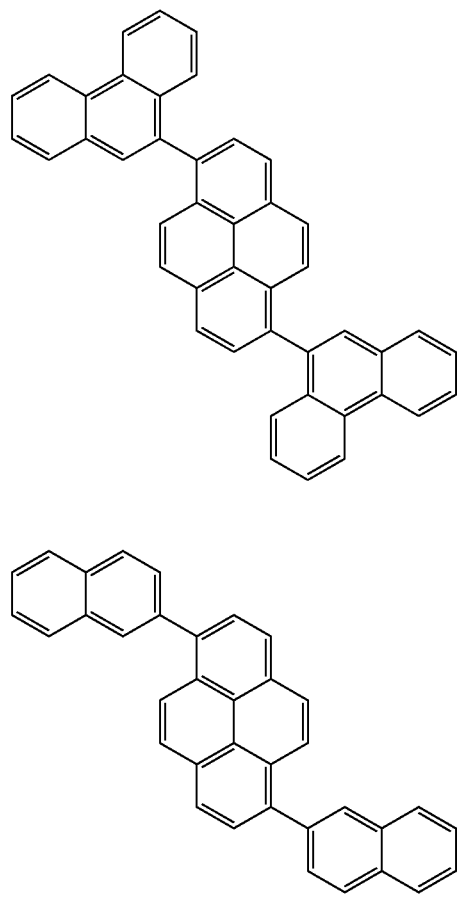
H1-17
13. The light emitting element of claim 1, wherein the hole transport host comprises at least one of hole transport compounds in Compound Group 2 below, and the electron transport host comprises at least one of electron transport compounds in Compound Group 3 below:
[Compound Group 2]
H2-1
H2-2
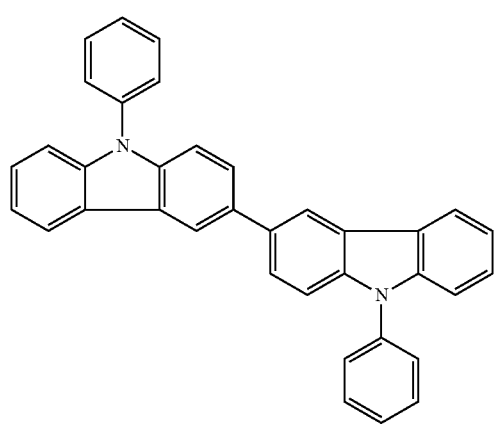
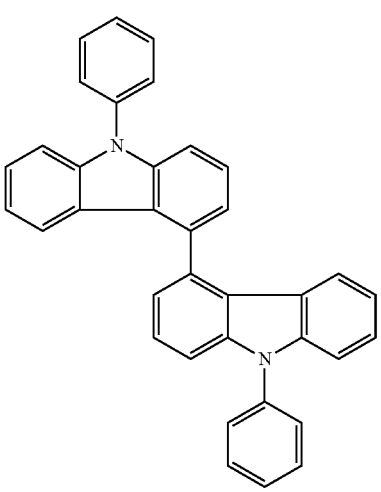

-continued
H2-3
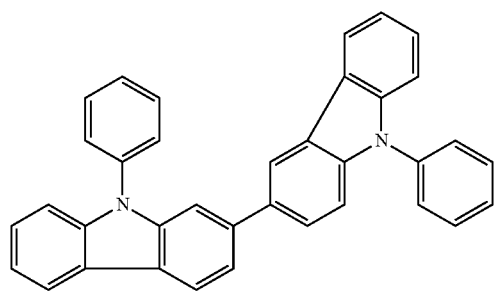
H2-4
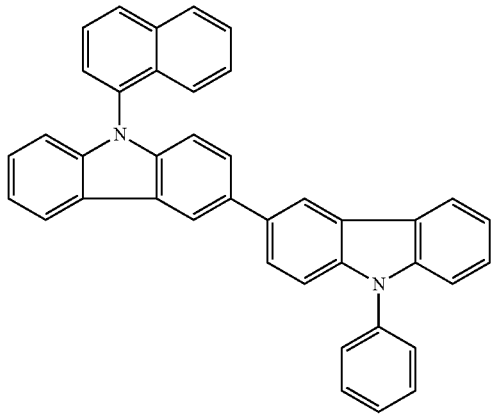
H2-5
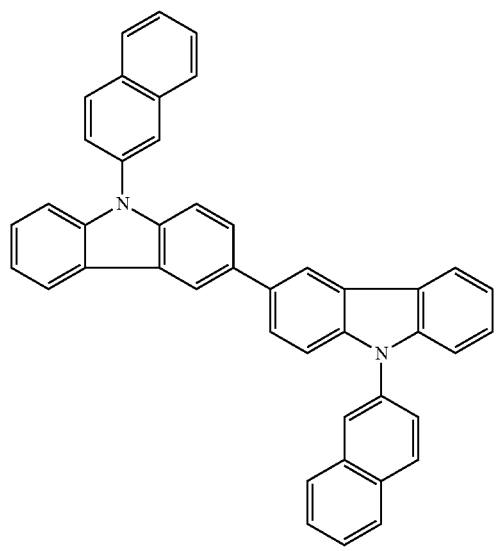
H2-6
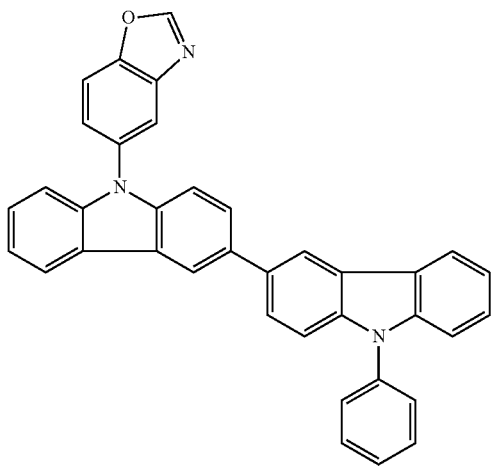
H2-7
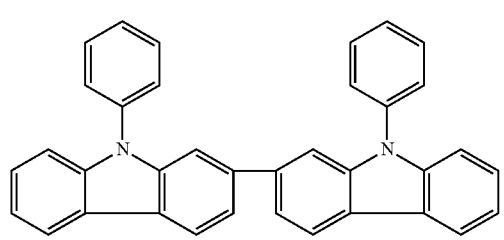
H2-8
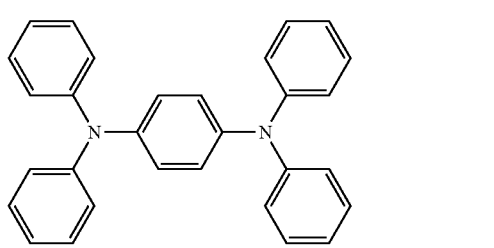
H2-9
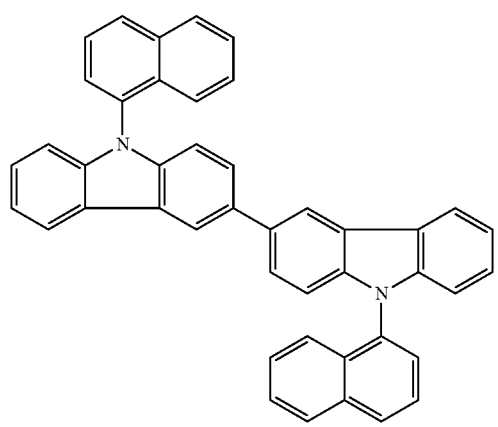
H2-10
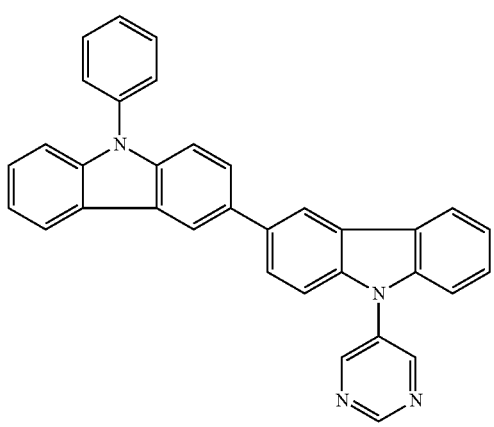

-continued
H2-11
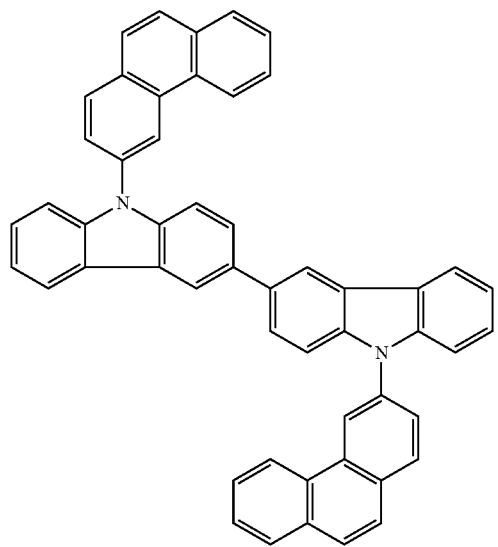
H2-12
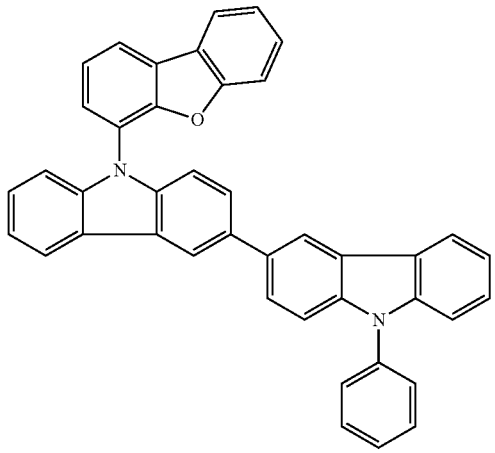
H2-13
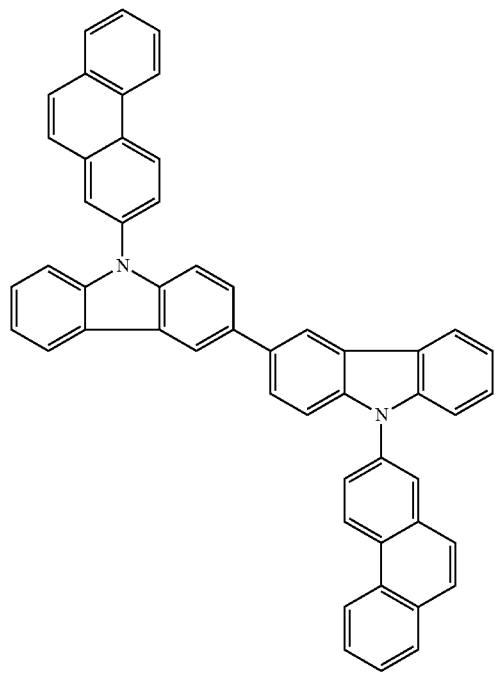
H2-14
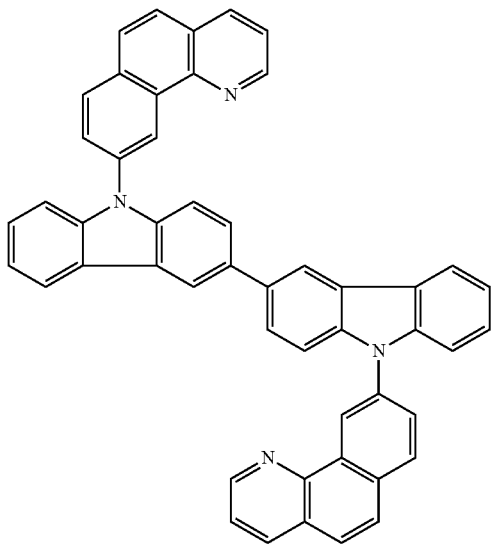

-continued
H2-15
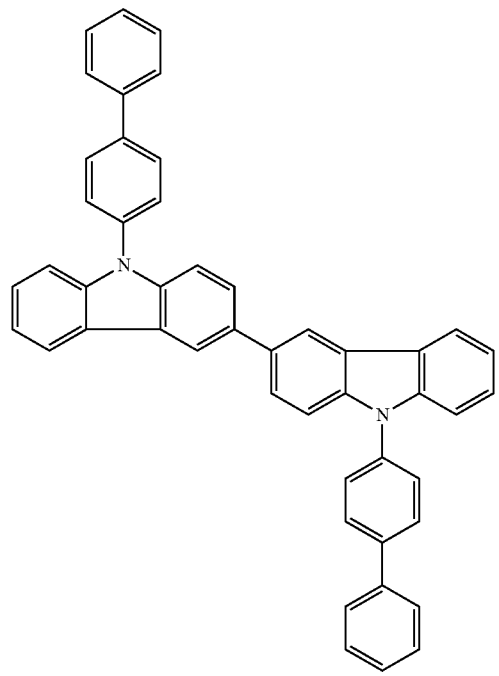
H2-16
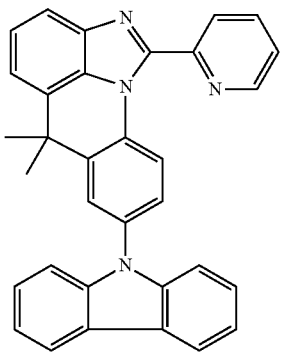
H2-17
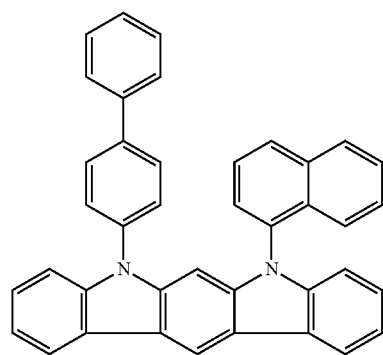
H2-18
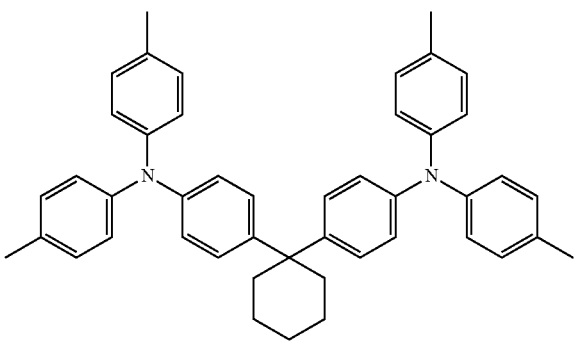
H2-19
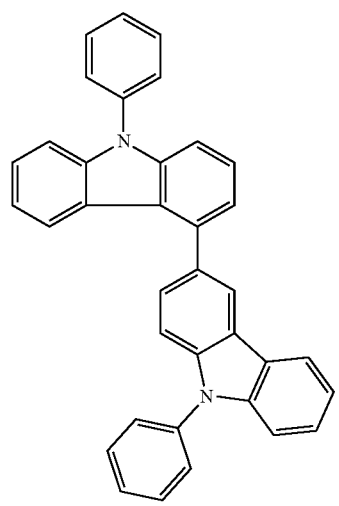
H2-20
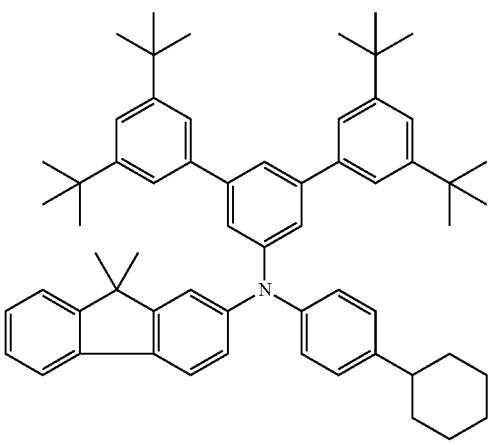

H2-21
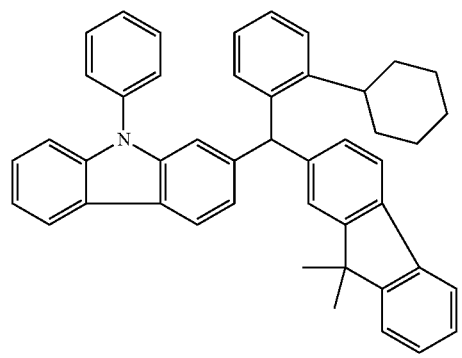
H2-22
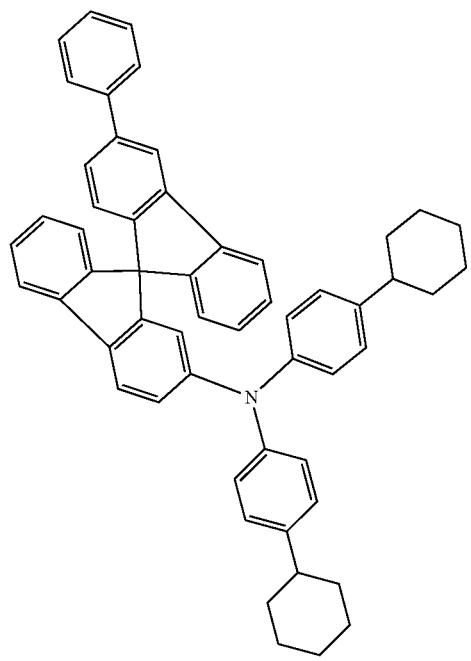
[Compound Group 3]
H3-1
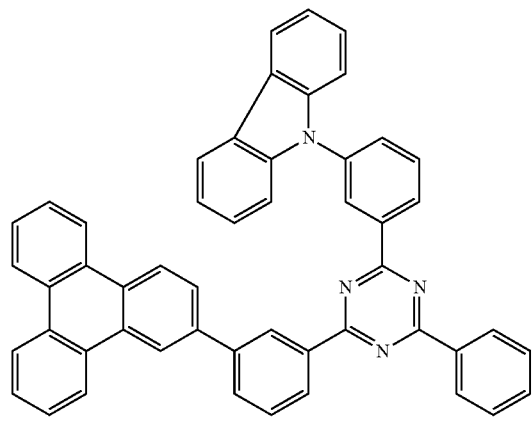
H3-2
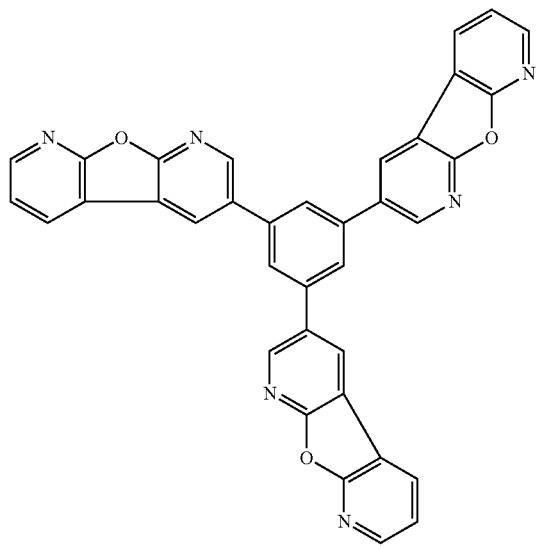
H3-3
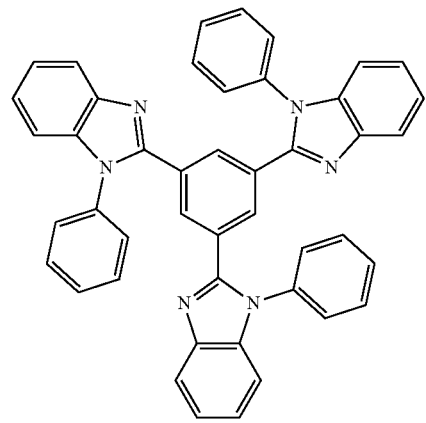
H3-4
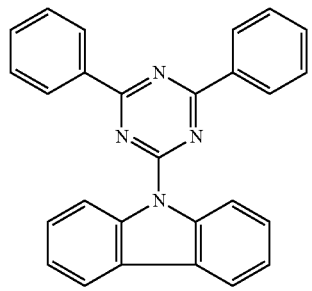

H3-5
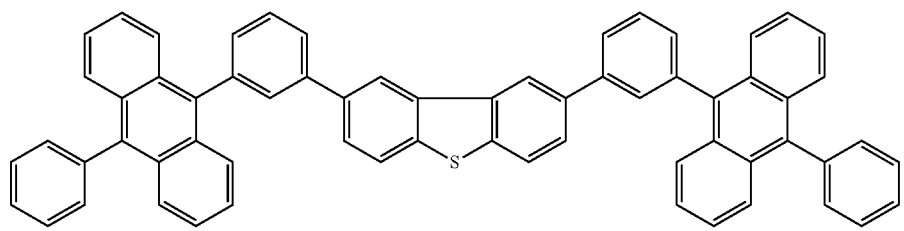
H3-6
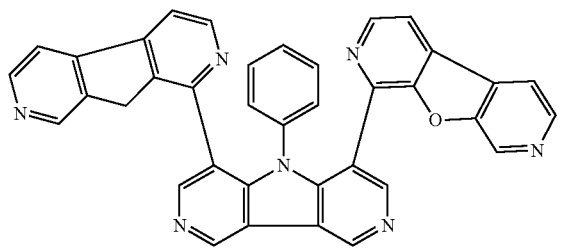
H3-7
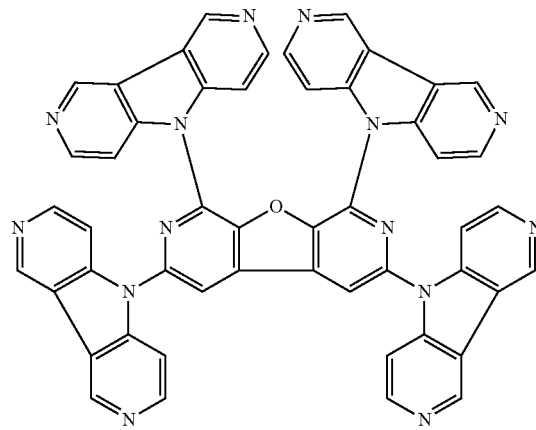
H3-8
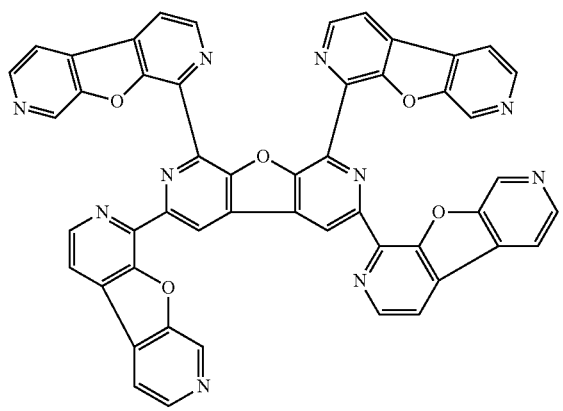
H3-9
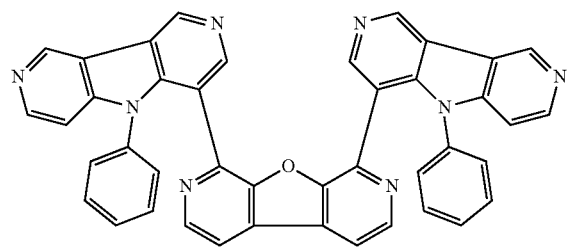
H3-10
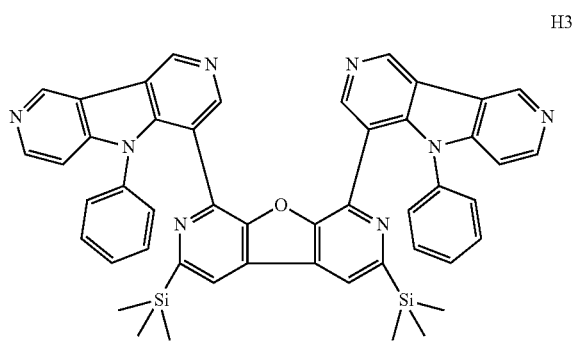
H3-11
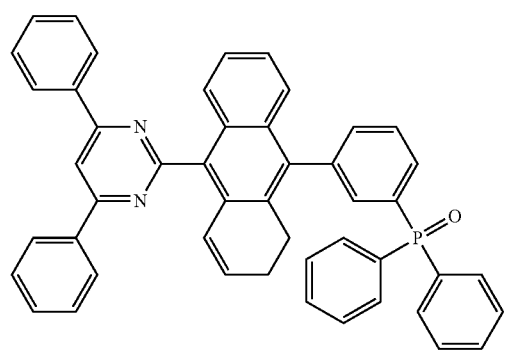

H3-12

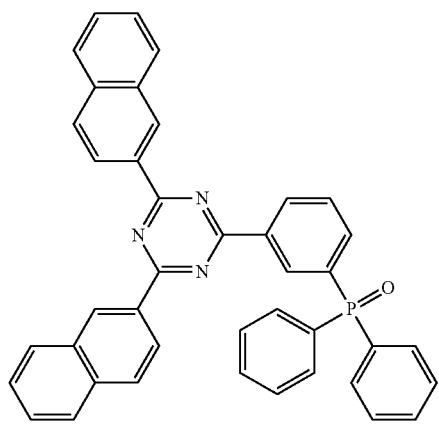

H3-13

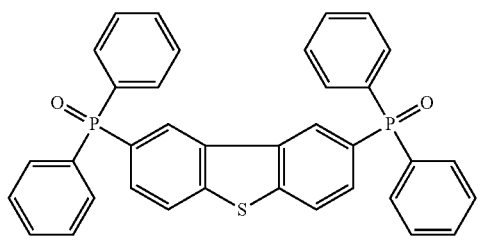

-continued

H3-14

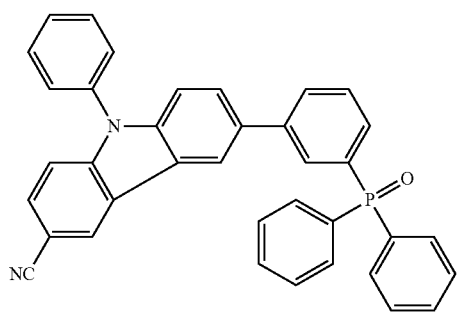

H3-15

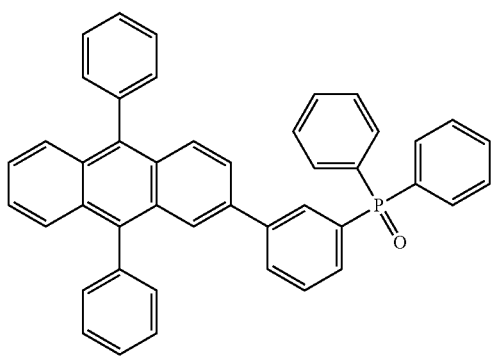

H3-16

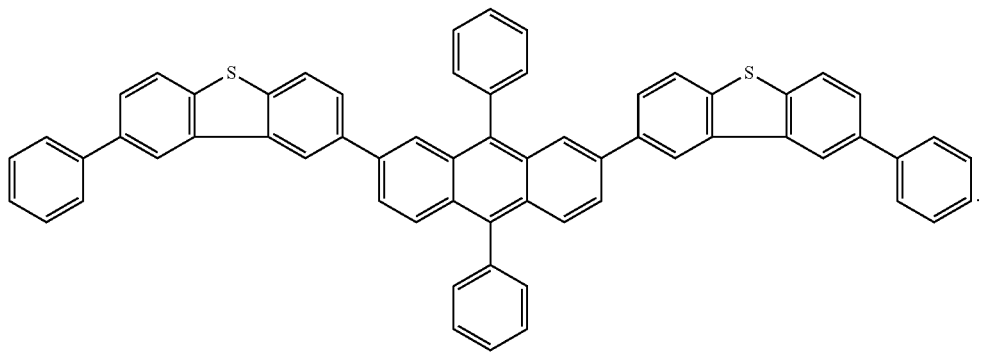

14. The light emitting element of claim 1, further comprising:
a hole transport region disposed between the first electrode and the emission part; and
an electron transport region disposed between the emission part and the second electrode.

15. The light emitting element of claim 14, wherein the hole transport region comprises an electron blocking layer disposed between the first electrode and the emission part.

16. The light emitting element of claim 14, wherein
the hole transport region comprises a hole transport layer disposed between the first electrode and the emission part, and
an absolute value of a HOMO energy level of the hole transport layer is in a range of about 5.25 eV to about 5.5 eV.

17. The light emitting element of claim 1, wherein each of the first dopant and the second dopant has a luminescence center wavelength in a range of about 440 nm to about 480 nm.

18. The light emitting element of claim 1, wherein an overlapping ratio of a luminescence wavelength region of the first dopant and a luminescence wavelength region of the second dopant is about 80% or more.

19. A light emitting element comprising:
a first electrode;
a second electrode disposed on the first electrode; and
a first emission part, a second emission part, and a third emission part which are disposed between the first electrode and the second electrode and sequentially stacked, wherein
at least one of the first emission part, the second emission part, and the third emission part comprises:
a first emission layer; and
a second emission layer disposed on the first emission layer,
the first emission layer comprises a first host and a first dopant, the second emission layer comprises a hole transport host different from the first host, an electron transport host, and a second dopant, a first hole mobility of the first host is in a range of about $5.0 \times 10^{-6}$ cm$^2$/V·s to about $1.0 \times 10^{-3}$ cm$^2$/V·s, a second hole mobility of a host mixture including the hole transport host and the electron transport host is in a range of about $1.0 \times 10^{-6}$ cm$^2$/V·s to about $1.0 \times 10^{-4}$ cm$^2$/V·s, and the first hole mobility is larger than the second hole mobility.

20. The light emitting element of claim 19, wherein
one of the first emission part, the second emission part, and the third emission part comprises the first emission layer and the second emission layer disposed on the first emission layer, and other two of the first emission part, the second emission part, and the third emission part each independently comprise an emission layer containing one host and one dopant.

21. The light emitting element of claim 19, further comprising:

a fourth emission part disposed on the third emission part, wherein each of the first emission part, the second emission part, and the third emission part emits light having a luminescence center wavelength in a range of about 440 nm to about 480 nm, and the fourth emission part emits light having a luminescence center wavelength in a range of about 500 nm to about 650 nm.

22. The light emitting element of claim 19, wherein the first hole mobility is about five fold or more of the second hole mobility.

* * * * *